US010629675B1

(12) United States Patent
Nishikawa et al.

(10) Patent No.: US 10,629,675 B1
(45) Date of Patent: Apr. 21, 2020

(54) THREE-DIMENSIONAL MEMORY DEVICE CONTAINING CAPACITOR PILLARS AND METHODS OF MAKING THE SAME

(71) Applicant: SANDISK TECHNOLOGIES LLC, Addison, TX (US)

(72) Inventors: Masatoshi Nishikawa, Nagoya (JP); Hardwell Chibvongodze, Hitatsuka (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/210,306

(22) Filed: Dec. 5, 2018

(51) Int. Cl.

| | |
|---|---|
| ***H01L 27/108*** | (2006.01) |
| ***H01L 49/02*** | (2006.01) |
| ***H01L 29/10*** | (2006.01) |
| ***H01L 29/788*** | (2006.01) |
| ***H01L 29/08*** | (2006.01) |
| ***H01L 23/528*** | (2006.01) |
| ***H01L 23/522*** | (2006.01) |

(Continued)

(52) U.S. Cl.
CPC ............ *H01L 28/90* (2013.01); *H01L 23/528* (2013.01); *H01L 23/5226* (2013.01); *H01L 27/10844* (2013.01); *H01L 27/11521* (2013.01); *H01L 27/11526* (2013.01); *H01L 27/11556* (2013.01); *H01L 27/11568* (2013.01); *H01L 27/11573* (2013.01); *H01L 27/11582* (2013.01); *H01L 29/0847* (2013.01); *H01L 29/1037* (2013.01); *H01L 29/40114* (2019.08); *H01L 29/40117* (2019.08); *H01L 29/66825* (2013.01); *H01L 29/66833* (2013.01); *H01L 29/685* (2013.01); *H01L 29/7883* (2013.01); *H01L 29/7889* (2013.01); *H01L 29/7926* (2013.01); *H01L 29/945* (2013.01); *H01L 21/0217* (2013.01); *H01L 21/0228* (2013.01); *H01L 21/0262* (2013.01); *H01L 21/02115* (2013.01); *H01L 21/02164* (2013.01); *H01L 21/02214* (2013.01); *H01L 21/02271* (2013.01); *H01L 21/31053* (2013.01); *H01L 21/31116* (2013.01); *H01L 29/36* (2013.01)

(58) Field of Classification Search
CPC ......... H01L 27/10847; H01L 27/11514; H01L 29/66007; H01L 29/68
See application file for complete search history.

(56) References Cited

U.S. PATENT DOCUMENTS 5,915,167 A 6/1999 Leedy
8,643,142 B2 2/2014 Higashitani et al.

(Continued)

*Primary Examiner* — Cheung Lee
(74) *Attorney, Agent, or Firm* — The Marbury Law Group, PLLC

(57) ABSTRACT

A semiconductor structure can include an alternating stack of insulating layers and electrically conductive layers located over a substrate, and capacitor pillar structures vertically extending through the first alternating stack. Each of the capacitor pillar structures can include a node dielectric and a semiconductor material portion that is laterally surrounded by the node dielectric. A first electrode layer of a capacitor includes the semiconductor material portions, and a second electrode layer of the capacitor includes the electrically conductive layers. Alternatively or additionally, a first dielectric fill material portion can extend through the alternating stack and can include a plurality of capacitor via cavities. A capacitor can be provided within the plurality of capacitor via cavities.

20 Claims, 55 Drawing Sheets

(51) Int. Cl.

| | |
|---|---|
| ***H01L 27/11582*** | (2017.01) |
| ***H01L 29/792*** | (2006.01) |
| ***H01L 29/66*** | (2006.01) |
| ***H01L 27/11521*** | (2017.01) |
| ***H01L 27/11526*** | (2017.01) |
| ***H01L 27/11568*** | (2017.01) |
| ***H01L 27/11573*** | (2017.01) |
| ***H01L 27/11556*** | (2017.01) |
| ***H01L 21/28*** | (2006.01) |
| ***H01L 29/94*** | (2006.01) |
| ***H01L 29/68*** | (2006.01) |
| *H01L 21/3105* | (2006.01) |
| *H01L 21/02* | (2006.01) |
| *H01L 21/311* | (2006.01) |
| *H01L 29/36* | (2006.01) |

(56) References Cited

U.S. PATENT DOCUMENTS

| | | | |
|---|---|---|---|
| 9,589,981 | B2 | 3/2017 | Nishikawa et al. |
| 9,646,981 | B2 | 5/2017 | Nishikawa et al. |
| 9,691,781 | B1 | 6/2017 | Nishikawa et al. |
| 9,876,031 | B1 | 1/2018 | Shimizu et al. |
| 2013/0127011 | A1 | 5/2013 | Higashitani et al. |
| 2016/0365351 | A1 | 12/2016 | Nishikawa et al. |
| 2016/0365352 | A1 | 12/2016 | Nishikawa et al. |
| 2017/0162592 | A1 | 6/2017 | Nishikawa et al. |

THREE-DIMENSIONAL MEMORY DEVICE CONTAINING CAPACITOR PILLARS AND METHODS OF MAKING THE SAME

FIELD

The present disclosure relates generally to the field of semiconductor devices and specifically to three-dimensional memory devices containing capacitor pillars and methods of making the same.

BACKGROUND

A two-dimensional memory device can include a two-dimensional array of memory stack structures. Each memory stack structure can include a vertical stack of memory elements. For example, a three-dimensional NAND stacked memory device can include an alternating stack of insulating layers and electrically conductive layers that is formed over a substrate containing peripheral devices (e.g., driver/logic circuits). Memory stack structures such as vertical NAND strings can be formed through the alternating stack. Each memory stack structure can include a vertical stack of memory elements and a vertical semiconductor channel.

SUMMARY

According to an aspect of the present disclosure, a semiconductor structure is provided, which comprises: a first alternating stack of insulating strips and electrically conductive strips located over a substrate; and capacitor pillar structures vertically extending through the first alternating stack, wherein each of the capacitor pillar structures comprises a node dielectric and a semiconductor material portion that is laterally surrounded by the node dielectric. The semiconductor material portions are electrically connected to provide a first electrode layer of a capacitor. The electrically conductive strips are electrically connected to provide a second electrode layer of the capacitor. The node dielectrics collectively constitute an insulating dielectric between the first electrode layer and the second electrode layer of the capacitor.

According to another aspect of the present disclosure, a semiconductor structure is provided, which comprises: an alternating stack of insulating layers and electrically conductive layers and overlying a substrate; a first dielectric fill material portion vertically extending through the alternating stack and including a plurality of capacitor via cavities therein, wherein each of the plurality of capacitor via cavities vertically extend through the alternating stack; a first electrode layer continuously extending into the plurality of capacitor via cavities and contacting sidewalls of the plurality of capacitor via cavities; a node dielectric continuously extending into the plurality of capacitor via cavities and overlying the first electrode layer; and a second electrode layer continuously extending into the plurality of capacitor via cavities and overlying the node dielectric. The first electrode layer, the node dielectric, and the second electrode layer collectively constitute a capacitor.

According to yet another aspect of the present disclosure, a method of forming a three-dimensional semiconductor device is provided, which comprises: forming an alternating stack of insulating layers and sacrificial material layers over a substrate; forming capacitor openings through a first region of the alternating stack; forming capacitor pillar structures in the capacitor openings, wherein each of the capacitor pillar structures comprises a node dielectric and a semiconductor material portion that is laterally surrounded by the node dielectric; forming a conductive structure that electrically connects the semiconductor material portions, the conductive structure and the semiconductor material portions constituting a first electrode layer of a capacitor; and replacing the sacrificial material layers with conductive material portions, the conductive material portions including electrically conductive layers that are electrically connected and laterally surround the node dielectrics to constitute a second electrode layer of the capacitor.

According to still another aspect of the present disclosure, a method of forming a semiconductor structure is provided, which comprises: forming an alternating stack of insulating layers and spacer material layers over a substrate, wherein the spacer material layers are formed as, or are subsequently replaced with, electrically conductive layers; forming a first dielectric fill material portion through the alternating stack; forming a plurality of capacitor via cavities through the first dielectric fill material portion, wherein each of the plurality of capacitor via cavities vertically extend through the alternating stack; forming a first electrode layer on sidewalls of the plurality of capacitor via cavities; forming a node dielectric over the first electrode layer; and forming a second electrode layer over the node dielectric, wherein the first electrode layer, the node dielectric, and the second electrode layer collectively constitute a capacitor.

DETAILED DESCRIPTION

Figure 1A:
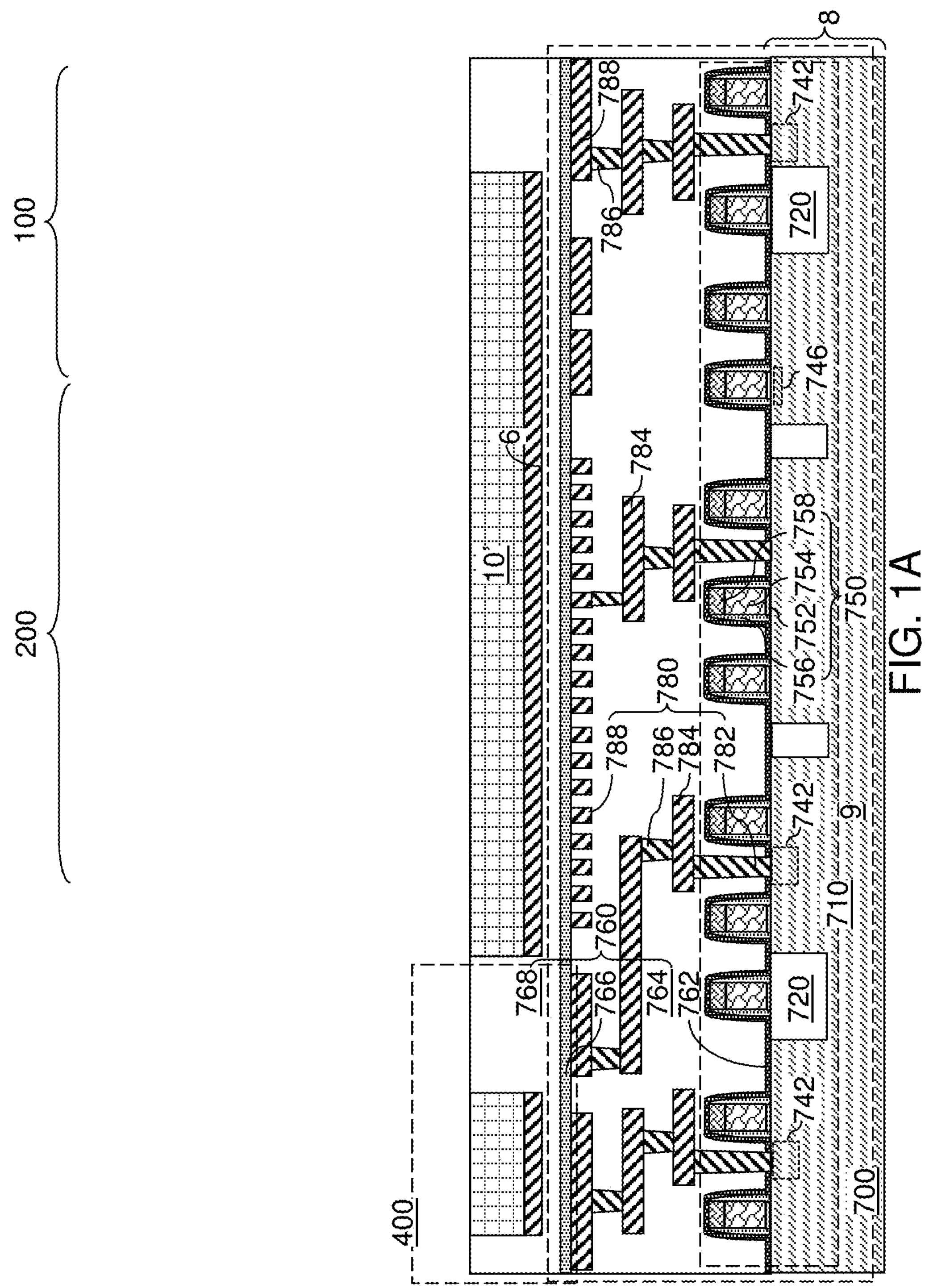
FIG. 1A is a vertical cross-sectional view of a first exemplary structure after formation of semiconductor devices, lower level dielectric layers, lower metal interconnect structures, and in-process source level material layers on a semiconductor substrate according to a first embodiment of the present disclosure.

As discussed above, the present disclosure is directed to three-dimensional memory device containing capacitor pillars and methods of making the same, the various aspects of which are discussed in detail herebelow. Three-dimensional memory devices require peripheral devices to operate the three-dimensional array of memory elements. The peripheral devices include capacitors having high capacitance. The capacitors tend to require a significant portion of the entire chip area, thereby impeding device scaling and efficient chip area utilization. Various embodiments provide high capacity capacitors within three-dimensional memory devices that do not require a large device area, thereby satisfying the need for such capacitors without increasing the size of the devices.

The drawings are not drawn to scale. Multiple instances of an element may be duplicated where a single instance of the element is illustrated, unless absence of duplication of elements is expressly described or clearly indicated otherwise. Same reference numerals refer to the same element or to a similar element. Elements having the same reference numerals are presumed to have the same material composition unless expressly stated otherwise. Ordinals such as "first," "second," and "third" are used merely to identify similar elements, and different ordinals may be used across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, an "in-process" structure or a "transient" structure refers to a structure that is subsequently modified.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between or at a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0\times10^{-6}$ S/cm to $1.0\times10^{5}$ S/cm. As used herein, a "semiconductor material" refers to a material having electrical conductivity in the range from $1.0\times10^{-6}$ S/cm to $1.0\times10^{5}$ S/cm in the absence of electrical dopants therein, and is capable of producing a doped material having electrical conductivity in a range from 1.0 S/cm to $1.0\times10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^{5}$ S/cm. As used herein, an "insulating material" or a "dielectric material" refers to a material having electrical conductivity less than $1.0\times10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0\times10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-6}$ S/cm to $1.0\times10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device The three-dimensional memory devices according to various embodiments of the present disclosure include a monolithic three-dimensional NAND string memory device, and can be fabricated using the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Figure 1B:
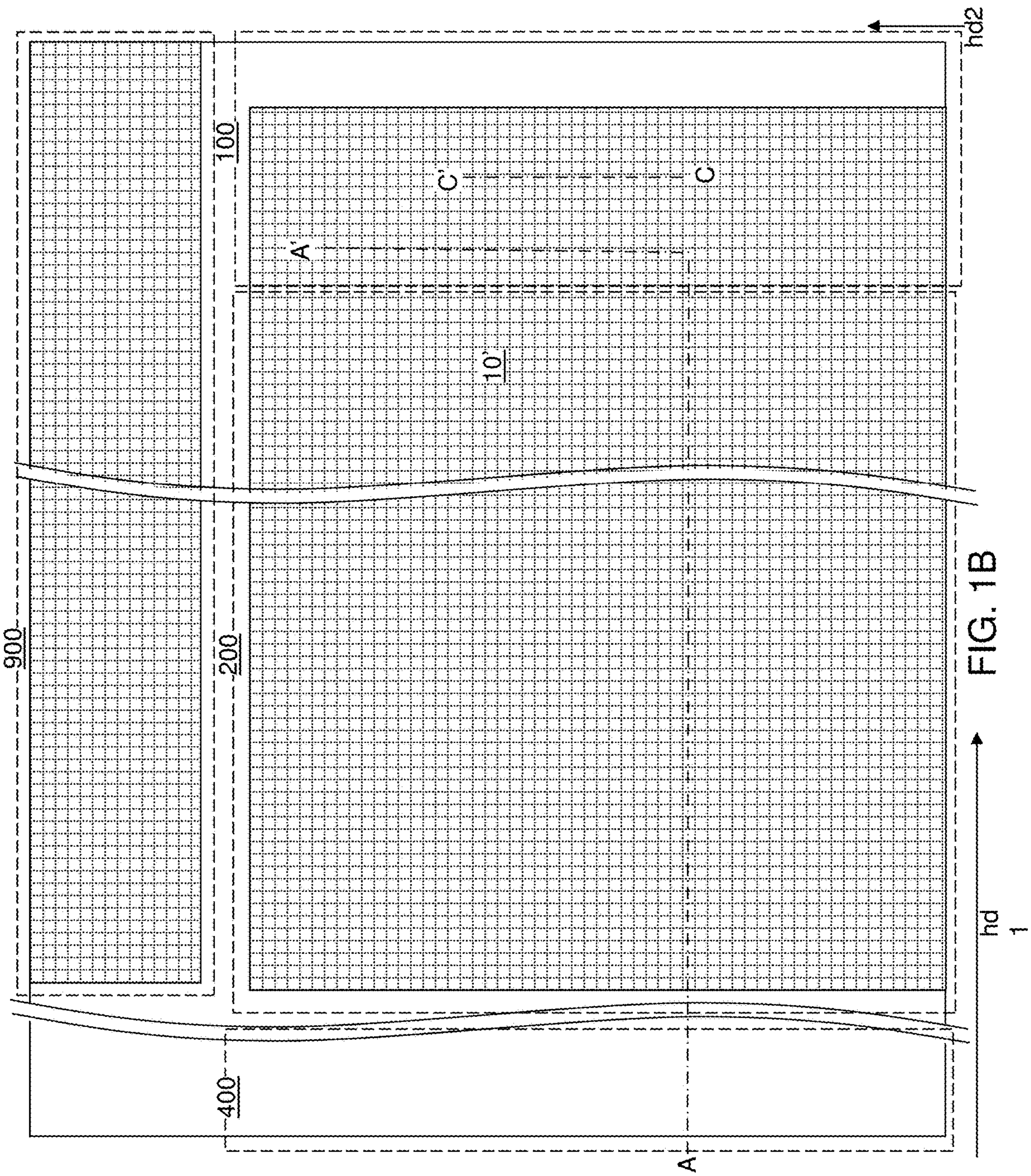
FIG. 1B is a top-down view of the first exemplary structure of FIG. 1A. The hinged vertical plane A-A' is the plane of the vertical cross-sectional view of FIG. 1A.
Figure 1C:
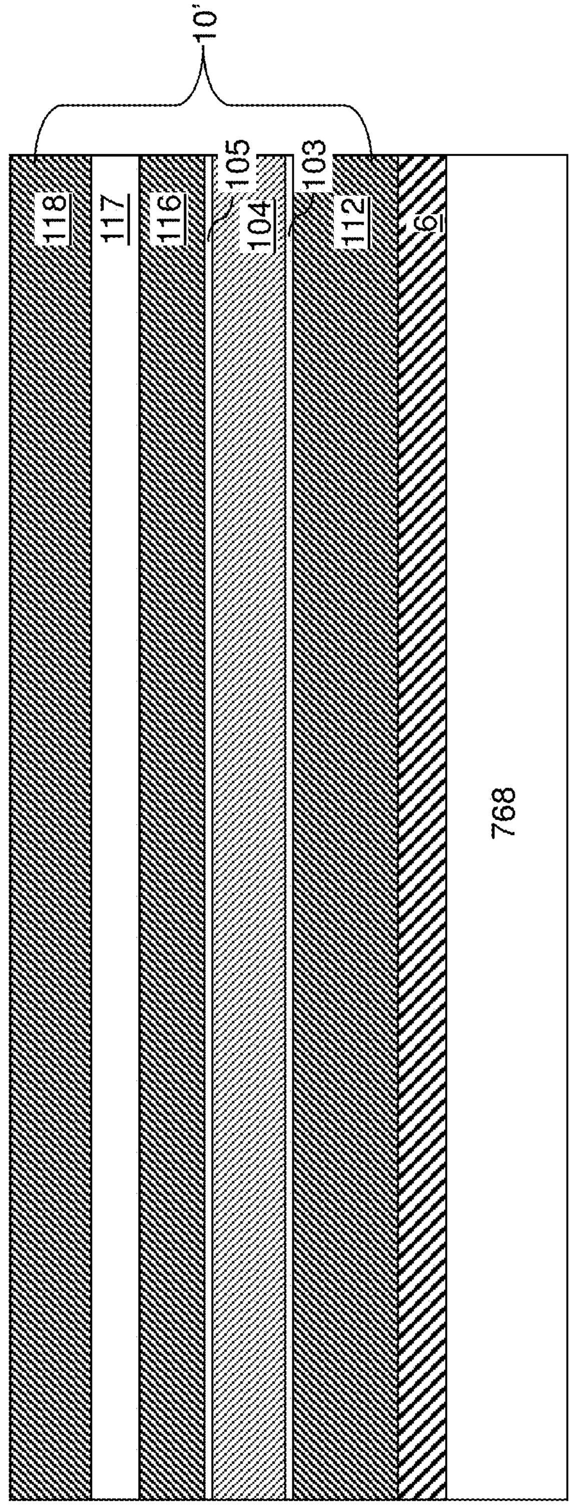
FIG. 1C is a magnified view of the in-process source level material layers along the vertical plane C-C' of FIG. 1B.

Referring to FIGS. 1A-1C, a first exemplary structure according to a first embodiment of the present disclosure is illustrated. FIG. 1C is a magnified view of an in-process source-level material layers 10' illustrated in FIGS. 1A and 1B. The first exemplary structure includes a semiconductor substrate 8 and semiconductor devices 710 formed thereupon. The semiconductor substrate 8 includes a substrate semiconductor layer 9 at least at an upper portion thereof. Shallow trench isolation structures 720 can be formed in an upper portion of the substrate semiconductor layer 9 to provide electrical isolation among the semiconductor devices. The semiconductor devices 710 can include, for example, field effect transistors including respective transistor active regions 742 (i.e., source regions and drain regions), channel regions 746, and gate structures 750. The field effect transistors may be arranged in a CMOS configuration. Each gate structure 750 can include, for example, a gate dielectric 752, a gate electrode layer 754, a dielectric gate spacer 756 and a gate cap dielectric 758. The semiconductor devices can include any semiconductor circuitry to support operation of a memory structure to be subsequently formed, which is typically referred to as a driver circuitry, which is also known as peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that can be implemented outside a memory array structure for a memory device. For example, the semiconductor devices can include word line switching devices for electrically biasing word lines of three-dimensional memory structures to be subsequently formed.

Dielectric material layers are formed over the semiconductor devices, which are herein referred to as lower-level dielectric material layers 760. The lower-level dielectric material layers 760 can include, for example, a dielectric liner 762 (such as a silicon nitride liner that blocks diffusion of mobile ions and/or apply appropriate stress to underlying structures), first dielectric material layers 764 that overlie the dielectric liner 762, a silicon nitride layer (e.g., hydrogen diffusion barrier) 766 that overlies the first dielectric material layers 764, and at least one second dielectric layer 768.

The dielectric layer stack including the lower-level dielectric material layers 760 functions as a matrix for lower-level metal interconnect structures 780 that provide electrical wiring among the various nodes of the semiconductor devices and landing pads for through-memory-level contact via structures to be subsequently formed. The lower-level metal interconnect structures 780 are positioned within the dielectric layer stack of the lower-level dielectric material layers 760, and comprise a lower-level metal line structure located under and optionally contacting a bottom surface of the silicon nitride layer 766. The lower-level metal interconnect structures 780 include metal interconnect structures that provide electrically conductive paths between a node of a respective semiconductor device 710 and metal line structures to be subsequently formed above a three-dimensional array of memory devices.

For example, the lower-level metal interconnect structures 780 can be positioned within the first dielectric material layers 764. The first dielectric material layers 764 may be a plurality of dielectric material layers within which various elements of the lower-level metal interconnect structures 780 are sequentially formed. Each dielectric material layer among the first dielectric material layers 764 may include any of doped silicate glass, undoped silicate glass, organosilicate glass, silicon nitride, silicon oxynitride, and dielectric metal oxides (such as aluminum oxide). In one embodiment, the first dielectric material layers 764 can comprise, or consist essentially of, dielectric material layers having dielectric constants that do not exceed the dielectric constant of undoped silicate glass (silicon oxide) of 3.9. The lower-level metal interconnect structures 780 can include various device contact via structures 782 (e.g., source and drain electrode layers which contact the respective source and drain nodes of the device or gate electrode layer contacts), intermediate lower-level metal line structures 784, lower-level metal via structures 786, and landing-pad-level metal line structures 788 that are configured to function as landing pads for various contact via structures to be subsequently formed. As used herein, a landing pad refers to a structure that functions as an etch stop material during formation of an overlying via cavity.

The landing-pad-level metal line structures 788 can be formed within a topmost dielectric material layer of the first dielectric material layers 764 (which can be a plurality of dielectric material layers). Each of the lower-level metal interconnect structures 780 can include a metallic nitride liner and a metal fill structure. Top surfaces of the landing-pad-level metal line structures 788 and the topmost surface of the first dielectric material layers 764 may be planarized by a planarization process, such as chemical mechanical planarization. The silicon nitride layer 766 can be formed directly on the top surfaces of the landing-pad-level metal line structures 788 and the topmost surface of the first dielectric material layers 764.

The at least one second dielectric material layer 768 may include a single dielectric material layer or a plurality of dielectric material layers. Each dielectric material layer among the at least one second dielectric material layer 768 may include any of doped silicate glass, undoped silicate glass, and organosilicate glass. In one embodiment, the at least one first second material layer 768 can comprise, or consist essentially of, dielectric material layers having dielectric constants that do not exceed the dielectric constant of undoped silicate glass (silicon oxide) of 3.9.

An optional layer of a metallic material and a layer of a semiconductor material can be deposited over, or within patterned recesses of, the at least one second dielectric material layer 768, and is lithographically patterned to provide an optional conductive plate layer 6 and in-process source-level material layers 10'. The optional conductive plate layer 6, if present, provides a high conductivity conduction path for electrical current that flows into, or out of, the in-process source-level material layers 10'. The optional conductive plate layer 6 includes a conductive material such as a metal or a heavily doped semiconductor material. The optional conductive plate layer 6, for example, may include a tungsten layer having a thickness in a range from 3 nm to 100 nm, although lesser and greater thicknesses can also be used. A metal nitride layer (not shown) may be provided as a diffusion barrier layer on top of the conductive plate layer 6. The conductive plate layer 6 may function as a special source line in the completed device. In addition, the conductive plate layer 6 may comprise an etch stop layer and may comprise any suitable conductive, semiconductor or insulating layer. The optional conductive plate layer 6 can include a metallic compound material such as a conductive metallic nitride (e.g., TiN) and/or a metal (e.g., W). The thickness of the optional conductive plate layer 6 may be in a range from 5 nm to 100 nm, although lesser and greater thicknesses can also be used.

The in-process source-level material layers 10' can include various layers that are subsequently modified to form source-level material layers. The source-level material layers, upon formation, include a source contact layer that functions as a common source region for vertical field effect transistors of a three-dimensional memory device. In one embodiment, the in-process source-level material layer 10' can include, from bottom to top, a lower source-level material layer 112, a lower sacrificial liner 103, a source-level sacrificial layer 104, an upper sacrificial liner 105, an upper source-level material layer 116, a source-level insulating layer 117, and an optional source-select-level conductive layer 118.

The lower source-level material layer 112 and the upper source-level material layer 116 can include a doped semiconductor material such as doped polysilicon or doped amorphous silicon. The conductivity type of the lower source-level material layer 112 and the upper source-level material layer 116 can be the opposite of the conductivity of vertical semiconductor channels to be subsequently formed. For example, if the vertical semiconductor channels to be subsequently formed have a doping of a first conductivity type, the lower source-level material layer 112 and the upper source-level material layer 116 have a doping of a second conductivity type that is the opposite of the first conductivity type. The thickness of each of the lower source-level material layer 112 and the upper source-level material layer 116 can be in a range from 10 nm to 300 nm, such as from 20 nm to 150 nm, although lesser and greater thicknesses can also be used.

The source-level sacrificial layer 104 includes a sacrificial material that can be removed selective to the lower sacrificial liner 103 and the upper sacrificial liner 105. In one embodiment, the source-level sacrificial layer 104 can include a semiconductor material such as undoped amorphous silicon or a silicon-germanium alloy with an atomic concentration of germanium greater than 20%. The thickness of the source-level sacrificial layer 104 can be in a range from 30 nm to 400 nm, such as from 60 nm to 200 nm, although lesser and greater thicknesses can also be used.

The lower sacrificial liner 103 and the upper sacrificial liner 105 include materials that can function as an etch stop material during removal of the source-level sacrificial layer 104. For example, the lower sacrificial liner 103 and the upper sacrificial liner 105 can include silicon oxide, silicon nitride, and/or a dielectric metal oxide. In one embodiment, each of the lower sacrificial liner 103 and the upper sacrificial liner 105 can include a silicon oxide layer having a thickness in a range from 2 nm to 30 nm, although lesser and greater thicknesses can also be used.

The source-level insulating layer 117 includes a dielectric material such as silicon oxide. The thickness of the source-level insulating layer 117 can be in a range from 20 nm to 400 nm, such as from 40 nm to 200 nm, although lesser and greater thicknesses can also be used. The optional source-select-level conductive layer 118 can include a conductive material that can be used as a source-select-level gate electrode layer. For example, the optional source-select-level conductive layer 118 can include a doped semiconductor material such as doped polysilicon or doped amorphous silicon that can be subsequently converted into doped polysilicon by an anneal process. The thickness of the optional source-level conductive layer 118 can be in a range from 30 nm to 200 nm, such as from 60 nm to 100 nm, although lesser and greater thicknesses can also be used.

The in-process source-level material layers 10' can be formed directly above a subset of the semiconductor devices on the semiconductor substrate 8 (e.g., silicon wafer). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface of the substrate 8.

The optional conductive plate layer 6 and the in-process source-level material layers 10' may be patterned to provide discrete patterned portions that are laterally spaced apart one from another. A patterned discrete portion of the stack of the conductive plate layer 6 and the in-process source-level material layers 10' is present in each memory array region 100 in which three-dimensional memory stack structures are to be subsequently formed. Each patterned discrete portion of the stack of the conductive plate layer 6 and the in-process source-level material layers 10' extends into an adjacent staircase region 200 in which contact via structures to memory-level electrically conductive layers are to be subsequently formed. At least one capacitor region 900 can be provided adjacent to the combination of the memory array region 100 and the staircase region 200. Each capacitor region 900 includes a respective patterned portion of the stack of the conductive plate layer 6 and the in-process source-level material layers 10'. In one embodiment, the patterned portion(s) of the stack of the conductive plate layer 6 and the in-process source-level material layers 10' in the at least one capacitor region 900 can have a rectangular shape.

In one embodiment, the staircase region 200 can be laterally spaced from the memory array region 100 along a first horizontal direction hd1. A horizontal direction that is perpendicular to the first horizontal direction hd1 is herein referred to as a second horizontal direction hd2. The stack of the conductive plate layer 6 and the in-process source-level material layers 10' can be removed from a peripheral device region 400, in which electrical connections to underlying metal interconnect structures 780 can be subsequently formed. The peripheral device region 400 that is subsequently filled with a field dielectric material portion can be provided adjacent to the staircase region 200.

The region of the semiconductor devices 710 and the combination of the lower-level dielectric layers 760 and the lower-level metal interconnect structures 780 is herein referred to an underlying peripheral device region 700, which is located underneath a memory-level assembly to be subsequently formed and includes peripheral devices for the memory-level assembly. The lower-level metal interconnect structures 780 are positioned in the lower-level dielectric layers 760.

The lower-level metal interconnect structures 780 can be electrically connected to active nodes (e.g., transistor active regions 742 or gate electrode layers 754) of the semiconductor devices 710 (e.g., CMOS devices), and are located at the level of the lower-level dielectric layers 760. Through-memory-level contact via structures can be subsequently formed directly on the lower-level metal interconnect structures 780 to provide electrical connection to memory devices to be subsequently formed. In one embodiment, the pattern of the lower-level metal interconnect structures 780 can be selected such that the landing-pad-level metal line structures 788 (which are a subset of the lower-level metal interconnect structures 780 located at the topmost portion of the lower-level metal interconnect structures 780) can provide landing pad structures for the through-memory-level contact via structures to be subsequently formed.

Figure 2:
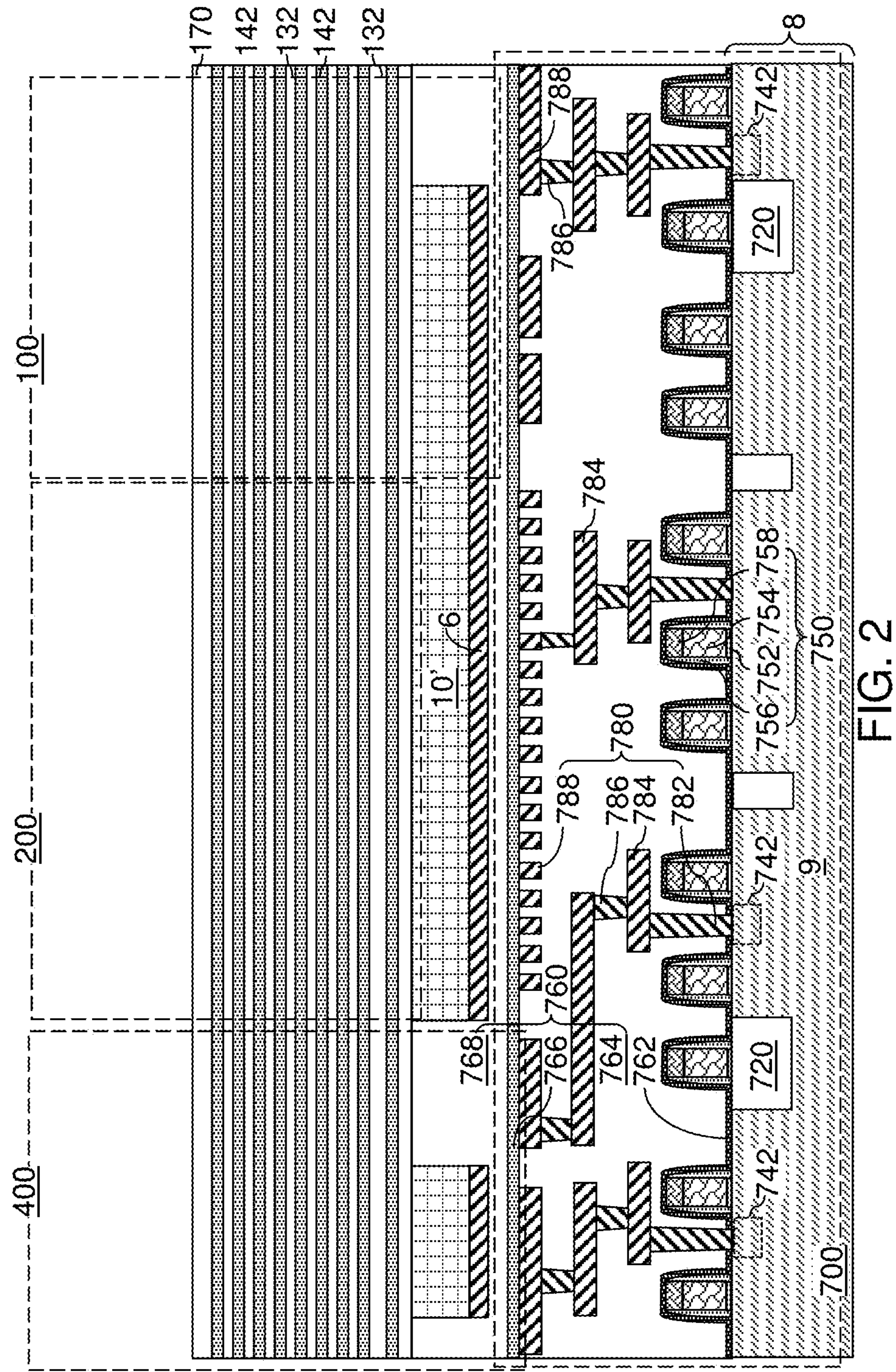
FIG. 2 is a vertical cross-sectional view of the first exemplary structure after formation of a first-tier alternating stack of first insulating layers and first spacer material layers according to an embodiment of the present disclosure.

Referring to FIG. 2, an alternating stack of first material layers and second material layers is subsequently formed. Each first material layer can include a first material, and each second material layer can include a second material that is different from the first material. In case at least another alternating stack of material layers is subsequently formed over the alternating stack of the first material layers and the second material layers, the alternating stack is herein referred to as a first-tier alternating stack. The level of the first-tier alternating stack is herein referred to as a first-tier level, and the level of the alternating stack to be subsequently formed immediately above the first-tier level is herein referred to as a second-tier level, etc.

The first-tier alternating stack can include first insulating layers 132 as the first material layers, and first spacer material layers as the second material layers. In one embodiment, the first spacer material layers can be sacrificial material layers that are subsequently replaced with electrically conductive layers. In another embodiment, the first spacer material layers can be electrically conductive layers that are not subsequently replaced with other layers. While the present disclosure is described using example embodiments in which sacrificial material layers are replaced with electrically conductive layers, in some embodiments the spacer material layers are formed as electrically conductive layers (thereby obviating the need to perform replacement processes).

In one embodiment, the first material layers and the second material layers can be first insulating layers 132 and first sacrificial material layers 142, respectively. In one embodiment, each first insulating layer 132 can include a first insulating material, and each first sacrificial material layer 142 can include a first sacrificial material. An alternating plurality of first insulating layers 132 and first sacrificial material layers 142 is formed over the planar semiconductor material layer 10. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first-tier alternating stack (132, 142) can include first insulating layers 132 composed of the first material, and first sacrificial material layers 142 composed of the second material, which is different from the first material. The first material of the first insulating layers 132 can be at least one insulating material. Insulating materials that can be used for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 can be silicon oxide.

The second material of the first sacrificial material layers 142 is a sacrificial material that can be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 can be subsequently replaced with electrically conductive electrode layers which can function, for example, as control gate electrode layers of a vertical NAND device. In one embodiment, the first sacrificial material layers 142 can be material layers that comprise silicon nitride.

In one embodiment, the first insulating layers 132 can include silicon oxide, and sacrificial material layers can include silicon nitride sacrificial material layers. The first material of the first insulating layers 132 can be deposited, for example, by chemical vapor deposition (CVD). For example, if silicon oxide is used for the first insulating layers 132, tetraethylorthosilicate (TEOS) can be used as the precursor material for the CVD process. The second material of the first sacrificial material layers 142 can be formed, for example, CVD or atomic layer deposition (ALD).

The thicknesses of the first insulating layers 132 and the first sacrificial material layers 142 can be in a range from 20 nm to 50 nm, although lesser and greater thicknesses can be used for each first insulating layer 132 and for each first sacrificial material layer 142. The number of repetitions of the pairs of a first insulating layer 132 and a first sacrificial material layer 142 can be in a range from 2 to 1,024, and typically from 8 to 256, although a greater number of repetitions can also be used. In one embodiment, each first sacrificial material layer 142 in the first-tier alternating stack (132, 142) can have a uniform thickness that is substantially invariant within each respective first sacrificial material layer 142.

A first insulating cap layer 170 is subsequently formed over the stack (132, 142). The first insulating cap layer 170 includes a dielectric material, which can be any dielectric material that can be used for the first insulating layers 132. In one embodiment, the first insulating cap layer 170 includes the same dielectric material as the first insulating layers 132. The thickness of the insulating cap layer 170 can be in a range from 20 nm to 300 nm, although lesser and greater thicknesses can also be used.

Figure 3:
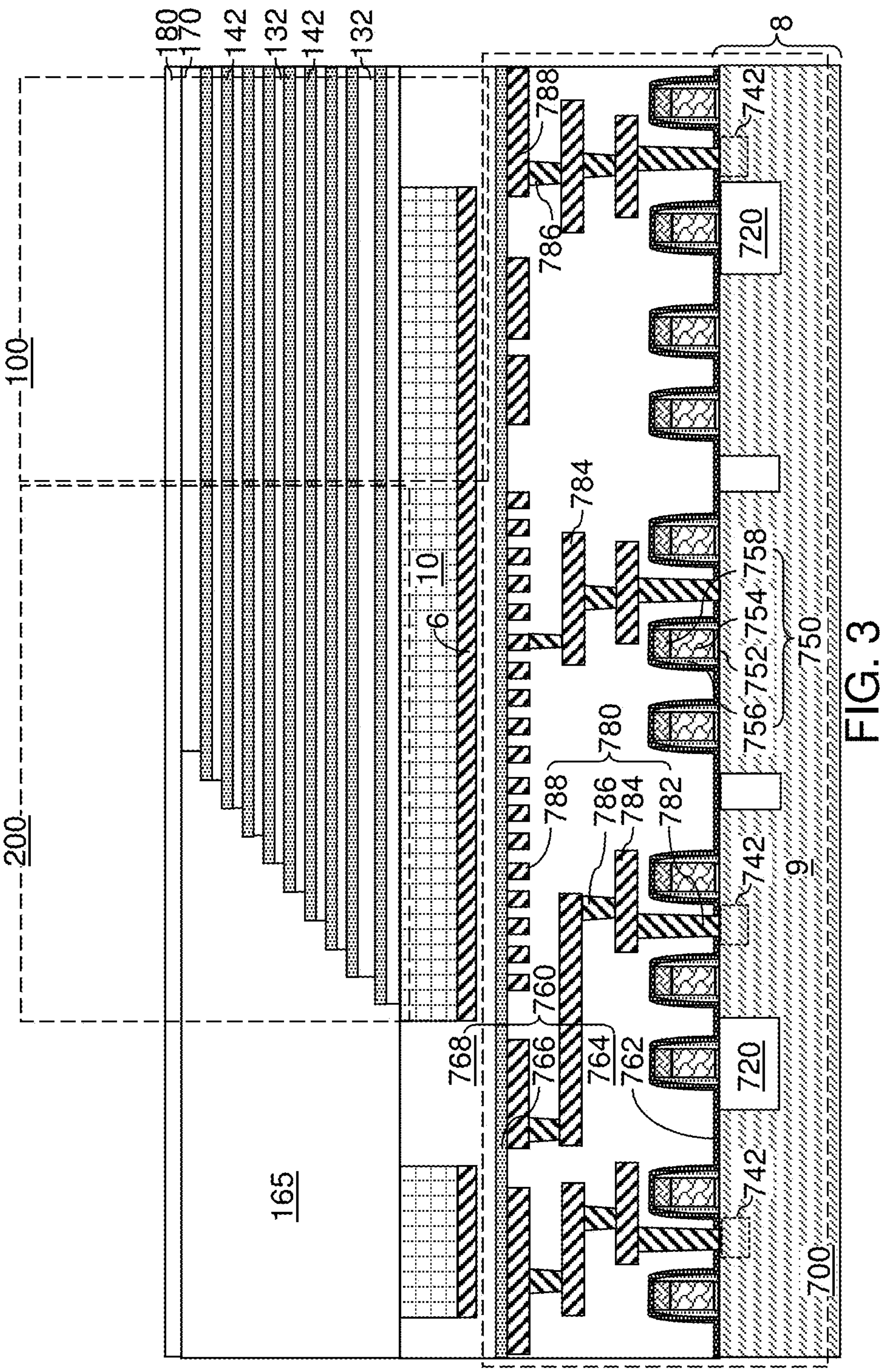
FIG. 3 is a vertical cross-sectional view of the first exemplary structure after patterning a first-tier staircase region, a first retro-stepped dielectric material portion, and an inter-tier dielectric layer according to an embodiment of the present disclosure.

Referring to FIG. 3, the first insulating cap layer 170 and the first-tier alternating stack (132, 142) can be patterned to form first stepped surfaces in the staircase region 200. The staircase region 200 can include a respective first stepped area in which the first stepped surfaces are formed, and a second stepped area in which additional stepped surfaces are to be subsequently formed in a second-tier structure (to be subsequently formed over a first-tier structure) and/or additional tier structures. The first stepped surfaces can be formed, for example, by forming a trimmable mask layer with an opening therein, etching a cavity within the levels of the first insulating cap layer 170, and by iteratively expanding the etched area through trimming the trimmable mask layer and vertically recessing the cavity by etching each pair of a first insulating layer 132 and a first sacrificial material layer 142 located directly underneath the bottom surface of the etched cavity within the etched area. The capacitor region 900 may be masked with a temporary hard mask (not shown) during patterning of the first stepped surfaces so that stepped surfaces are not formed in the capacitor region 900. In one embodiment, top surfaces of the first sacrificial material layers 142 can be physically exposed at the first stepped surfaces. The cavity overlying the first stepped surfaces is herein referred to as a first stepped cavity. The temporary hard mask can be subsequently removed.

A dielectric fill material (such as undoped silicate glass or doped silicate glass) can be deposited to fill the first stepped cavity. Excess portions of the dielectric fill material can be removed from above the horizontal plane including the top surface of the first insulating cap layer 170. A remaining portion of the dielectric fill material that fills the region overlying the first stepped surfaces constitute a first retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present. The first-tier alternating stack (132, 142) and the first retro-stepped dielectric material portion 165 collectively constitute a first-tier structure, which is an in-process structure that is subsequently modified.

An inter-tier dielectric layer 180 may be optionally deposited over the first-tier structure (132, 142, 170, 165). The inter-tier dielectric layer 180 includes a dielectric material such as silicon oxide. In one embodiment, the inter-tier dielectric layer 180 can include a doped silicate glass having a greater etch rate than the material of the first insulating layers 132 (which can include an undoped silicate glass). For example, the inter-tier dielectric layer 180 can include phosphosilicate glass. The thickness of the inter-tier dielectric layer 180 can be in a range from 30 nm to 300 nm, although lesser and greater thicknesses can also be used.

Figure 4A:
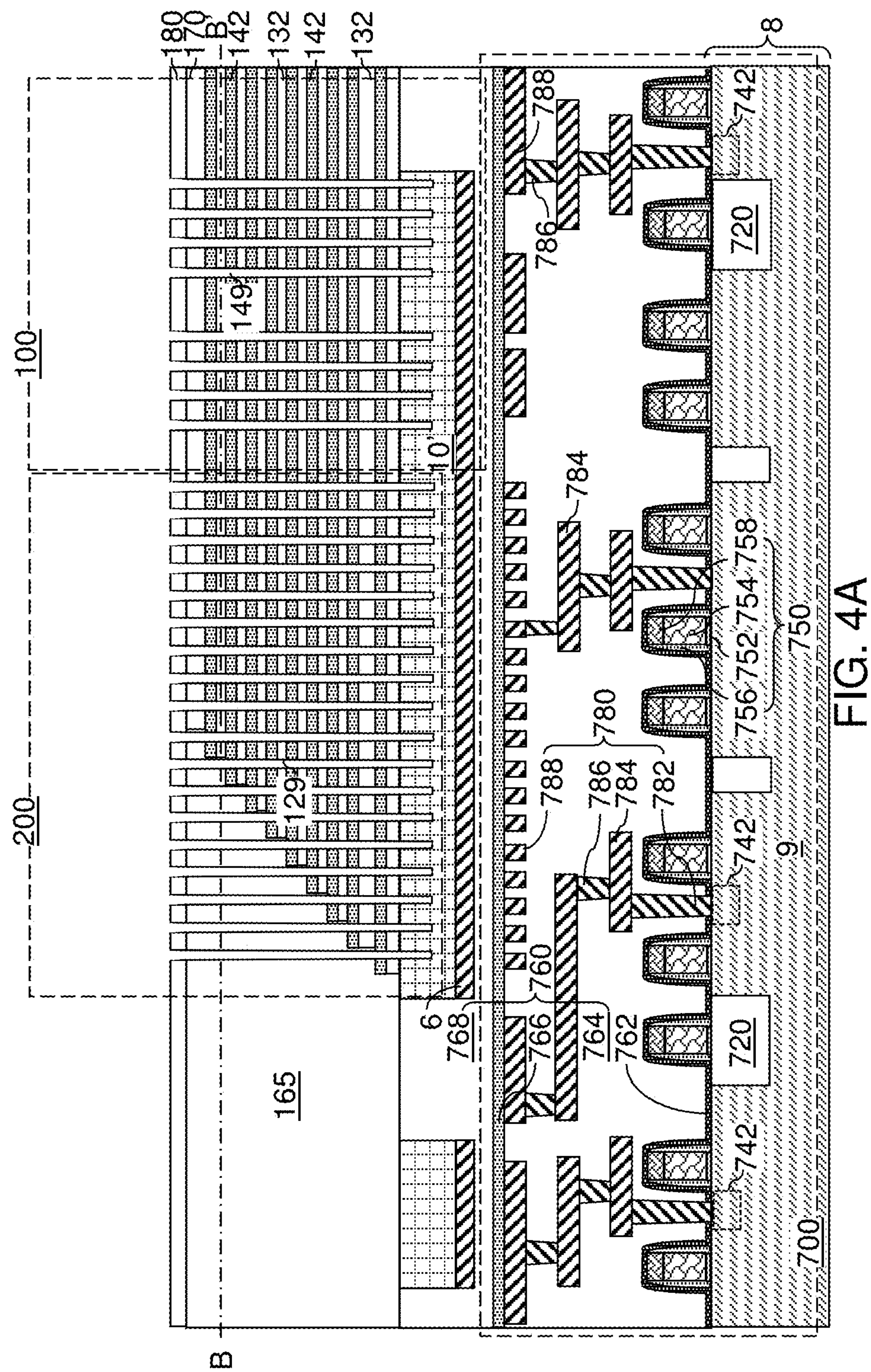
FIG. 4A is a vertical cross-sectional view of the first exemplary structure after formation of first-tier memory openings, first-tier capacitor openings, and first-tier support openings according to an embodiment of the present disclosure.
Figure 4B:
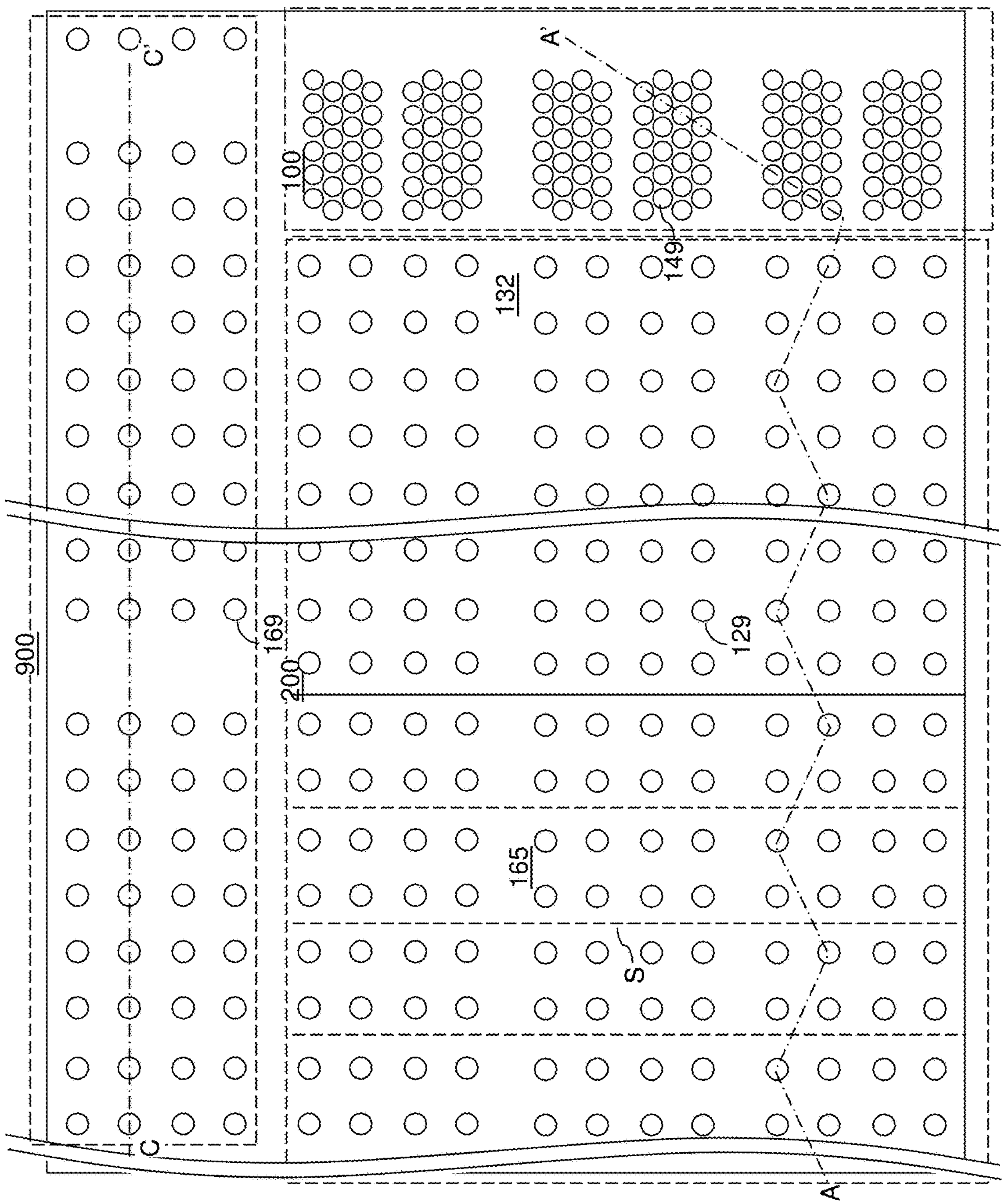
FIG. 4B is a horizontal cross-sectional view of the first exemplary structure of FIG. 4A. The hinged vertical plane A-A' corresponds to the plane of the vertical cross-sectional view of FIG. 4A.
Figure 4C:
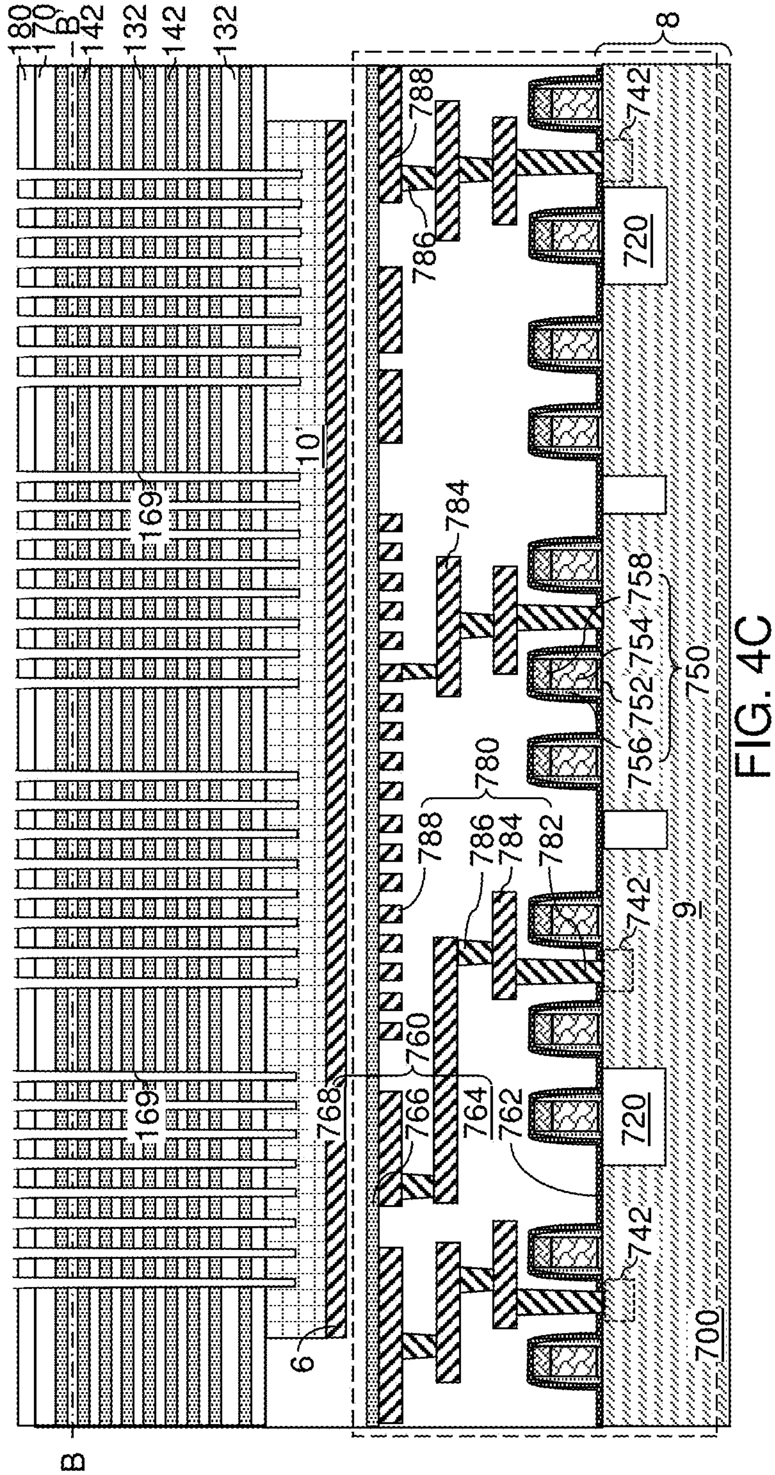
FIG. 4C is a vertical cross-sectional view of the first exemplary structure along the vertical plane C-C' of FIG. 4B.

Referring to FIGS. 4A and 4B, various first-tier openings (149, 129, 169) can be formed through the inter-tier dielectric layer 180 and the first-tier structure (132, 142, 170, 165) and into the in-process source-level material layers 10'. A photoresist layer (not shown) can be applied over the inter-tier dielectric layer 180, and can be lithographically patterned to form various openings therethrough. The pattern of openings in the photoresist layer can be transferred through the inter-tier dielectric layer 180 and the first-tier structure (132, 142, 170, 165) and into the in-process source-level material layers 10' and the at least one second dielectric layer 768 by a first anisotropic etch process to form the various first-tier openings (149, 129, 169) concurrently, i.e., during the first isotropic etch process. The various first-tier openings (149, 129, 169) can include first-tier memory openings 149, first-tier support openings 129, and first-tier capacitor openings 169. Locations of steps S in the first-tier alternating stack (132, 142) are illustrated as dotted lines in FIG. 4B.

The first-tier memory openings 149 are openings that are formed in the memory array region 100 through each layer within the first-tier alternating stack (132, 142) and are subsequently used to form memory stack structures therein. The first-tier memory openings 149 can be formed in clusters of first-tier memory openings 149 that are laterally spaced apart along the second horizontal direction hd2. Each cluster of first-tier memory openings 149 can be formed as a two-dimensional array of first-tier memory openings 149.

The first-tier support openings 129 are openings that are formed in the staircase region 200 and are subsequently used to form lower portions of support pillar structures therein. A subset of the first-tier support openings 129 that is formed through the first retro-stepped dielectric material portion 165 can be formed through the first stepped surfaces. Another subset of the first-tier support openings 129 are formed in an area of the staircase region 200 that is proximal to a memory array region 100 and includes all layers of the first-tier alternating stack (132, 142).

The first-tier capacitor openings 169 are openings that are formed in the capacitor region 900. The first-tier capacitor openings 169 can be subsequently used to form a lower portion of a capacitor therein. Each of the first-tier capacitor openings 169 can extend through each layer within the first-tier alternating stack (132, 142). In one embodiment, the first-tier capacitor openings 169 can be formed in multiple clusters that are laterally spaced apart one from another.

In one embodiment, the first anisotropic etch process can include an initial step in which the materials of the first-tier alternating stack (132, 142) are etched concurrently with the material of the first retro-stepped dielectric material portion 165. The chemistry of the initial etch step can alternate to optimize etching of the first and second materials in the first-tier alternating stack (132, 142) while providing a comparable average etch rate to the material of the first retro-stepped dielectric material portion 165. The first anisotropic etch process can use, for example, a series of reactive ion etch processes or a single reaction etch process (e.g., $CF_4/O_2/Ar$ etch). The sidewalls of the various first-tier openings (149, 129) can be substantially vertical, or can be tapered. A top surface of the lower source-level material layer 112 can be physically exposed at the bottom of each of the first-tier openings (149, 129, 169).

Figure 5A:
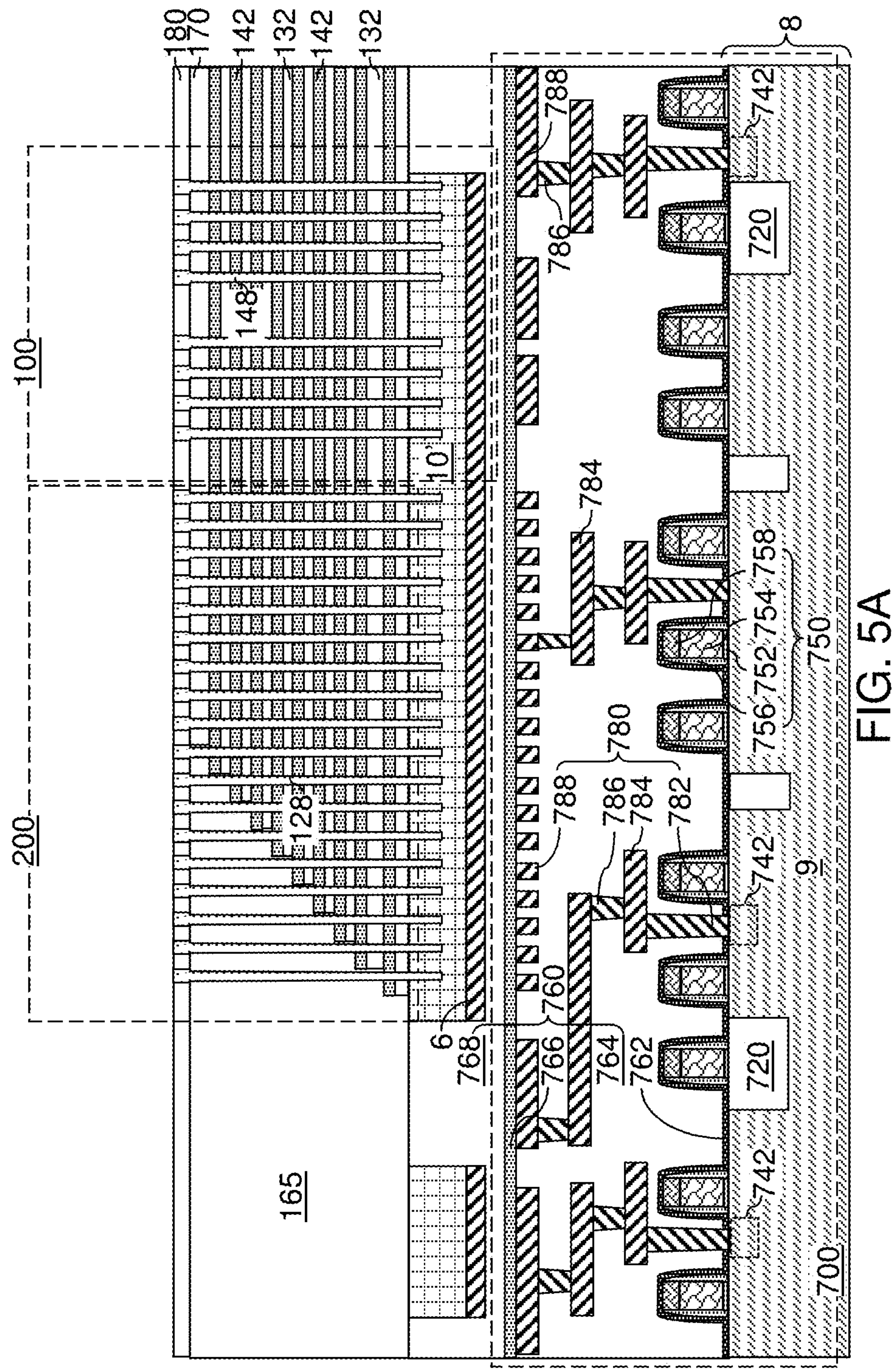
FIG. 5A is a vertical cross-sectional view of the first exemplary structure after formation of various sacrificial fill structures according to an embodiment of the present disclosure.
Figure 5B:
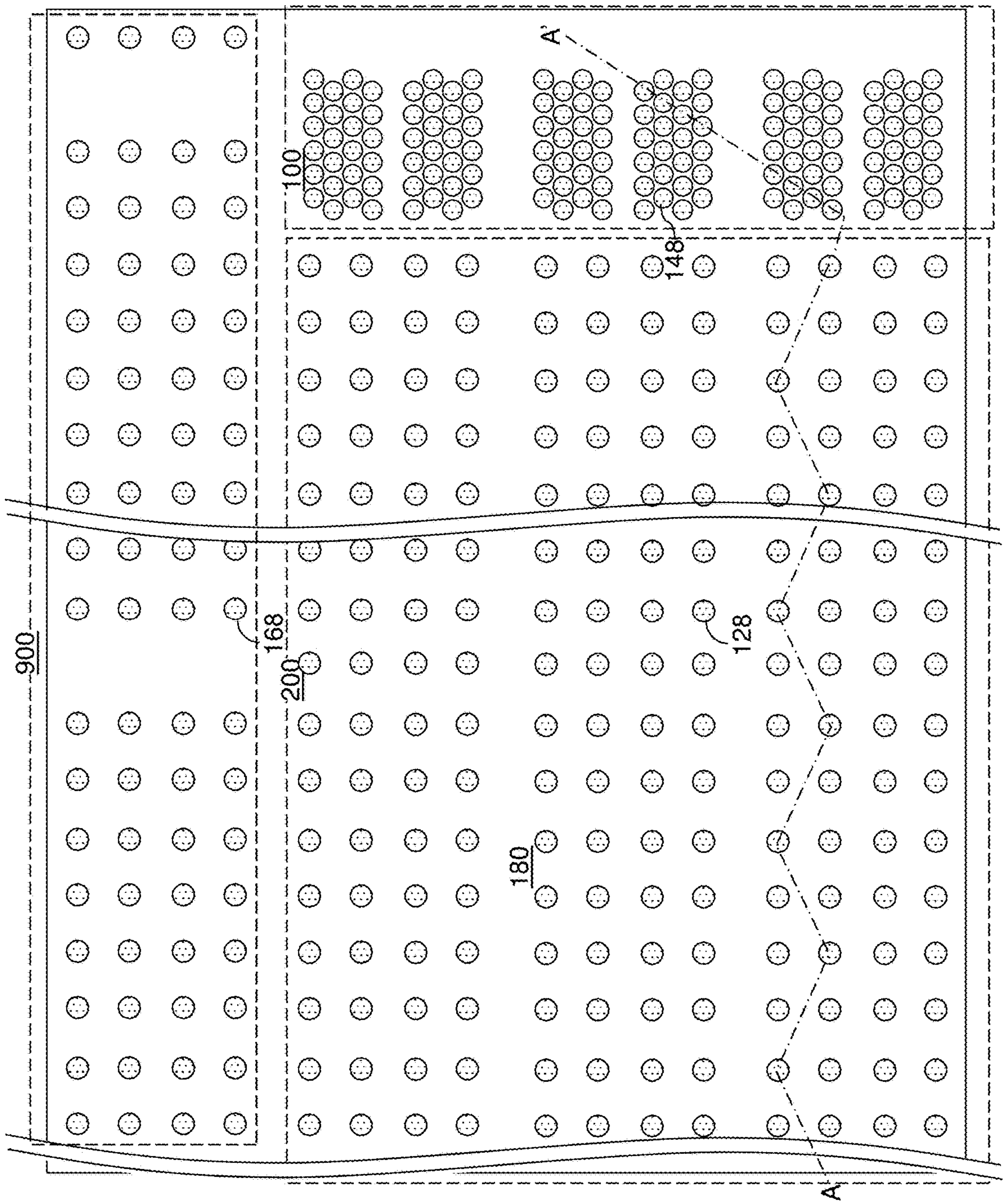
FIG. 5B is a top-down view of the first exemplary structure of FIG. 5A. The hinged vertical plane A-A' corresponds to the plane of the vertical cross-sectional view of FIG. 5A.

Referring to FIGS. 5A and 5B, sacrificial first-tier opening fill portions (148, 128, 168) can be formed in the various first-tier openings (149, 129, 169). For example, a sacrificial first-tier fill material is concurrently deposited in each of the first-tier openings (149, 129, 169). The sacrificial first-tier fill material includes a material that can be subsequently removed selective to the materials of the first insulating layers 132 and the first sacrificial material layers 142.

In one embodiment, the sacrificial first-tier fill material can include a semiconductor material such as silicon (e.g., a-Si or polysilicon), a silicon-germanium alloy, germanium, a III-V compound semiconductor material, or a combination thereof. Optionally, a thin etch stop liner (such as a silicon oxide layer or a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In another embodiment, the sacrificial first-tier fill material can include a silicon oxide material having a higher etch rate than the materials of the first insulating layers 132, the first insulating cap layer 170, and the inter-tier insulating layer 180. For example, the sacrificial first-tier fill material may include borosilicate glass or porous or non-porous organosilicate glass having an etch rate that is at least 100 times higher than the etch rate of densified TEOS oxide (i.e., a silicon oxide material formed by decomposition of tetraethylorthosilicate glass in a chemical vapor deposition process and subsequently densified in an anneal process) in a 100:1 dilute hydrofluoric acid. In this case, a thin etch stop liner (such as a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In yet another embodiment, the sacrificial first-tier fill material can include a carbon-containing material (such as amorphous carbon or diamond-like carbon) that can be subsequently removed by ashing, or a silicon-based polymer that can be subsequently removed selective to the materials of the first-tier alternating stack (132, 142).

Portions of the deposited sacrificial material can be removed from above the topmost layer of the first-tier alternating stack (132, 142), such as from above the inter-tier dielectric layer 180. For example, the sacrificial first-tier fill material can be recessed to a top surface of the inter-tier dielectric layer 180 using a planarization process. The planarization process can include a recess etch, chemical mechanical planarization (CMP), or a combination thereof. The top surface of the inter-tier dielectric layer 180 can be used as an etch stop layer or a planarization stop layer.

Remaining portions of the sacrificial first-tier fill material comprise sacrificial first-tier opening fill portions (148, 128, 168). Specifically, each remaining portion of the sacrificial material in a first-tier memory opening 149 constitutes a sacrificial first-tier memory opening fill portion 148. Each remaining portion of the sacrificial material in a first-tier support opening 129 constitutes a sacrificial first-tier support opening fill portion 128. Each remaining portion of the sacrificial material in a first-tier capacitor opening 169 constitutes a sacrificial first-tier capacitor opening fill portion 168. The various sacrificial first-tier opening fill portions (148, 128, 168) are concurrently formed, i.e., during a same set of processes including the deposition process that deposits the sacrificial first-tier fill material and the planarization process that removes the first-tier deposition process from above the first-tier alternating stack (132, 142) (such as from above the top surface of the inter-tier dielectric layer 180). The top surfaces of the sacrificial first-tier opening fill portions (148, 128, 168) can be coplanar with the top surface of the inter-tier dielectric layer 180. Each of the sacrificial first-tier opening fill portions (148, 128, 168) may, or may not, include cavities therein.

Figure 6:
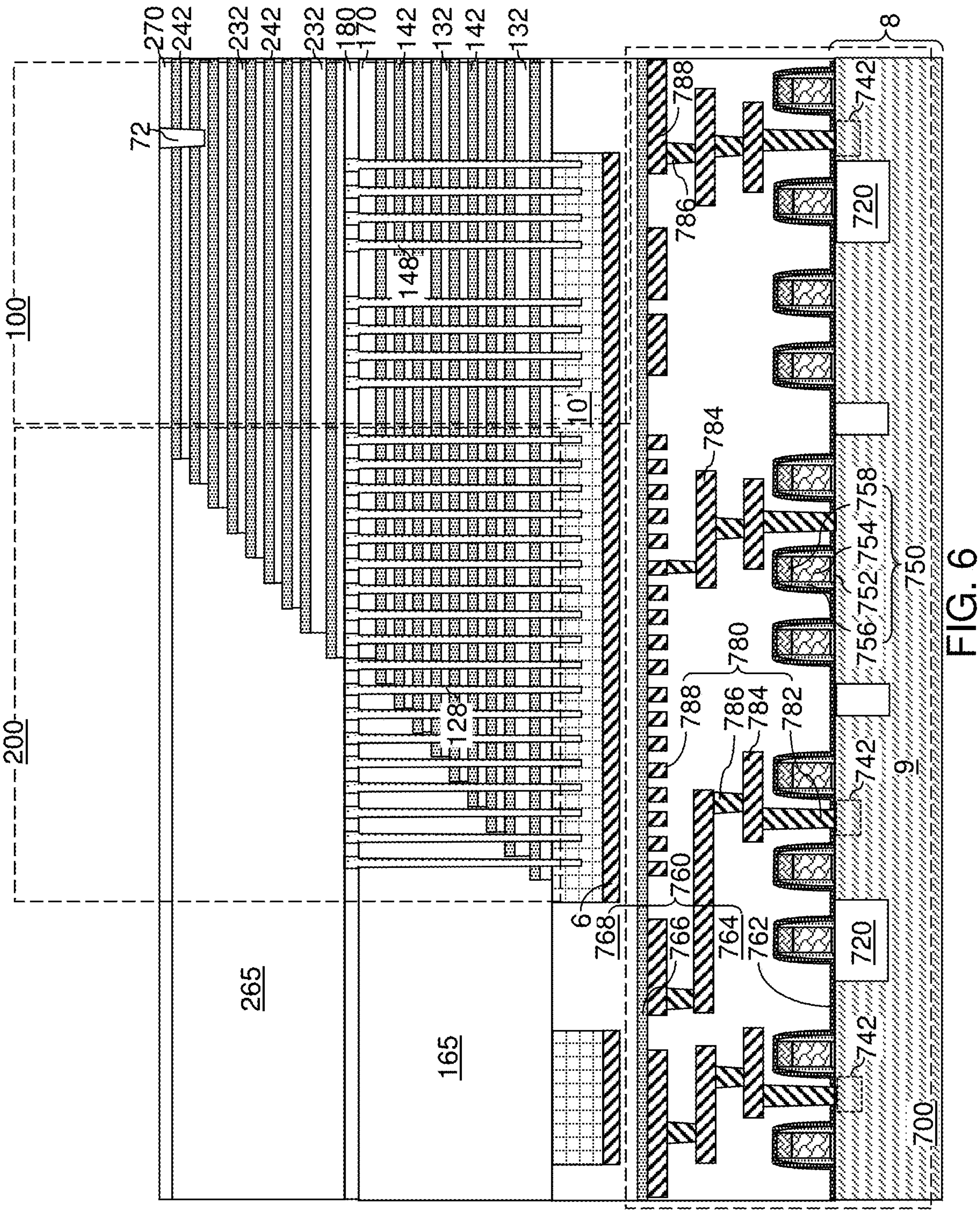
FIG. 6 is a vertical cross-sectional view of the first exemplary structure after formation of a second-tier alternating stack of second insulating layers and second spacer material layers, second stepped surfaces, and a second retro-stepped dielectric material portion according to an embodiment of the present disclosure.

Referring to FIG. 6, a second-tier structure can be formed over the first-tier structure (132, 142, 170, 148). The second-tier structure can include an additional alternating stack of insulating layers and spacer material layers, which can be sacrificial material layers. For example, a second-tier alternating stack (232, 242) of material layers can be subsequently formed on the top surface of the first-tier alternating stack (132, 142). The second stack (232, 242) includes an alternating plurality of third material layers and fourth material layers. Each third material layer can include a third material, and each fourth material layer can include a fourth material that is different from the third material. In one embodiment, the third material can be the same as the first material of the first insulating layer 132, and the fourth material can be the same as the second material of the first sacrificial material layers 142.

In one embodiment, the third material layers can be second insulating layers 232 and the fourth material layers can be second spacer material layers that provide vertical spacing between each vertically neighboring pair of the second insulating layers 232. In one embodiment, the third material layers and the fourth material layers can be second insulating layers 232 and second sacrificial material layers 242, respectively. The third material of the second insulating layers 232 may be at least one insulating material. The fourth material of the second sacrificial material layers 242 may be a sacrificial material that can be removed selective to the third material of the second insulating layers 232. The second sacrificial material layers 242 may comprise an insulating material, a semiconductor material, or a conductive material. The fourth material of the second sacrificial material layers 242 can be subsequently replaced with electrically conductive electrode layers which can function, for example, as control gate electrode layers of a vertical NAND device.

In one embodiment, each second insulating layer 232 can include a second insulating material, and each second sacrificial material layer 242 can include a second sacrificial material. In this case, the second stack (232, 242) can include an alternating plurality of second insulating layers 232 and second sacrificial material layers 242. The third material of the second insulating layers 232 can be deposited, for example, by chemical vapor deposition (CVD). The fourth material of the second sacrificial material layers 242 can be formed, for example, CVD or atomic layer deposition (ALD).

The third material of the second insulating layers 232 can be at least one insulating material. Insulating materials that can be used for the second insulating layers 232 can be any material that can be used for the first insulating layers 132. The fourth material of the second sacrificial material layers 242 is a sacrificial material that can be removed selective to the third material of the second insulating layers 232. Sacrificial materials that can be used for the second sacrificial material layers 242 can be any material that can be used for the first sacrificial material layers 142. In one embodiment, the second insulating material can be the same as the first insulating material, and the second sacrificial material can be the same as the first sacrificial material.

The thicknesses of the second insulating layers 232 and the second sacrificial material layers 242 can be in a range from 20 nm to 50 nm, although lesser and greater thicknesses can be used for each second insulating layer 232 and for each second sacrificial material layer 242. The number of repetitions of the pairs of a second insulating layer 232 and a second sacrificial material layer 242 can be in a range from 2 to 1,024, and typically from 8 to 256, although a greater number of repetitions can also be used. In one embodiment, each second sacrificial material layer 242 in the second stack (232, 242) can have a uniform thickness that is substantially invariant within each respective second sacrificial material layer 242.

Second stepped surfaces in the second stepped area can be formed in the staircase region 200 using a same set of processing steps as the processing steps used to form the first stepped surfaces in the first stepped area with suitable adjustment to the pattern of at least one masking layer. The capacitor region 900 can be covered with a temporary hard mask during formation of the second stepped surfaces to prevent formation of any stepped surface therein. The temporary hard mask can be removed after formation of the second stepped surfaces. A second retro-stepped dielectric material portion 265 can be formed over the second stepped surfaces in the staircase region 200.

A second insulating cap layer 270 can be subsequently formed over the second-tier alternating stack (232, 242). The second insulating cap layer 270 includes a dielectric material that is different from the material of the second sacrificial material layers 242. In one embodiment, the second insulating cap layer 270 can include silicon oxide. In one embodiment, the first and second sacrificial material layers (142, 242) can comprise silicon nitride.

Generally speaking, at least one alternating stack of insulating layers (132, 232) and spacer material layers (such as sacrificial material layers (142, 242)) can be formed over the in-process source-level material layers 10', and at least one retro-stepped dielectric material portion (165, 265) can be formed over the staircase regions on the at least one alternating stack (132, 142, 232, 242).

Optionally, drain-select-level isolation structures 72 can be formed through a subset of layers in an upper portion of the second-tier alternating stack (232, 242). The second sacrificial material layers 242 that are cut by the select-drain-level shallow trench isolation structures 72 correspond to the levels in which drain-select-level electrically conductive layers are subsequently formed. The drain-select-level isolation structures 72 include a dielectric material such as silicon oxide. The drain-select-level isolation structures 72 can laterally extend along a first horizontal direction hd1, and can be laterally spaced apart along a second horizontal direction hd2 that is perpendicular to the first horizontal direction hd1. The combination of the second-tier alternating stack (232, 242), the second retro-stepped dielectric material portion 265, the second insulating cap layer 270, and the optional drain-select-level isolation structures 72 collectively constitute a second-tier structure (232, 242, 265, 270, 72).

Figure 7A:
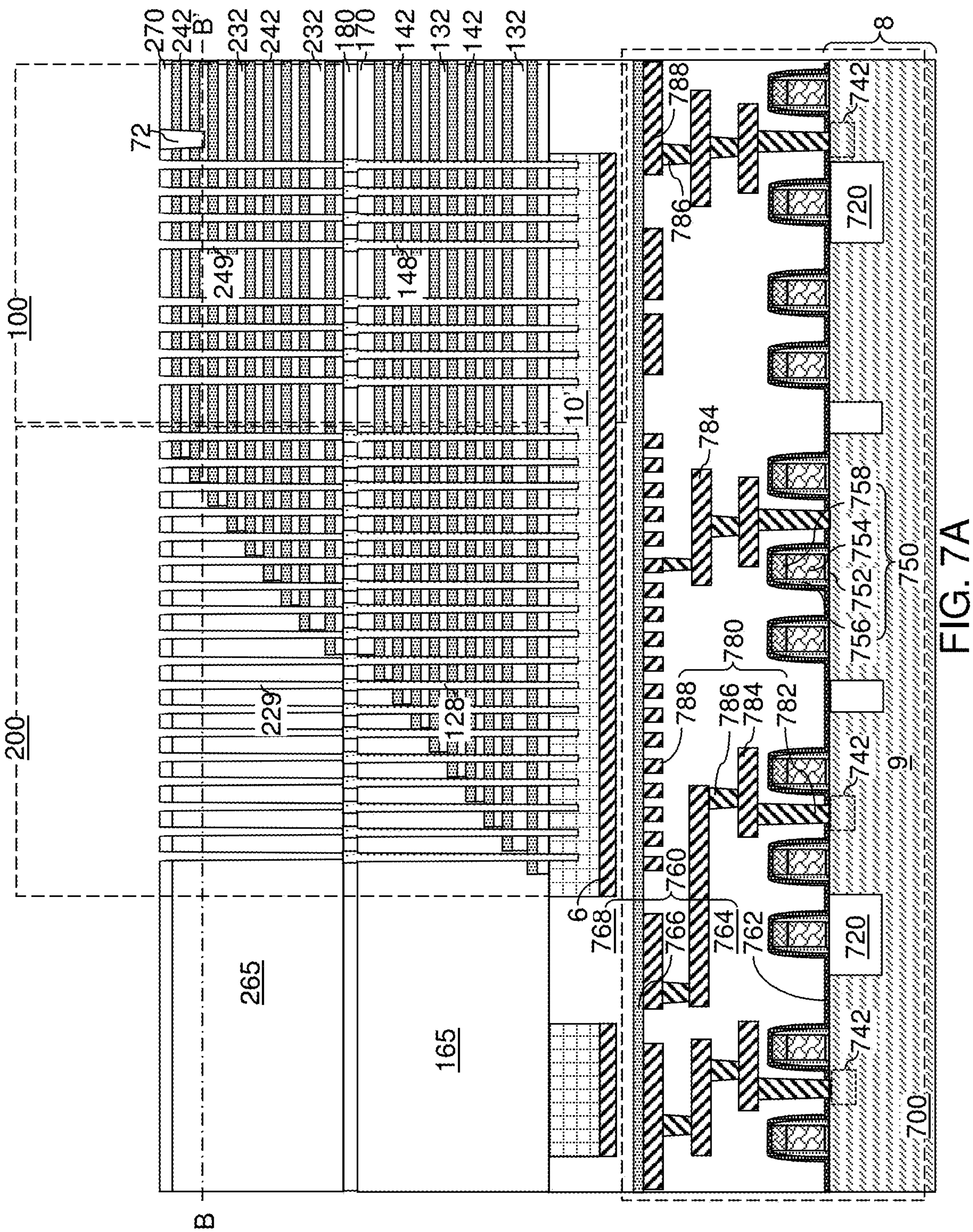
FIG. 7A is a vertical cross-sectional view of the first exemplary structure after formation of second-tier memory openings, second-tier capacitor openings, and second-tier support openings according to an embodiment of the present disclosure.
Figure 7B:
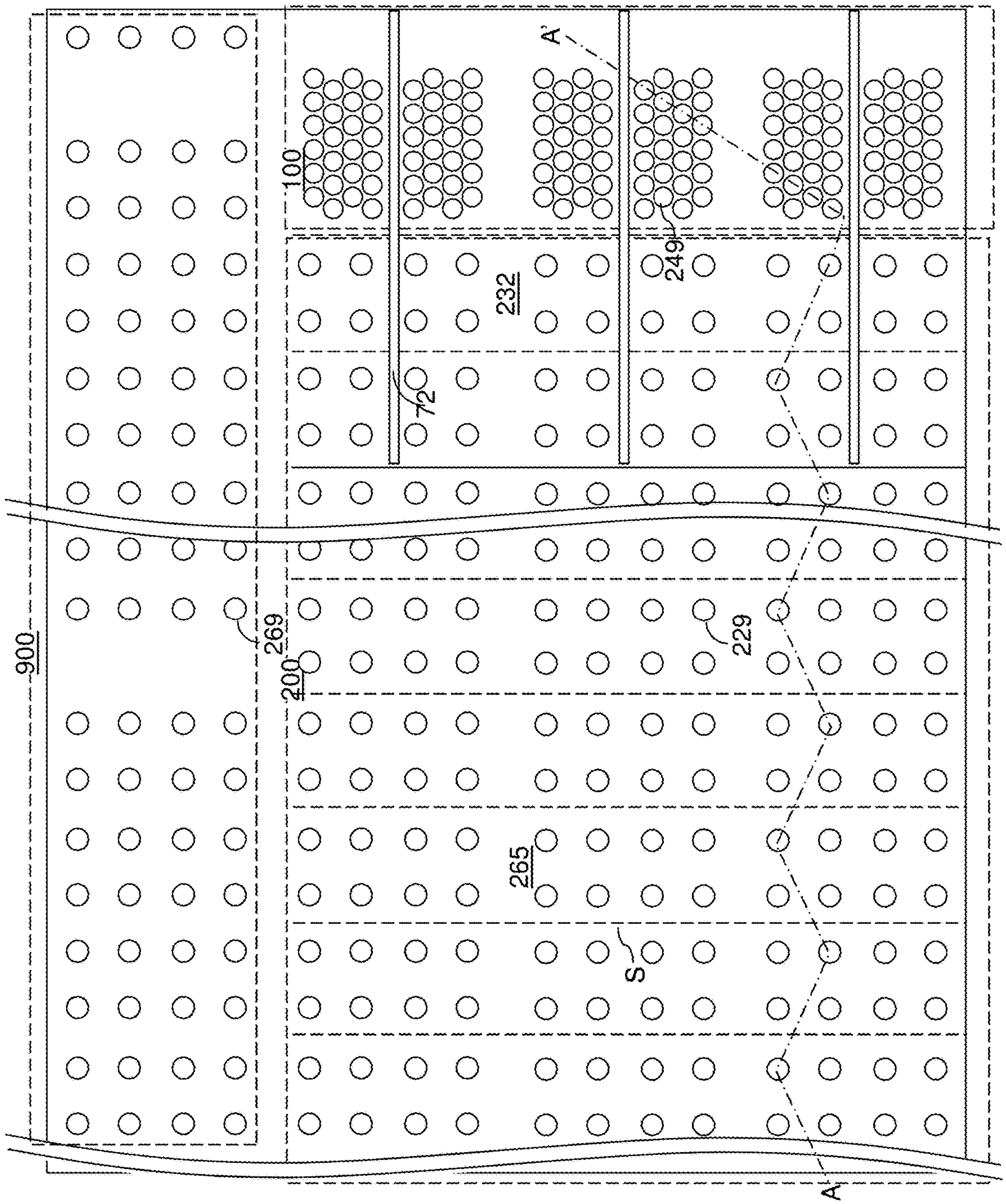
FIG. 7B is a horizontal cross-sectional of the first exemplary structure along the horizontal plane B-B' of FIG. 7A. The hinged vertical plane A-A' corresponds to the plane of the vertical cross-sectional view of FIG. 7A.

Referring to FIGS. 7A and 7B, various second-tier openings (249, 229, 269) can be formed through the second-tier structure (232, 242, 265, 270, 72). A photoresist layer (not shown) can be applied over the second insulating cap layer 270, and can be lithographically patterned to form various openings therethrough. The pattern of the openings can be the same as the pattern of the various first-tier openings (149, 129, 169), which is the same as the sacrificial first-tier opening fill portions (148, 128, 168). Thus, the lithographic mask used to pattern the first-tier openings (149, 129, 169) can be used to pattern the photoresist layer.

The pattern of openings in the photoresist layer can be transferred through the second-tier structure (232, 242, 265, 270, 72) by a second anisotropic etch process to form various second-tier openings (249, 229, 269) concurrently, i.e., during the second anisotropic etch process. The various second-tier openings (249, 229, 269) can include second-tier memory openings 249, second-tier support openings 229, and second-tier capacitor openings 269

The second-tier memory openings 249 are formed directly on a top surface of a respective one of the sacrificial first-tier memory opening fill portions 148. The second-tier support openings 229 are formed directly on a top surface of a respective one of the sacrificial first-tier support opening fill portions 128. The second-tier capacitor openings 269 are formed directly on a top surface of a respective one of the sacrificial first-tier capacitor opening fill portions 168. A subset of the second-tier support openings 229 can be formed through a horizontal surface within the second stepped surfaces, which include the interfacial surfaces between the second-tier alternating stack (232, 242) and the second retro-stepped dielectric material portion 265. Locations of steps S in the first-tier alternating stack (132, 142) and the second-tier alternating stack (232, 242) are illustrated as dotted lines in FIG. 7B.

The second anisotropic etch process can include an etch step in which the materials of the second-tier alternating stack (232, 242) are etched concurrently with the material of the second retro-stepped dielectric material portion 265. The chemistry of the etch step can alternate to optimize etching of the materials in the second-tier alternating stack (232, 242) while providing a comparable average etch rate to the material of the second retro-stepped dielectric material portion 265. The second anisotropic etch process can use, for example, a series of reactive ion etch processes or a single reaction etch process (e.g., $CF_4/O_2/Ar$ etch). The sidewalls of the various second-tier openings (249, 229, 269) can be substantially vertical, or can be tapered. A bottom periphery of each second-tier opening (249, 229, 269) may be laterally offset, and/or may be located entirely within, a periphery of a top surface of an underlying sacrificial first-tier opening fill portion (148, 128, 168). The photoresist layer can be subsequently removed, for example, by ashing.

Figure 8:
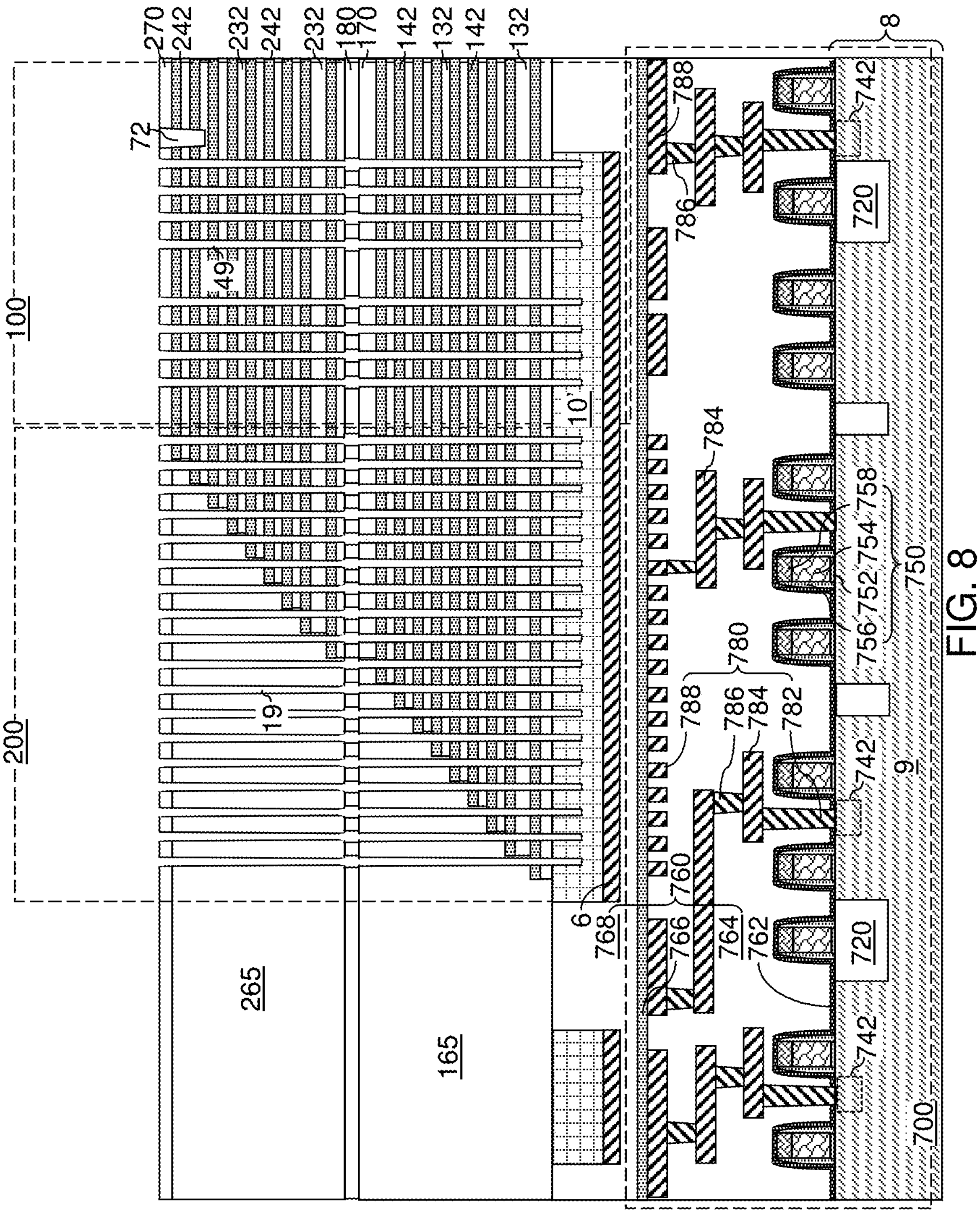
FIG. 8 is a vertical cross-sectional view of the first exemplary structure after formation of inter-tier memory openings, inter-tier capacitor openings, and inter-tier support openings according to an embodiment of the present disclosure.

Referring to FIG. 8, the sacrificial first-tier fill material of the sacrificial first-tier opening fill portions (148, 128, 169) can be removed using an etch process that etches the sacrificial first-tier fill material selective to the materials of the first and second insulating layers (132, 232), the first and second sacrificial material layers (142,242), the first and second insulating cap layers (170, 270), and the inter-tier dielectric layer 180. A memory opening 49, which is also referred to as an inter-tier memory opening 49, is formed in each combination of a second-tier memory opening 249 and a volume from which a sacrificial first-tier memory opening fill portion 148 is removed. A support opening 19, which is also referred to as an inter-tier support opening 19, is formed in each combination of a second-tier support opening 229 and a volume from which a sacrificial first-tier support opening fill portion 128 is removed. A capacitor opening, which is also referred to as an inter-tier capacitor opening, is formed in each combination of a second-tier capacitor opening 269 and a volume from which a sacrificial first-tier capacitor opening fill portion 168 is removed.

FIGS. 9A-9D provide sequential cross-sectional views of a memory opening 49 during formation of a memory opening fill structure. The same structural change occurs in each of the memory openings 49, the support openings 19, and the capacitor openings.

Figure 9B:
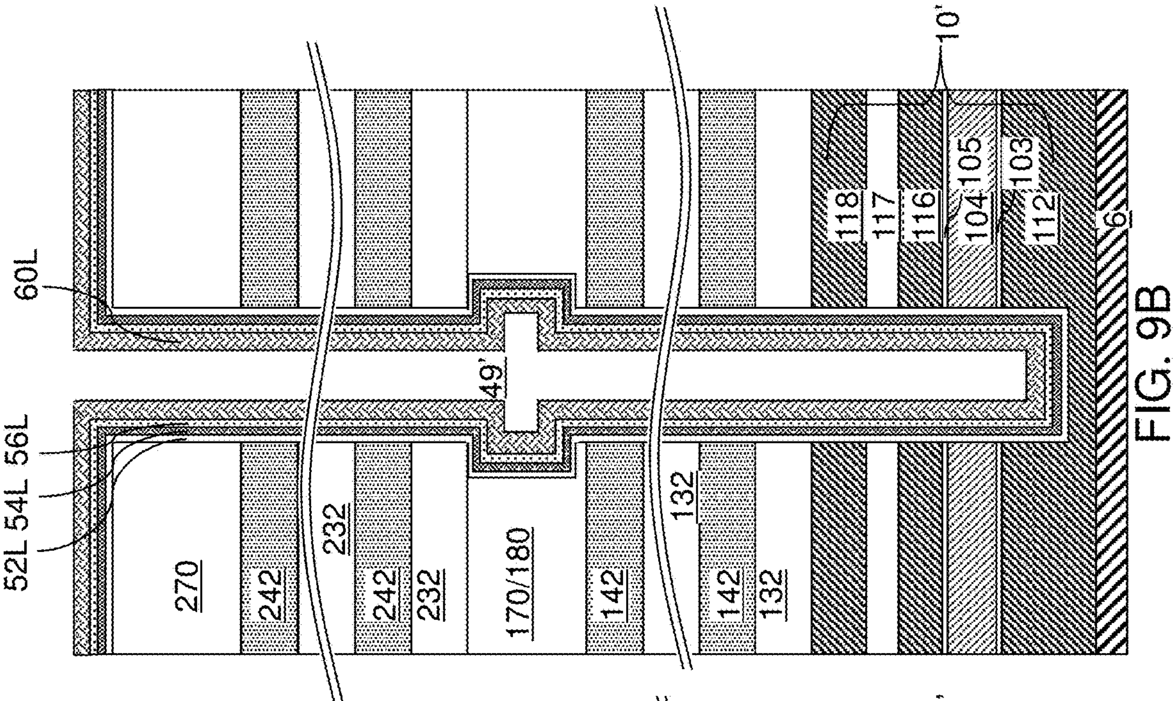
FIGS. 9A-9D illustrate sequential vertical cross-sectional views of a memory opening during formation of a memory opening fill structure according to an embodiment of the present disclosure.
Figure 9A:
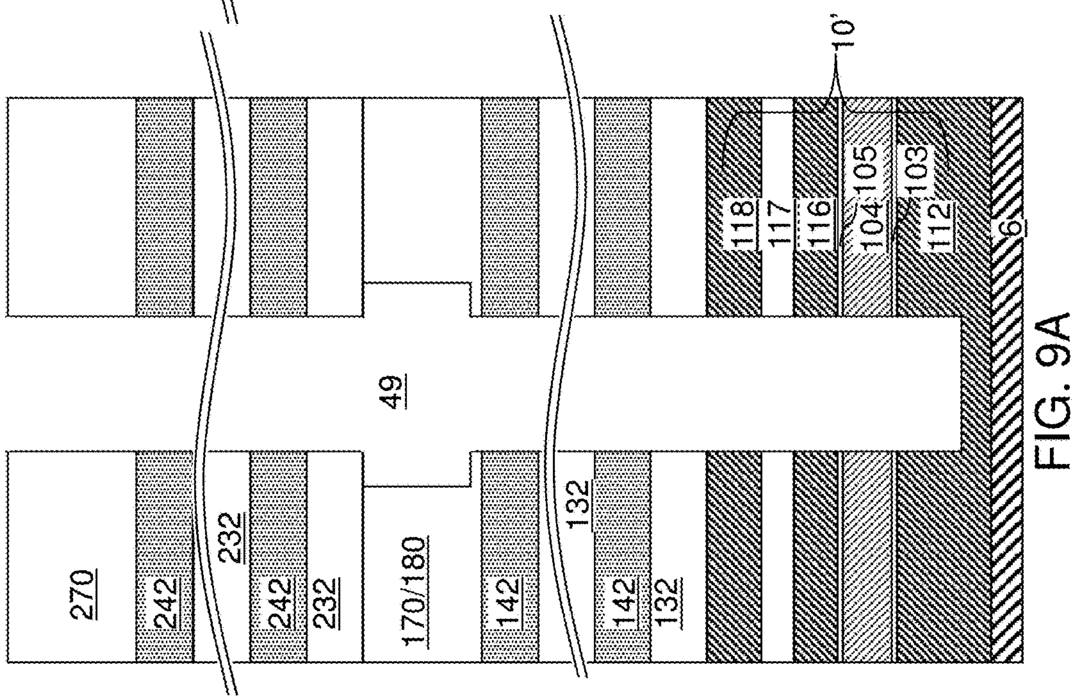
Figure 9D:
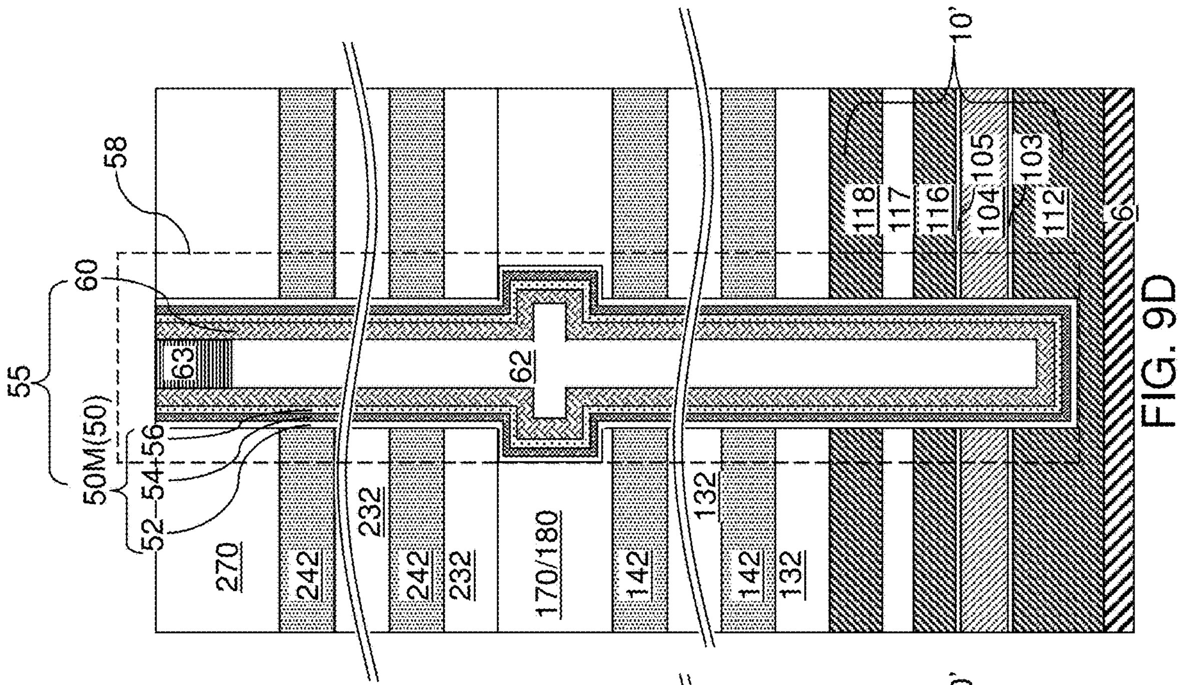

Referring to FIG. 9A, a memory opening 49 in the first exemplary device structure of FIG. 8 is illustrated. The memory opening 49 extends through the first-tier structure and the second-tier structure.

Referring to FIG. 9B, a stack of layers including a continuous blocking dielectric layer 52L, a continuous charge storage layer 54L, a continuous tunneling dielectric layer 56L, and a semiconductor channel material layer 60L can be sequentially deposited in the memory openings 49. The continuous blocking dielectric layer 52L can include a single dielectric material layer or a stack of a plurality of dielectric material layers. In one embodiment, the continuous blocking dielectric layer 52L can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the continuous blocking dielectric layer 52L can include a dielectric metal oxide having a dielectric constant greater than 7.9, i.e., having a dielectric constant greater than the dielectric constant of silicon nitride. The thickness of the dielectric metal oxide layer can be in a range from 1 nm to 20 nm, although lesser and greater thicknesses can also be used. The dielectric metal oxide layer can subsequently function as a dielectric material portion that blocks leakage of stored electrical charges to control gate electrode layers. In one embodiment, the continuous blocking dielectric layer 52L includes aluminum oxide. Alternatively or additionally, the continuous blocking dielectric layer 52L can include a dielectric semiconductor compound such as silicon oxide, silicon oxynitride, silicon nitride, or a combination thereof.

Subsequently, the continuous charge storage layer 54L can be formed. In one embodiment, the continuous charge storage layer 54L can be a continuous layer or patterned discrete portions of a charge trapping material including a dielectric charge trapping material, which can be, for example, silicon nitride. Alternatively, the continuous charge storage layer 54L can include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the continuous charge storage layer 54L includes a silicon nitride layer. In one embodiment, the sacrificial material layers (142, 242) and the insulating layers (132, 232) can have vertically coincident sidewalls. Alternatively, the sacrificial material layers (142, 242) can be laterally recessed with respect to the sidewalls of the insulating layers (132, 232), and a combination of a deposition process and an anisotropic etch process can be used to pattern the continuous charge storage layer 54L into a plurality of discrete memory material portions that are vertically spaced apart. The thickness of the continuous charge storage layer 54L can be in a range from 2 nm to 20 nm, although lesser and greater thicknesses can also be used.

The continuous tunneling dielectric layer 56L includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The continuous tunneling dielectric layer 56L can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the continuous tunneling dielectric layer 56L can include a stack of a first silicon oxide layer, a silicon oxynitride layer, and a second silicon oxide layer, which is commonly known as an ONO stack. In one embodiment, the continuous tunneling dielectric layer 56L can include a silicon oxide layer that is substantially free of carbon or a silicon oxynitride layer that is substantially free of carbon. The thickness of the continuous tunneling dielectric layer 56L can be in a range from 2 nm to 20 nm, although lesser and greater thicknesses can also be used.

The semiconductor channel material layer 60L includes a doped semiconductor material having a doping of a first conductivity type, which is the opposite of the first conductivity type. For example, if the first conductivity type is p-type, the second conductivity type is n-type, and vice versa. The semiconductor channel material layer 60L can include at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L can having a uniform doping. In one embodiment, the semiconductor channel material layer 60L has a p-type doping in which p-type dopants (such as boron atoms) are present at an atomic concentration in a range from $1.0\times10^{12}/cm^3$ to $1.0\times10^{18}/cm^3$, such as from $1.0\times10^{14}/cm^3$ to $1.0\times10^{17}/cm^3$. In one embodiment, the semiconductor channel material layer 60L includes, and/or consists essentially of, boron-doped amorphous silicon or boron-doped polysilicon. In another embodiment, the semiconductor channel material layer 60L has an n-type doping in which n-type dopants (such as phosphor atoms or arsenic atoms) are present at an atomic concentration in a range from $1.0\times10^{15}/cm^3$ to $1.0\times10^{19}/cm^3$, such as from $1.0\times10^{16}/cm^3$ to $1.0\times10^{18}/cm^3$. The semiconductor channel material layer 60L can be formed by a conformal deposition method such as low pressure chemical vapor deposition (LPCVD). The thickness of the semiconductor channel material layer 60L can be in a range from 2 nm to 10 nm, although lesser and greater thicknesses can also be used. A cavity 49' is formed in the volume of each memory opening 49 that is not filled with the deposited material layers (52, 54, 56, 60L).

Figure 9C:
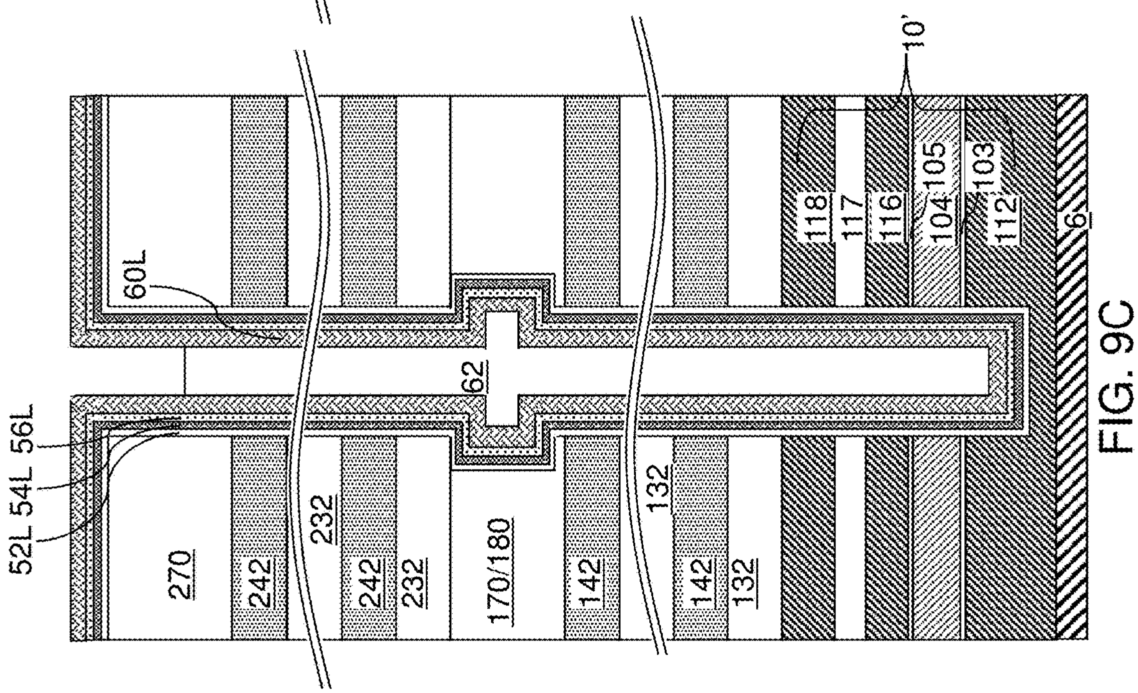
Figure 10A:
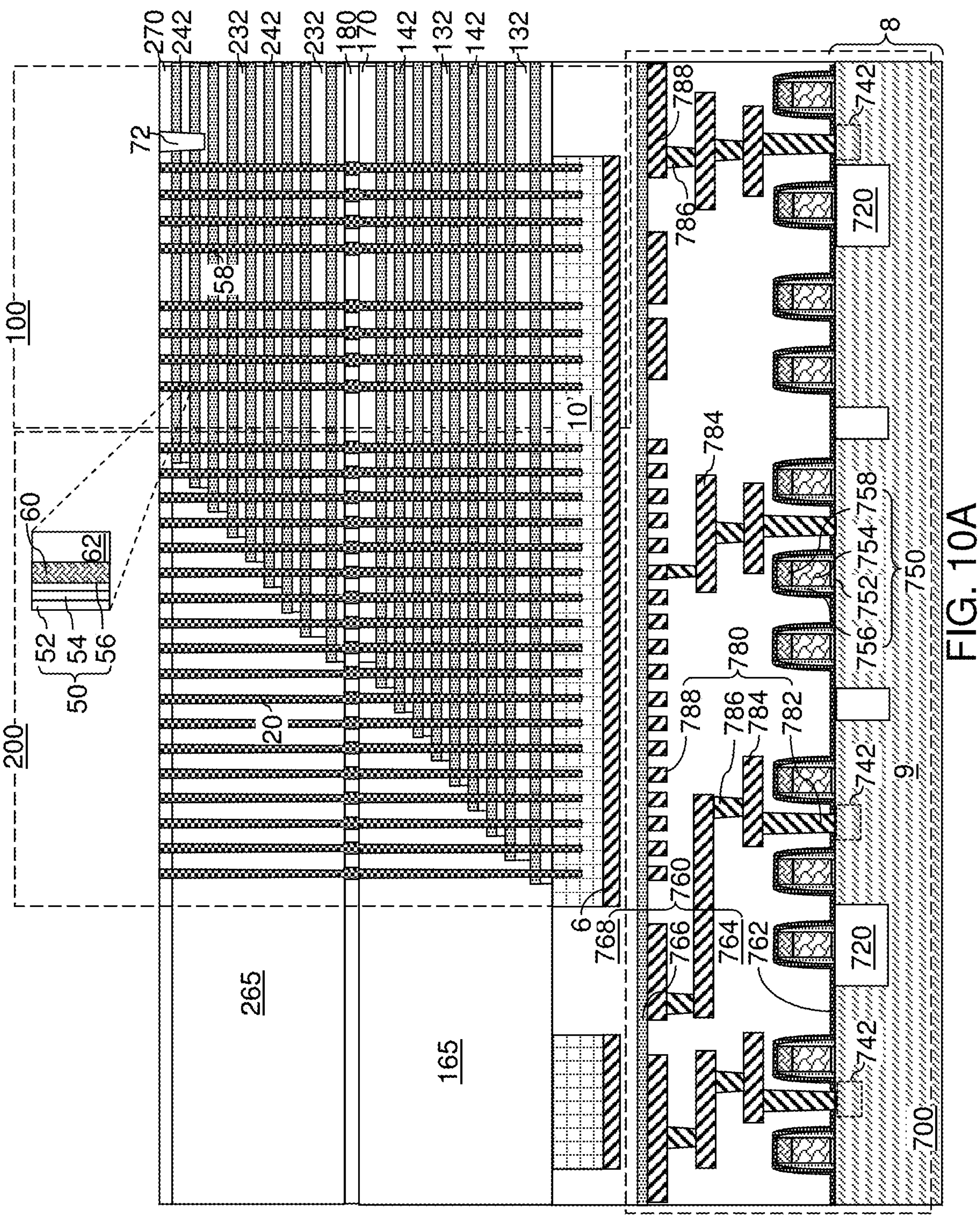
FIG. 10A is a vertical cross-sectional view of the first exemplary structure after formation of memory opening fill structures, capacitor pillar structures, and support pillar structures according to an embodiment of the present disclosure.
Figure 10B:
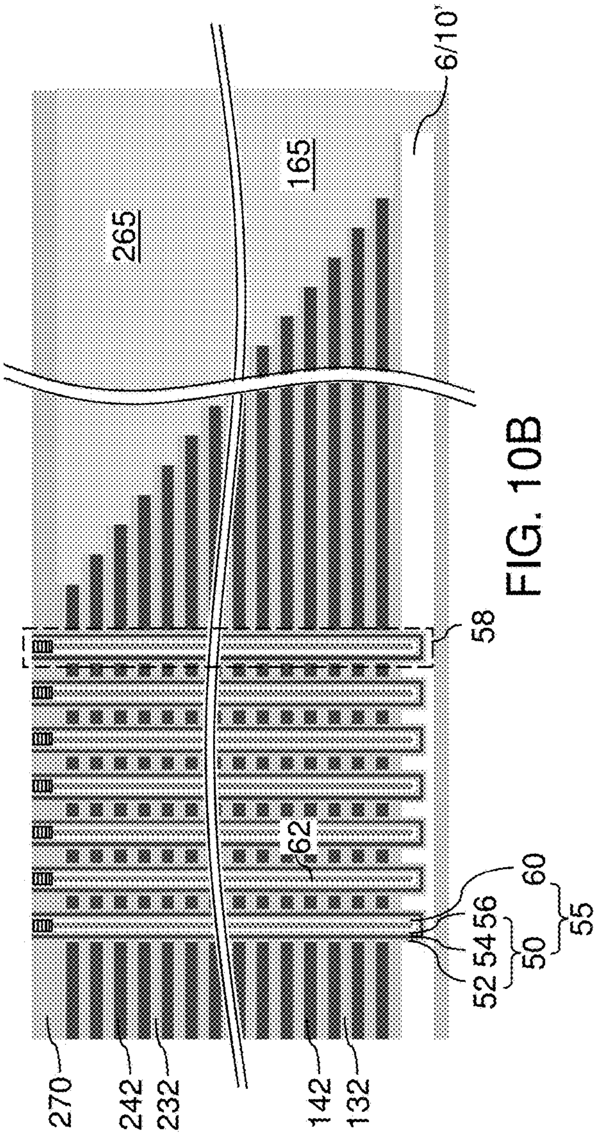
FIG. 10B is a vertical cross-sectional view of a memory array region and a contact region of the first exemplary structure of FIG. 10A.
Figure 10C:
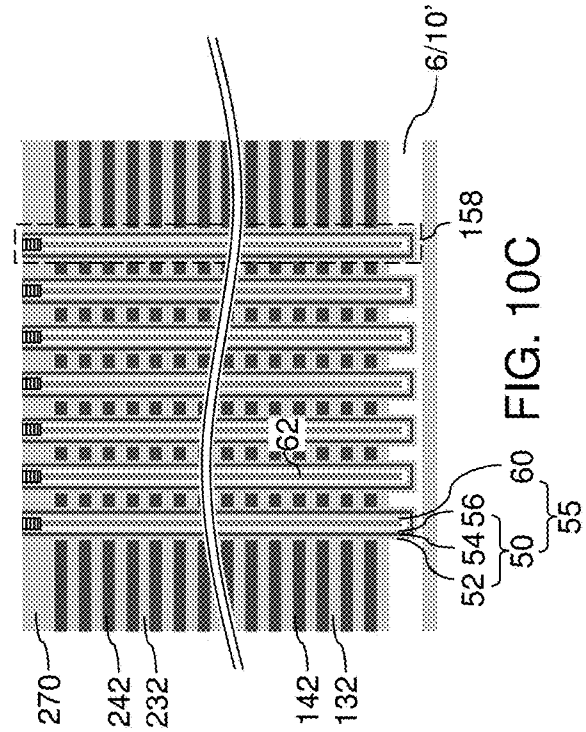
FIG. 10C is a vertical cross-sectional view of a capacitor region of the first exemplary structure of FIG. 10A.

Referring to FIG. 9C, in case the cavity 49' in each memory opening is not completely filled by the semiconductor channel material layer 60L, a dielectric core layer can be deposited in the cavity 49' to fill any remaining portion of the cavity 49' within each memory opening. The dielectric core layer includes a dielectric material such as silicon oxide or organosilicate glass. The dielectric core layer can be deposited by a conformal deposition method such as low pressure chemical vapor deposition (LPCVD), or by a self-planarizing deposition process such as spin coating. The horizontal portion of the dielectric core layer overlying the second insulating cap layer 270 can be removed, for example, by a recess etch. The recess etch continues until top surfaces of the remaining portions of the dielectric core layer are recessed to a height between the top surface of the second insulating cap layer 270 and the bottom surface of the second insulating cap layer 270. Each remaining portion of the dielectric core layer constitutes a dielectric core 62.

Referring to FIGS. 9D and 10A-10C, a doped semiconductor material having a doping of the second conductivity type can be deposited in cavities overlying the dielectric cores 62. The doped semiconductor material has a doping of the opposite conductivity type of the doping of the semiconductor channel material layer 60L. If the semiconductor channel material layer 60L is p-doped, the doped semiconductor material has an n-type doping, and vice versa. Portions of the deposited doped semiconductor material, the semiconductor channel material layer 60L, the continuous tunneling dielectric layer 56L, the continuous charge storage layer 54L, and the continuous blocking dielectric layer 52L that overlie the horizontal plane including the top surface of the second insulating cap layer 270 can be removed by a planarization process such as a chemical mechanical planarization (CMP) process.

Each remaining portion of the doped semiconductor material in the memory openings 49, the support openings 19, and the capacitor openings constitutes a drain region 63. The dopant concentration in the drain regions 63 can be in a range from $5.0\times10^{19}/cm^3$ to $2.0\times10^{21}/cm^3$, although lesser and greater dopant concentrations can also be used. The doped semiconductor material can be, for example, doped polysilicon.

Each remaining portion of the semiconductor channel material layer 60L in the memory openings 49, the support openings 19, and the capacitor openings constitutes a vertical semiconductor channel 60 through which electrical current can flow when a vertical NAND device including the vertical semiconductor channel 60 is turned on.

Each remaining portion of the continuous blocking dielectric layer 52L in the memory openings 49, the support openings 19, and the capacitor openings constitutes a blocking dielectric layer 52. Each remaining portion of the continuous charge storage layer 54L in the memory openings 49, the support openings 19, and the capacitor openings constitutes a charge storage layer 54. Each remaining portion of the continuous tunneling dielectric layer 56L in the memory openings 49, the support openings 19, and the capacitor openings constitutes a tunneling dielectric layer 56.

Each stack of a blocking dielectric layer 52, a charge storage layer 54, and a tunneling dielectric layer 56 within the memory openings 49 constitutes a dielectric layer stack 50, which is a memory film 50M, which can store electrical charges with a macroscopic retention time. Each stack of a blocking dielectric layer 52, a charge storage layer 54, and a tunneling dielectric layer 56 within the capacitor openings constitutes a dielectric stack 50, which is a node dielectric of a capacitor structure to be subsequently completed. Each stack of a blocking dielectric layer 52, a charge storage layer 54, and a tunneling dielectric layer 56 within the support openings constitutes a dielectric stack 50, which is a dummy memory film that a dummy component, i.e., a component that is not used as an active component of an electrical device. As used herein, a macroscopic retention time refers to a retention time suitable for operation of a memory device as a permanent memory device such as a retention time in excess of 24 hours. A tunneling dielectric layer 56 is surrounded by a charge storage layer 54, and laterally surrounds a vertical semiconductor channel 60. In some embodiments, a blocking dielectric layer 52 may not be present in the memory film 50M at this step, and a blocking dielectric layer may be subsequently formed after formation of backside recesses. All dielectric layer stacks 50 within the memory openings 49, the capacitor openings, and the support openings 19 can be formed simultaneously using a same set of deposition steps and patterning steps.

Each combination of a memory film 50M and a vertical semiconductor channel 60 (which is a vertical semiconductor channel) within a memory opening 49 constitutes a memory stack structure 55. The memory stack structure 55 is a combination of a vertical semiconductor channel 60, a tunneling dielectric layer 56, a plurality of memory elements comprising portions of the charge storage layer 54, and an optional blocking dielectric layer 52. Each combination of a memory stack structure 55, a dielectric core 62, and a drain region 63 within a memory opening 49 constitutes a memory opening fill structure 58. Each combination of a memory stack structure 55, a dielectric core 62, and a drain region 63 within a support opening 19 constitutes a support pillar structure 20. Each combination of a memory stack structure 55, a dielectric core 62, and a drain region 63 within a capacitor opening constitutes a capacitor pillar structure 158.

The memory stack structures 55 are formed in the memory openings 49 simultaneously with formation of the capacitor pillar structures. Each of the memory stack structures 55 comprises a respective memory film 50M and a respective vertical semiconductor channel 60. The capacitor pillar structures are formed in the capacitor openings. Each of the capacitor pillar structures comprises a node dielectric (i.e., a dielectric layer stack 50 located in a capacitor opening) and a semiconductor material portion (i.e., a vertical semiconductor channel 60) that is laterally surrounded by the node dielectric.

The in-process source-level material layers 10', the first-tier structure (132, 142, 170, 165), the second-tier structure (232, 242, 270, 265, 72), the inter-tier dielectric layer 180, and the memory opening fill structures 58 collectively constitute a memory-level assembly.

Figure 11:
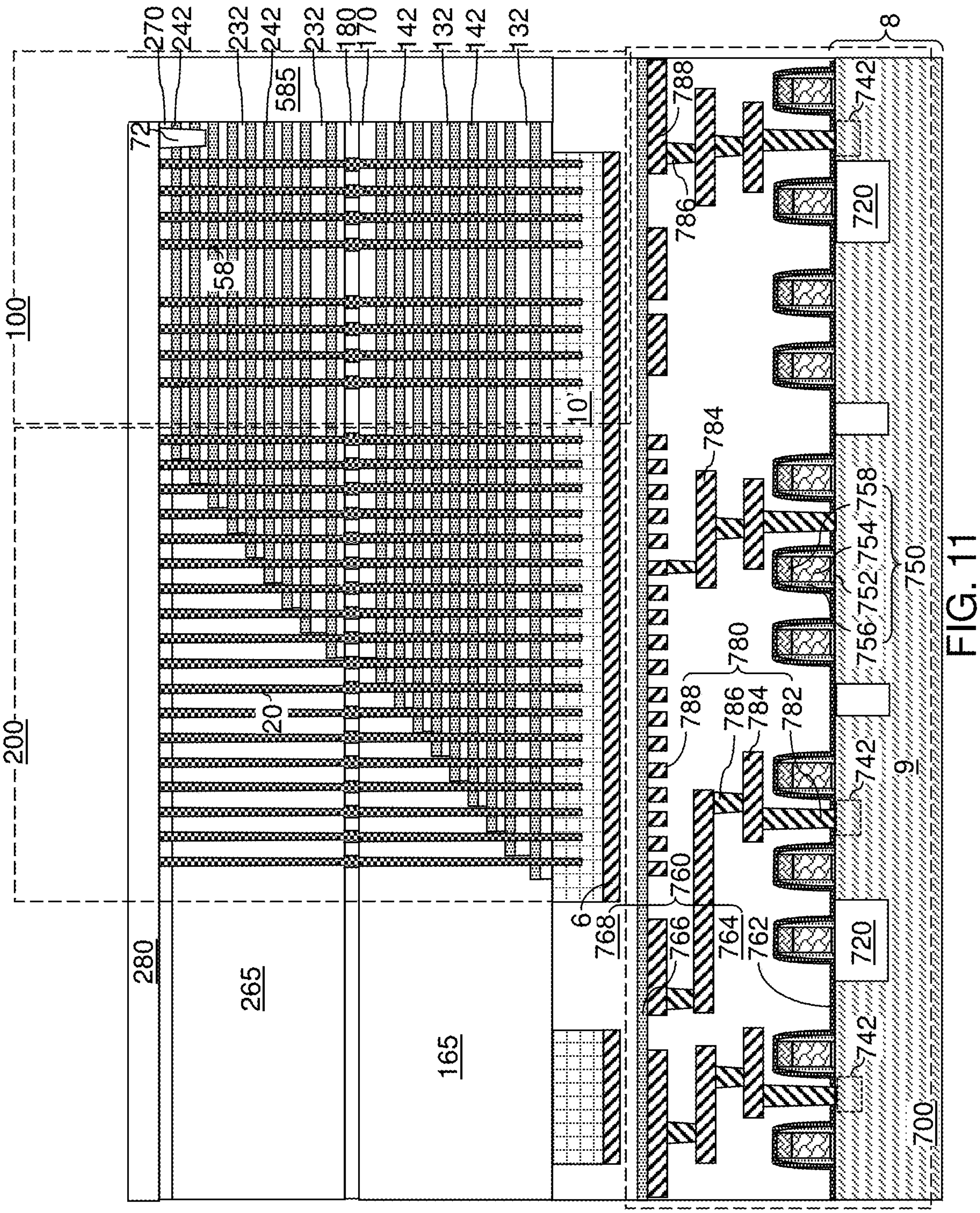
FIG. 11 is a vertical cross-sectional view of the first exemplary structure after formation of vertical interconnection region cavities according to an embodiment of the present disclosure.

Referring to FIG. 11, a first contact level dielectric layer 280 can be formed over the second-tier structure (232, 242, 270, 265, 72). The first contact level dielectric layer 280 includes a dielectric material such as silicon oxide, and can be formed by a conformal or non-conformal deposition process. For example, the first contact level dielectric layer 280 can include undoped silicate glass and can have a thickness in a range from 100 nm to 600 nm, although lesser and greater thicknesses can also be used.

A photoresist layer (not shown) can be applied over the first contact level dielectric layer 280, and can be lithographically patterned to form discrete openings within the area of the memory array region 100 in which memory opening fill structures 58 are not present. An anisotropic etch can be performed to form vertical interconnection region cavities 585 having substantially vertical sidewalls that extend through the first contact level dielectric layer 280, the second-tier alternating stack (232, 242, 270, 265, 72), and the first-tier alternating stack (132, 142, 170, 165) can be formed underneath the openings in the photoresist layer. A top surface of the at least one second dielectric layer 768 can be physically exposed at the bottom of each vertical interconnection region cavity 585. The photoresist layer can be removed, for example, by ashing.

Figure 12:
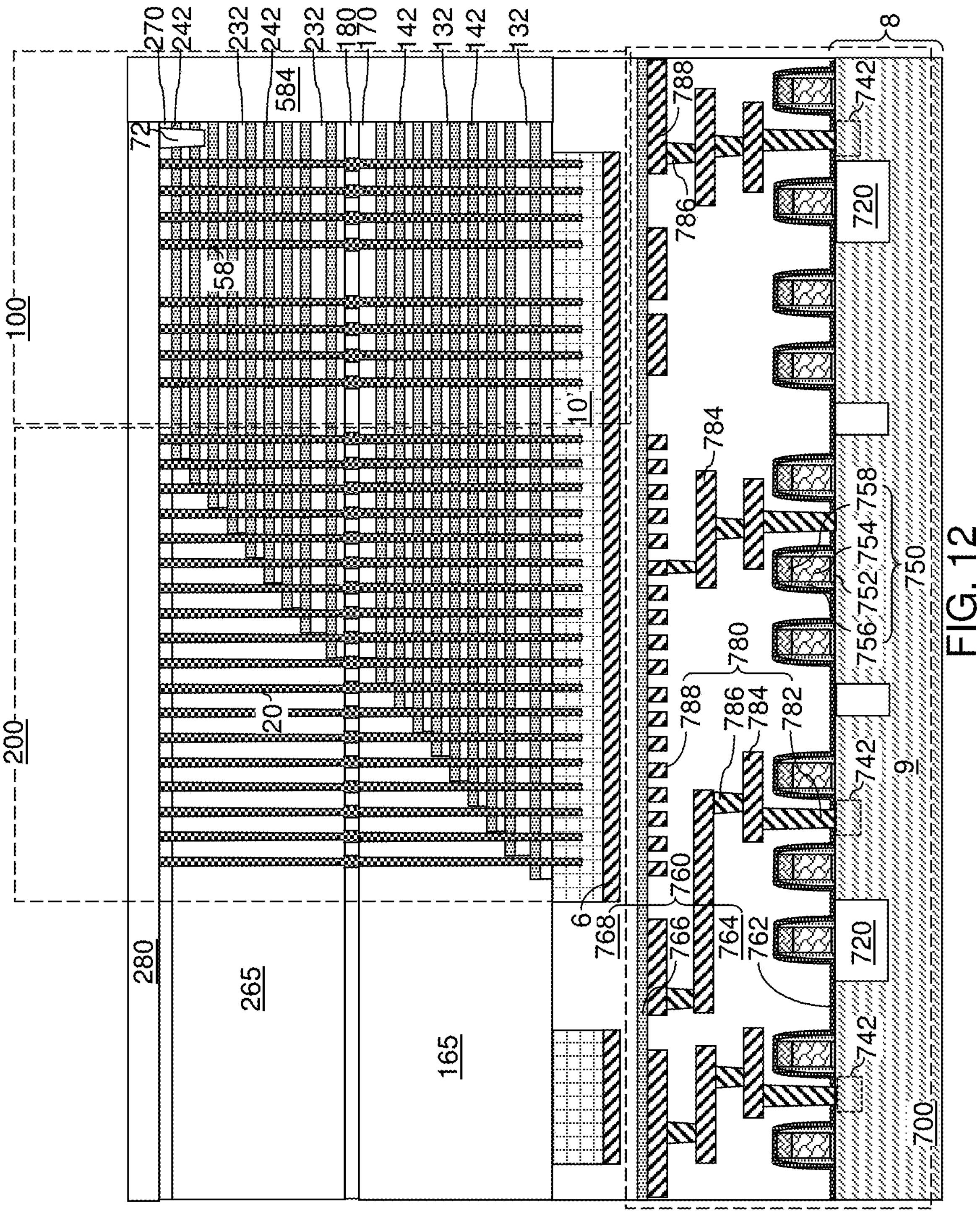
FIG. 12 is a vertical cross-sectional view of the first exemplary structure after formation of dielectric fill material portions according to an embodiment of the present disclosure.
Figure 13A:
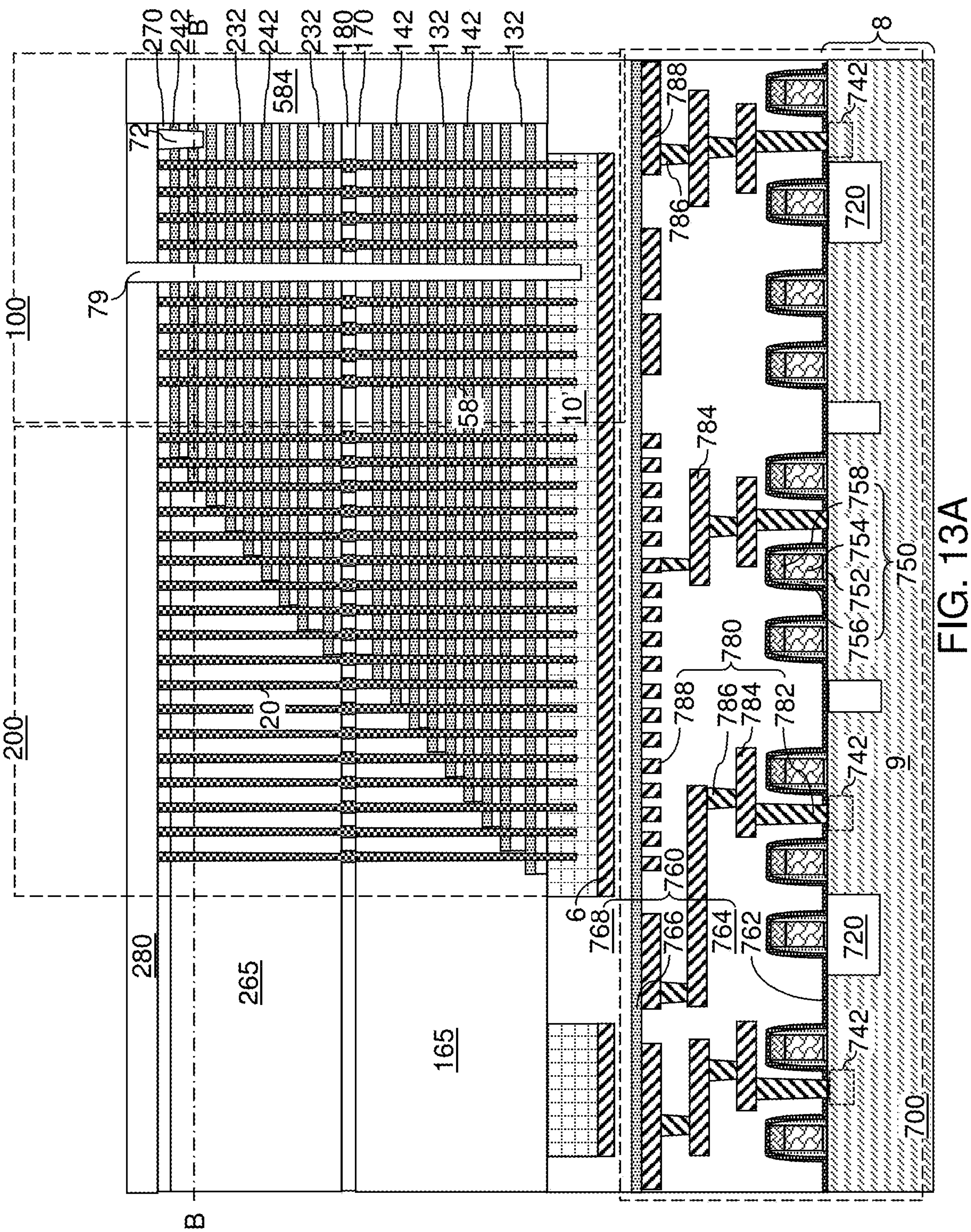
FIG. 13A is a vertical cross-sectional view of the first exemplary structure after formation of a first contact level dielectric layer and backside trenches according to an embodiment of the present disclosure.
Figure 13B:
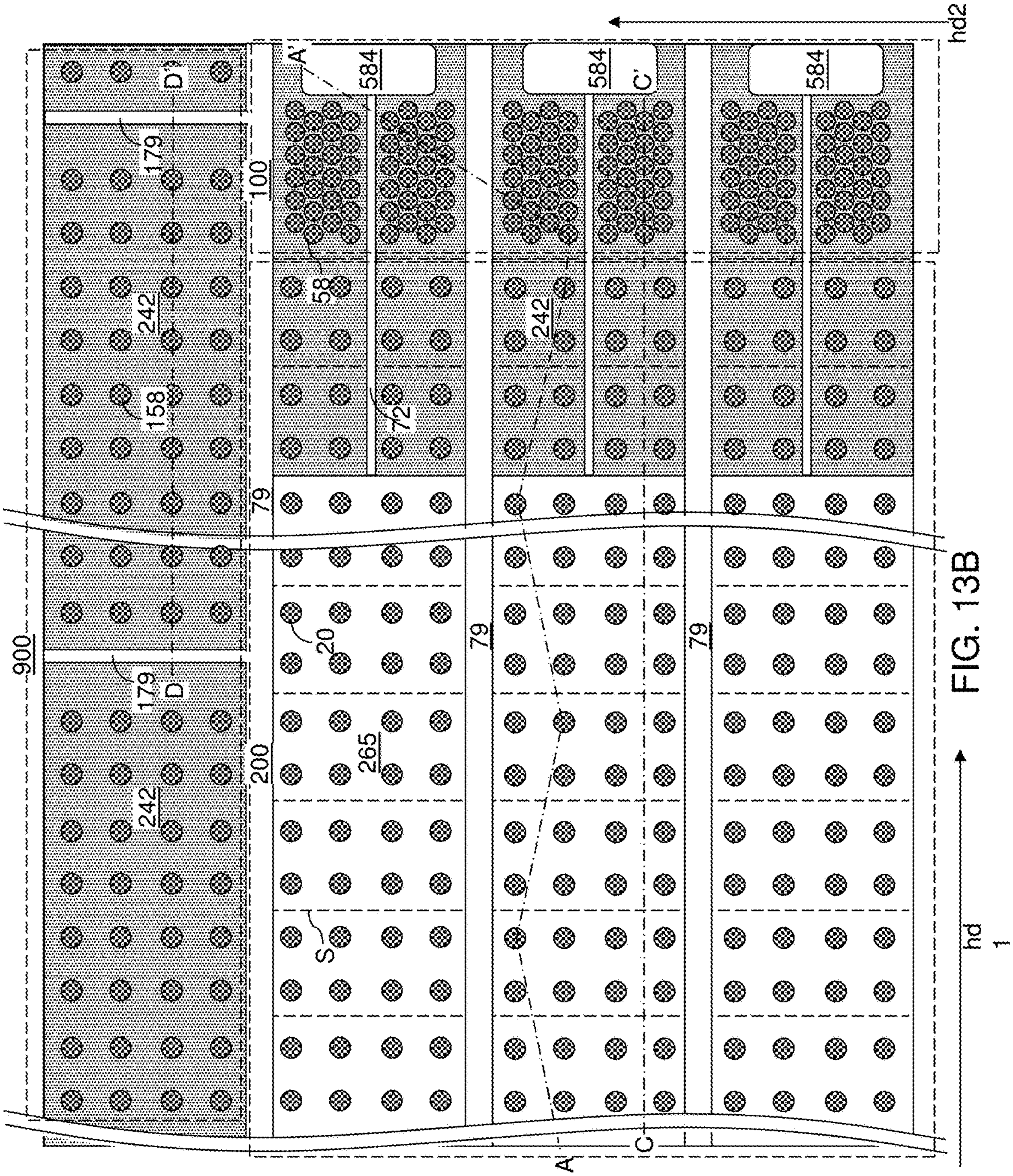
FIG. 13B is a horizontal cross-sectional of the first exemplary structure along the horizontal plane B-B' of FIG. 13A. The hinged vertical plane A-A' corresponds to the plane of the vertical cross-sectional view of FIG. 13A.
Figure 13C:
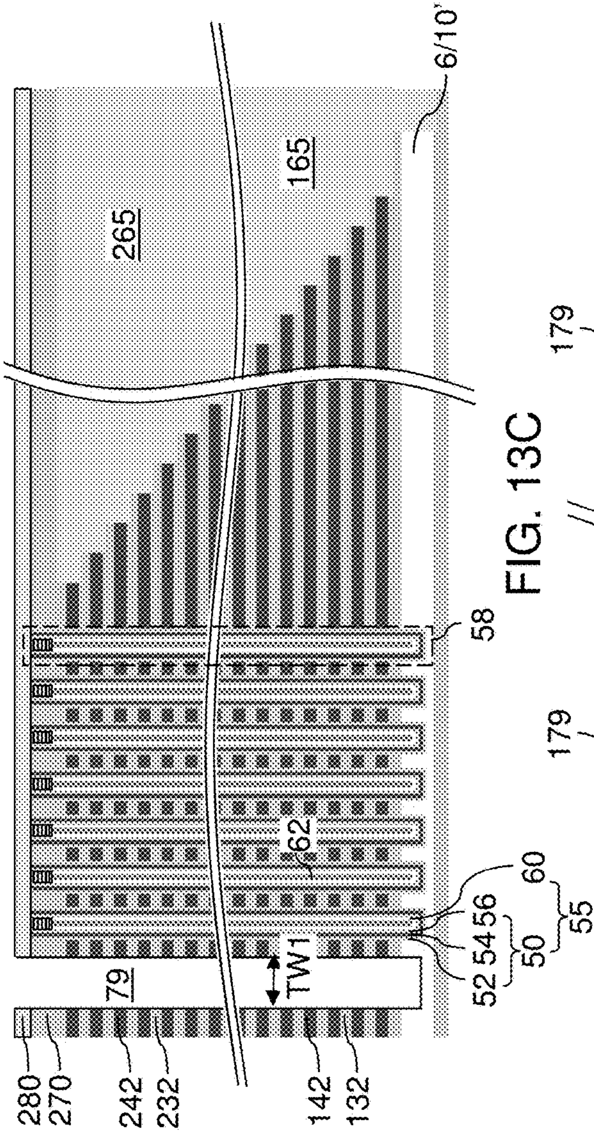
FIG. 13C is a vertical cross-sectional view of a memory array region and a contact region of the first exemplary structure along the vertical plane C-C' of FIG. 13B.
Figure 13D:
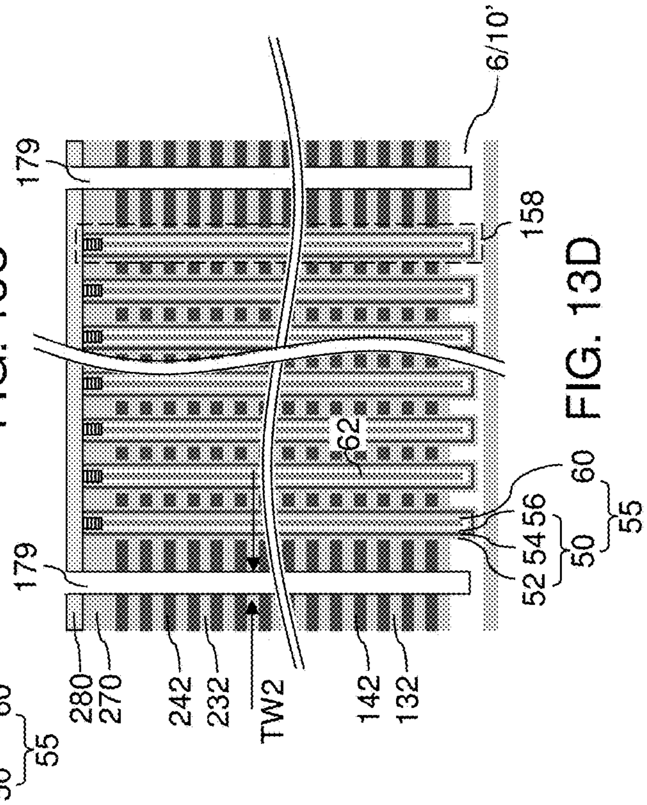
FIG. 13D is a vertical cross-sectional view of a capacitor region of the first exemplary structure along the vertical plane D-D' of FIG. 13B.

Referring to FIG. 12, a dielectric material such as silicon oxide can be deposited in the vertical interconnection region cavities 585 by a conformal deposition process (such as low pressure chemical vapor deposition) or a self-planarizing deposition process (such as spin coating). Excess portions of the deposited dielectric material can be removed from above the top surface of the first contact level dielectric layer 280 by a planarization process. Remaining portions of the dielectric material in the vertical interconnection region cavities 585 constitute interconnection region dielectric fill material portions 584.

Referring to FIGS. 13A-13D, a photoresist layer (not shown) can be applied over the first contact level dielectric layer 280 and can be lithographically patterned to form elongated openings between clusters of memory opening fill structures 58 and between clusters of capacitor pillar structures 158. Backside trenches (79, 179) can be formed by transferring the pattern in the photoresist layer through the first contact level dielectric layer 280, the second-tier alternating stack (232, 242, 270, 265, 72), and the first-tier alternating stack (132, 142, 170, 165), and into the in-process source-level material layers 10'. Portions of the first contact level dielectric layer 280, the second-tier alternating stack (232, 242, 270, 265, 72), the first-tier alternating stack (132, 142, 170, 165), and the in-process source-level material layers 10' that underlie the openings in the photoresist layer can be removed to form the backside trenches (79, 179).

The backside trenches (79, 179) can include first backside trenches 79 that are formed between clusters of memory stack structures 55 and laterally extend along the first horizontal direction hd1. The clusters of the memory stack structures 58 can be laterally spaced apart along the second horizontal direction hd2 by the first backside trenches 79. The first backside trenches 79 can have a first trench width TW1. The backside trenches (79, 179) can include second backside trenches 179 that are formed between clusters of capacitor pillar structures 158. The second backside trenches 179 can laterally extend along a horizontal direction that may be the same as, or different from, the first horizontal direction hd1. For example, the second backside trenches 179 can laterally extend along the second horizontal direction hd2. The second backside trenches 179 can have a second trench width TW2, which is less than the first trench width TW1. In one embodiment, the second trench width TW2 can be less than twice the thickness of at least one conductive material to be subsequently deposited in the backside trenches (79, 179) to facilitate complete filling of the second backside trenches 179 by the at least one conductive material. The first trench width TW1 can be greater than twice the thickness of at least one conductive material to be subsequently deposited in the backside trenches (79, 179) to prevent complete filling of the first backside trenches 79 by the at least one conductive material.

Figure 14:
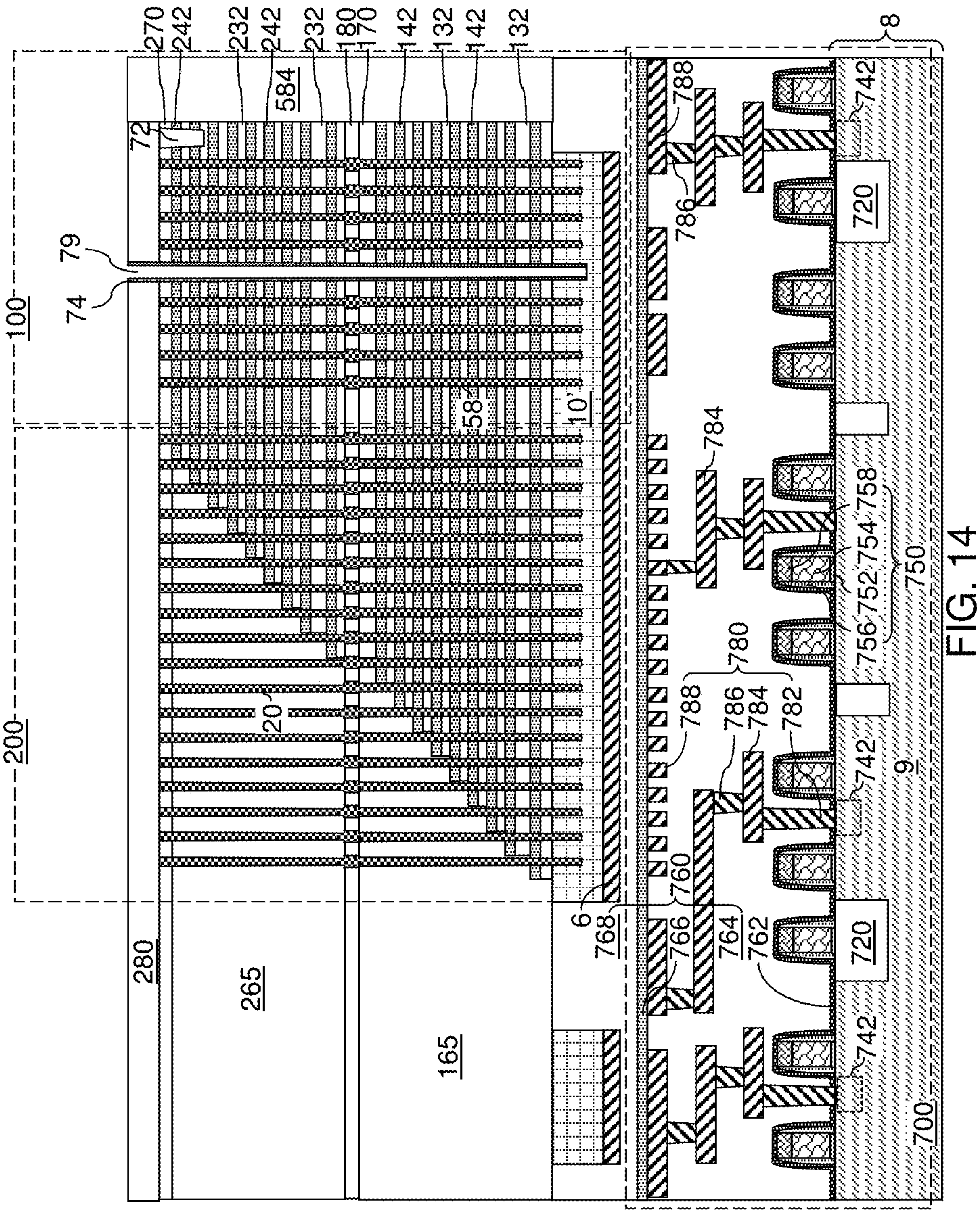
FIG. 14 is a vertical cross-sectional view of the first exemplary structure after formation of backside trench spacers according to an embodiment of the present disclosure.
Figure 15A:
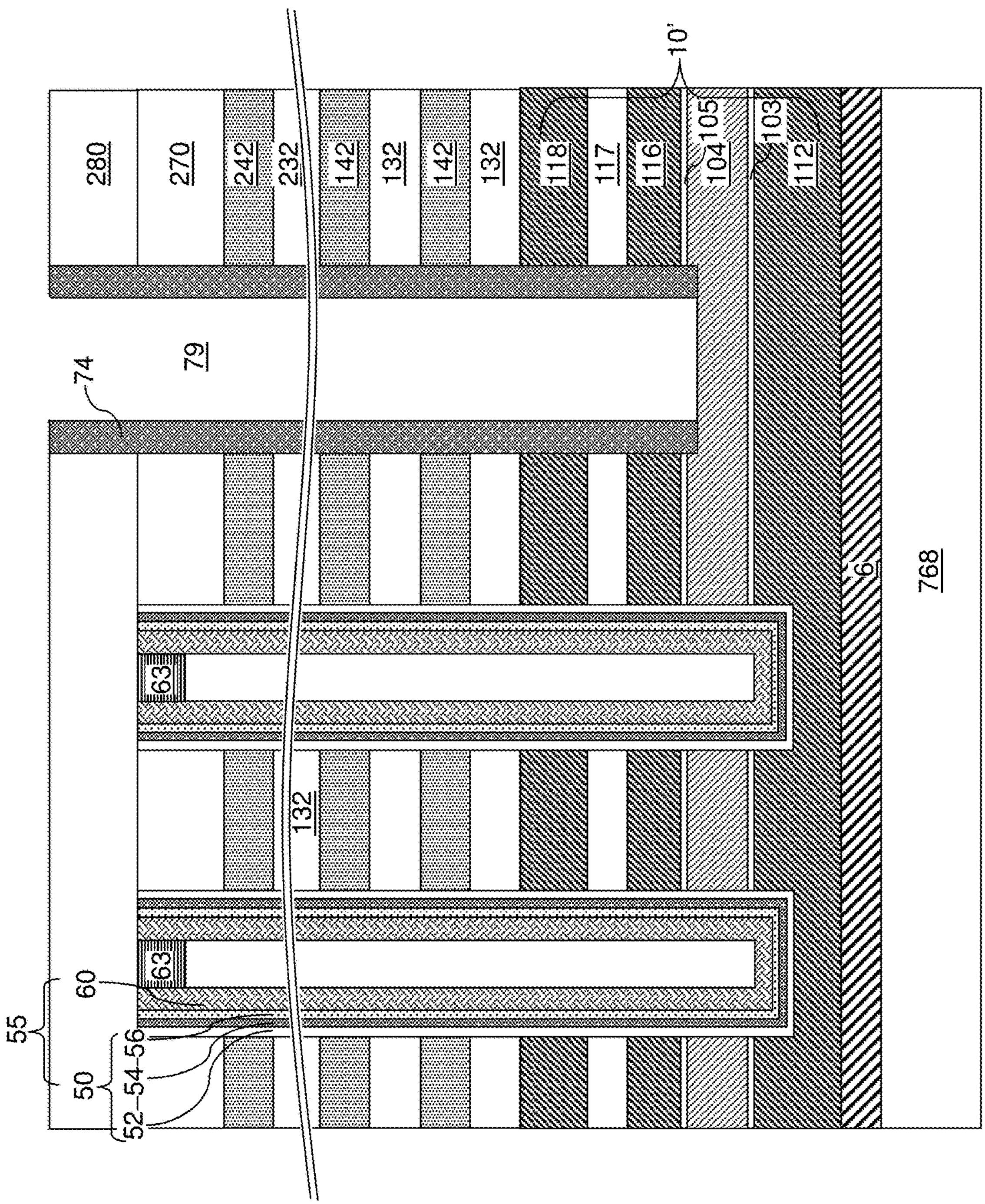
FIGS. 15A-15E illustrate sequential vertical cross-sectional views of memory opening fill structures and a backside trench during formation of source-level material layers according to an embodiment of the present disclosure.

Referring to FIGS. 14 and 15A, a backside trench spacer 74 can be formed on sidewalls of each backside trench (79, 179). For example, a conformal spacer material layer can be deposited in the backside trenches (79, 179) and over the first contact level dielectric layer 280, and can be anisotropically etched to form the backside trench spacers 74. The backside trench spacers 74 include a material that is different from the material of the source-level sacrificial layer 104. For example, the backside trench spacers 74 can include silicon nitride. A backside cavity (i.e., a void within a respective backside trench) is present within each backside trench (79, 179).

Figure 15B:
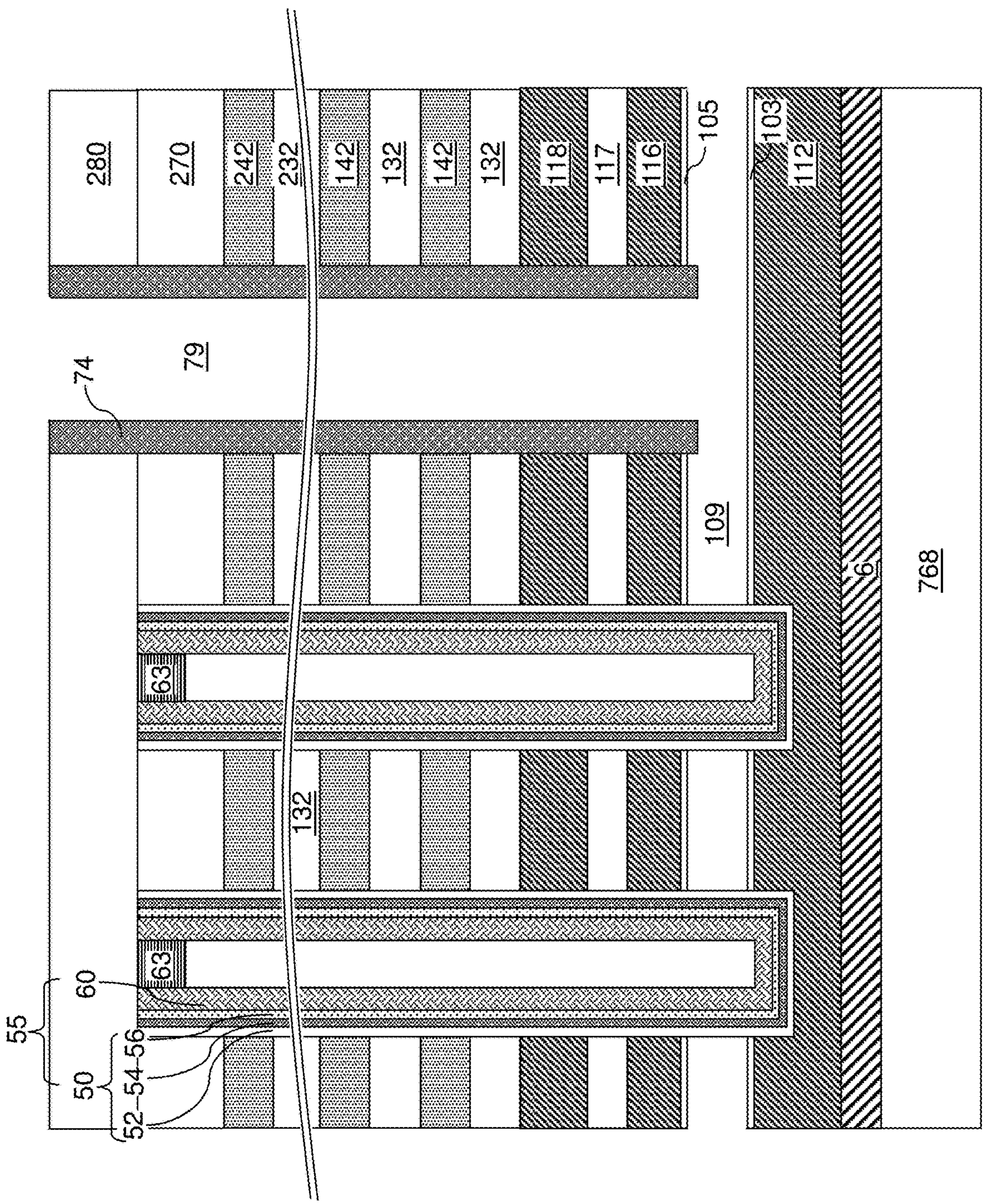

Referring to FIG. 15B, an etchant that etches the material of the source-level sacrificial layer 104 selective to the materials of the first-tier alternating stack (132, 142), the second-tier alternating stack (232, 242), the first and second insulating cap layers (170, 270), the first contact level dielectric layer 280, the upper sacrificial liner 105, and the lower sacrificial liner 103 can be introduced into the backside trenches in an isotropic etch process. For example, if the source-level sacrificial layer 104 includes undoped amorphous silicon or an undoped amorphous silicon-germanium alloy, the backside trench spacers 74 include silicon nitride, and the upper and lower sacrificial liners (105, 103) include silicon oxide, a wet etch process using hot trimethyl-2 hydroxyethyl ammonium hydroxide ("hot TMY") or tetramethyl ammonium hydroxide (TMAH) can be used to remove the source-level sacrificial layer 104 selective to the backside trench spacers 74 and the upper and lower sacrificial liners (105, 103). A source cavity 109 is formed in the volume from which the source-level sacrificial layer 104 is removed.

Wet etch chemicals such as hot TMY and TMAH are selective to doped semiconductor materials such as the p-doped semiconductor material and/or the n-doped semiconductor material of the upper source-level semiconductor layer 116 and the lower source-level semiconductor layer 112. Thus, use of selective wet etch chemicals, such as hot TMY and TMAH, for the wet etch process that forms the source cavity 109 provides a large process window against etch depth variation during formation of the backside trenches 79. Specifically, even if sidewalls of the upper source-level semiconductor layer 116 are physically exposed or even if a surface of the lower source-level semiconductor layer 112 is physically exposed upon formation of the source cavity 109 and/or the backside trench spacers 74, collateral etching of the upper source-level semiconductor layer 116 and/or the lower source-level semiconductor layer 112 is minimal, and the structural change to the exemplary structure caused by accidental physical exposure of the surfaces of the upper source-level semiconductor layer 116 and/or the lower source-level semiconductor layer 112 during manufacturing steps do not result in device failures. Each of the memory opening fill structures 58 is physically exposed to the source cavity 109. Specifically, each of the memory opening fill structures 58 includes a sidewall and a bottom surface that are physically exposed to the source cavity 109.

Figure 15C:
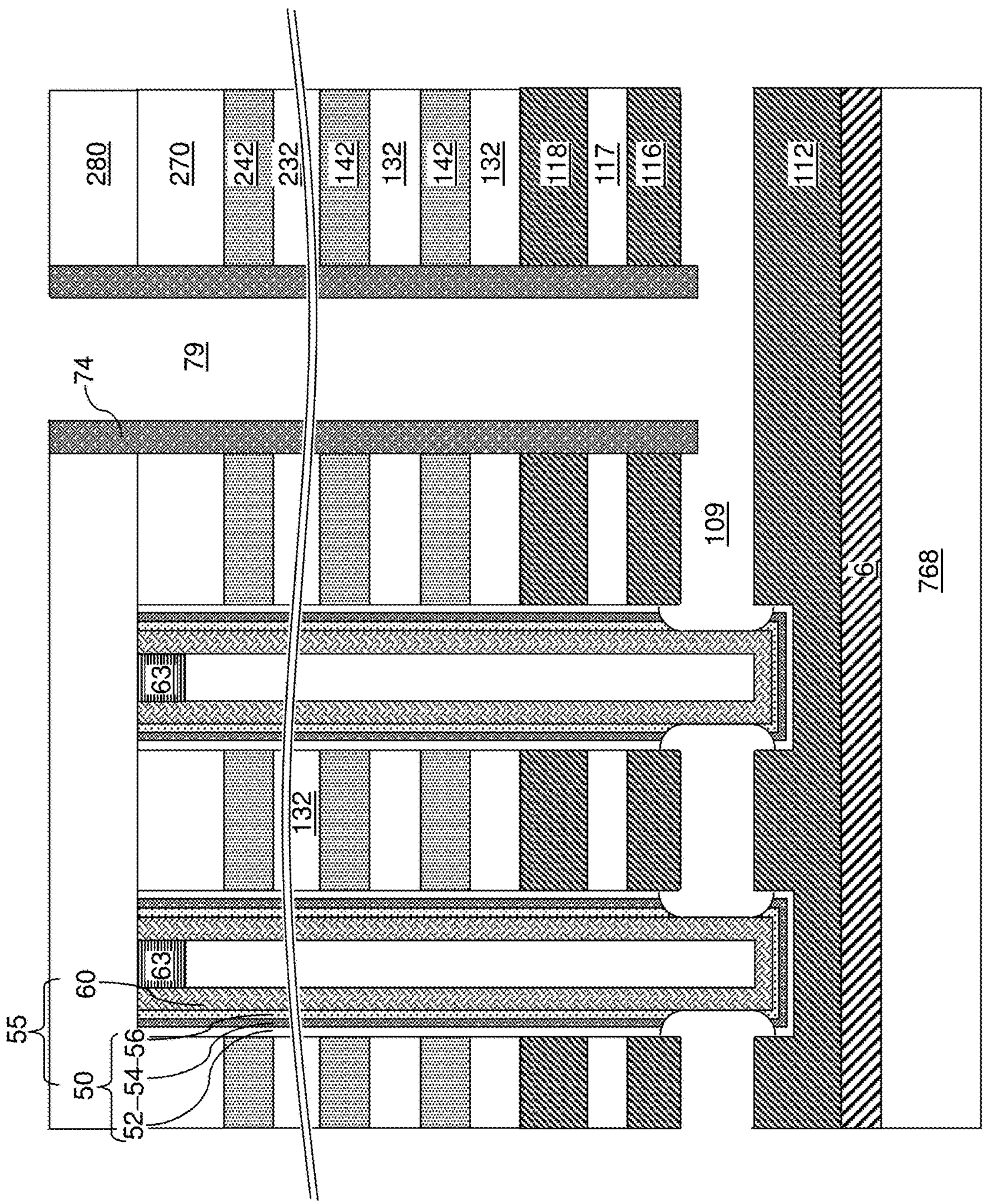

Referring to FIG. 15C, a sequence of isotropic etchants, such as wet etchants, can be applied to the physically exposed portions of the dielectric layer stacks 50 to sequentially etch the various component layers of the dielectric layer stacks 50 from outside to inside, and to physically expose cylindrical surfaces of the vertical semiconductor channels 60 at the level of the source cavity 109. The upper and lower sacrificial liners (105, 103) can be collaterally etched during removal of the portions of the dielectric layer stacks 50 located at the level of the source cavity 109. The source cavity 109 can be expanded in volume by removal of the portions of the dielectric layer stacks 50 at the level of the source cavity 109 and the upper and lower sacrificial liners (105, 103). A top surface of the lower source-level semiconductor layer 112 and a bottom surface of the upper source-level semiconductor layer 116 can be physically exposed to the source cavity 109. The source cavity 109 is formed by isotropically etching the source-level sacrificial layer 104 and a bottom portion of each of the dielectric layer stacks 50 selective to at least one source-level semiconductor layer (such as the lower source-level semiconductor layer 112 and the upper source-level semiconductor layer 116) and the vertical semiconductor channels 60.

Figure 15D:
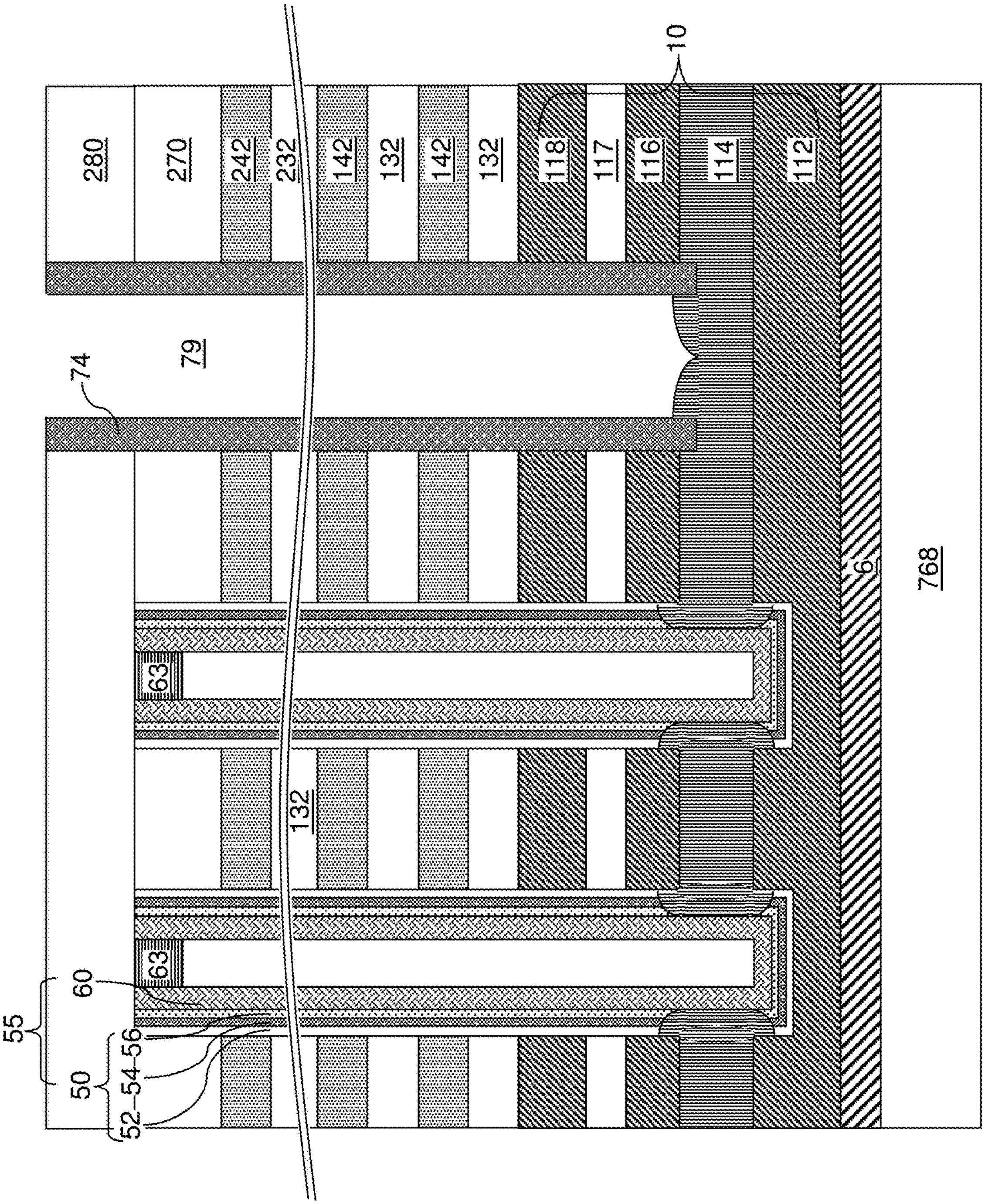
Figure 15E:
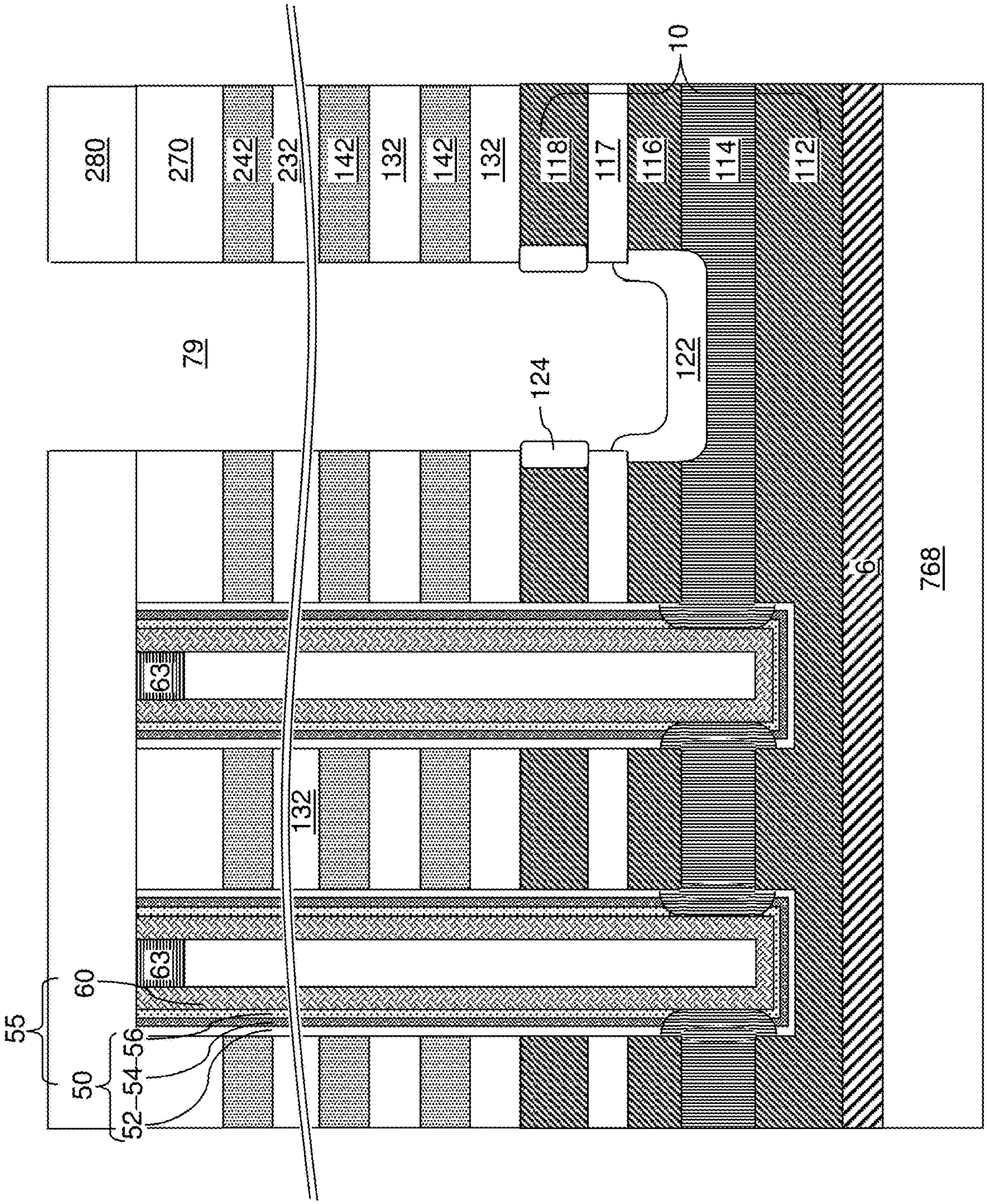
Figure 16A:
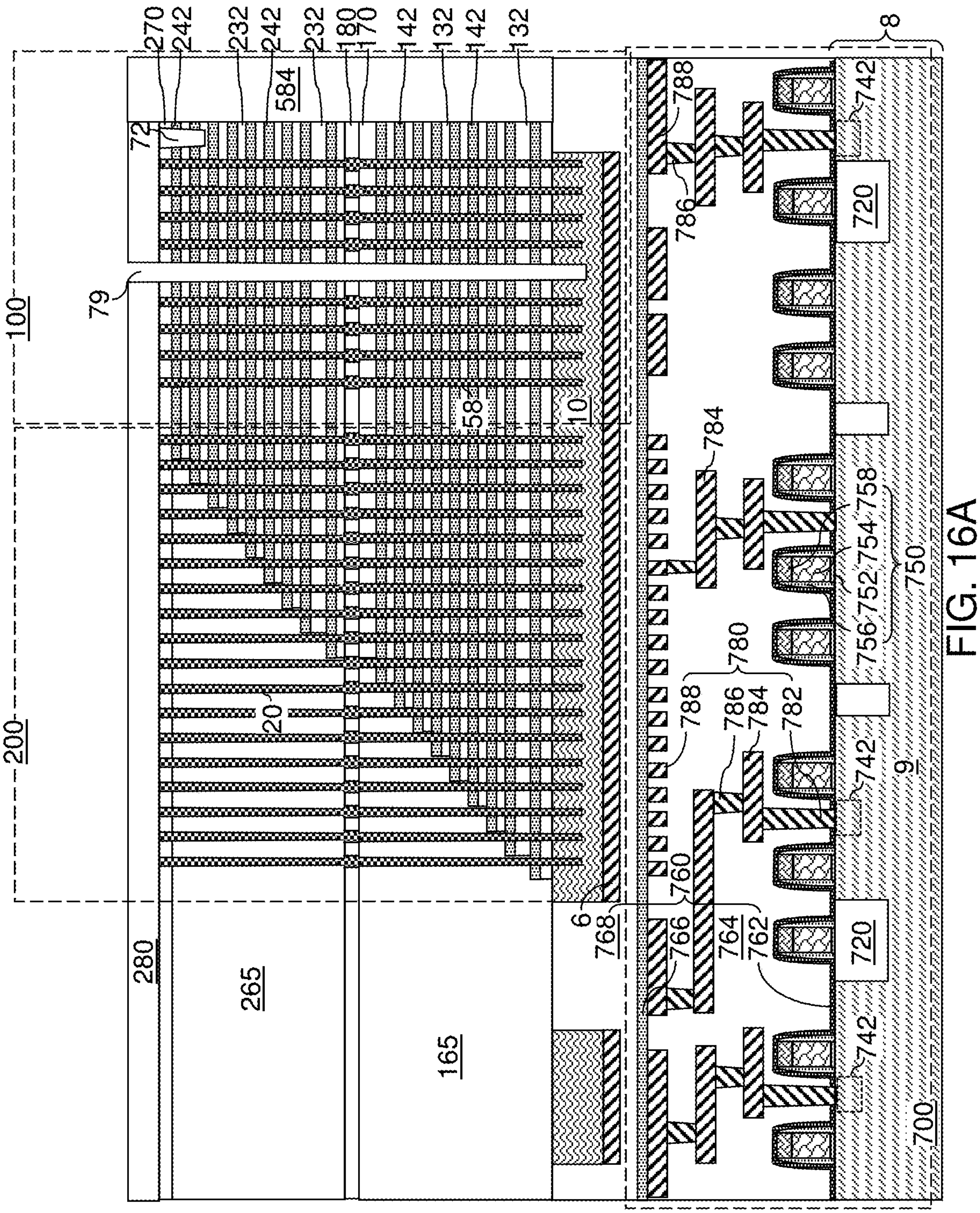
FIG. 16A is a vertical cross-sectional view of the first exemplary structure after formation of source-level material layers according to an embodiment of the present disclosure.
Figure 16B:
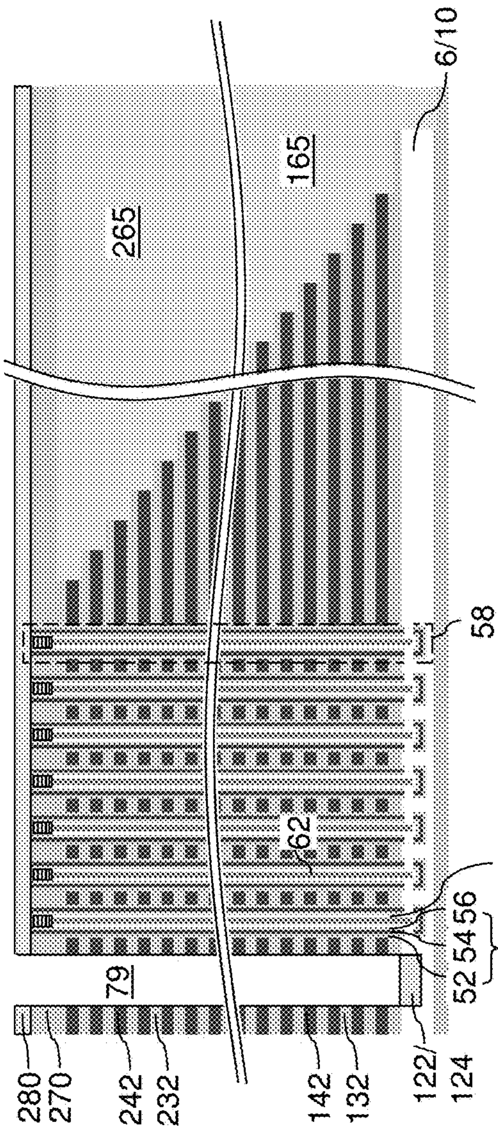
FIG. 16B is a vertical cross-sectional view of a memory array region and a contact region of the first exemplary structure of FIG. 16A.
Figure 16C:
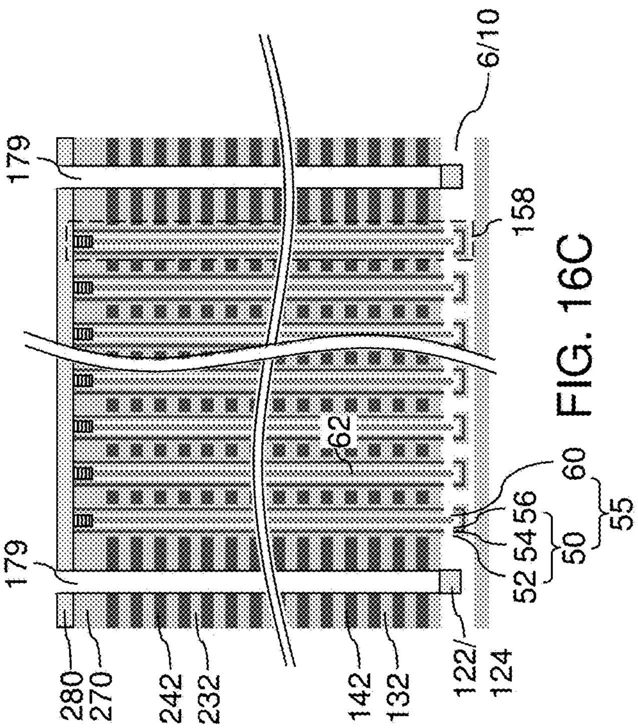
FIG. 16C is a vertical cross-sectional view of a capacitor region of the first exemplary structure of FIG. 16A.

Referring to FIG. 15D, a doped semiconductor material having a doping of the second conductivity type can be deposited by a selective semiconductor deposition process. A semiconductor precursor gas, an etchant, and a dopant precursor gas can be flowed concurrently into a process chamber including the first exemplary structure during the selective semiconductor deposition process. For example, if the second conductivity type is n-type, a semiconductor precursor gas such as silane, disilane, or dichlorosilane, an etchant gas such as hydrogen chloride, and a dopant precursor gas such as phosphine, arsine, or stibine. Each deposited doped semiconductor material portion forms a respective source-level conductive material portion 114, which can contact sidewalls of a respective set of vertical semiconductor channels 60. The duration of the selective semiconductor deposition process can be selected such that each source cavity is filled with a respective source-level conductive material portion 114. In one embodiment, each source-level conductive material portion 114 can contact bottom end portions of inner sidewalls of a respective backside trench spacer 74. Thus, the source-level conductive material portions 114 can be formed by selectively depositing a doped semiconductor material from semiconductor surfaces around the source cavity 109. In one embodiment, the doped semiconductor material can include doped polysilicon.

Each layer stack including the lower source layer 112, the source-level conductive material portion 114, and the upper source layer 116 constitutes a buried source layer (112, 114, 116), which function as a common source region that is connected each of the vertical semiconductor channels 60 and has a doping of the second conductivity type. The average dopant concentration in the buried source layer (112, 114, 116) can be in a range from $5.0\times10^{19}/cm^3$ to $2.0\times10^{21}/cm^3$, although lesser and greater dopant concentrations can also be used. The set of layers including the buried source layer (112, 114, 116), the source-level insulating layer 117, and the optional source-select-level conductive layer 118 constitutes source-level material layers 10, which replaces the in-process source-level material layers 10'.

Each patterned portion of the source-level sacrificial layer 104 can be replaced with a respective source-level conductive material portion 114. The source-level conductive material portions 114 in the capacitor region 100 comprise conductive structures that electrically connects a respective set of semiconductor material portions (i.e., the vertical semiconductor channels 60) of the capacitor pillar structures. Each combination of a conductive structure (illustrated as a source-level conductive material portion 114) and a set of semiconductor material portions (illustrated as vertical semiconductor channels 60) electrically connected thereto constitutes a first electrode layer of a capacitor to be subsequently completed. The source-level conductive material portions 114 in the memory array region 100 comprise a source contact layer contacting bottom portions of the vertical semiconductor channels 60 of the memory stack structures 55.

Referring to FIGS. 15E and 16A-16C, the backside trench spacers 74 can be removed selective to the insulating layers (132, 232), the first and second insulating cap layers (170, 270), the first contact level dielectric layer 280, and the source-level conductive material portion 114 using an isotropic etch process. For example, if the backside trench spacers 74 include silicon nitride, a wet etch process using hot phosphoric acid can be performed to remove the backside trench spacers 74. In one embodiment, the isotropic etch process that removes the backside trench spacers 74 can be combined with a subsequent isotropic etch process that etches the sacrificial material layers (142, 242) selective to the insulating layers (132, 232), the first and second insulating cap layers (170, 270), the first contact level dielectric layer 280, and the source-level conductive material portion 114.

An oxidation process can be performed to convert physically exposed surface portions of semiconductor materials into dielectric semiconductor oxide portions. For example, surfaces regions of the source-level conductive material portions 114 and the upper source-level material layer 116 can be converted into dielectric semiconductor oxide plates 122, and surface regions of the source-select-level conductive layer 118 can be converted into annular dielectric semiconductor oxide spacers 124.

Figure 17:
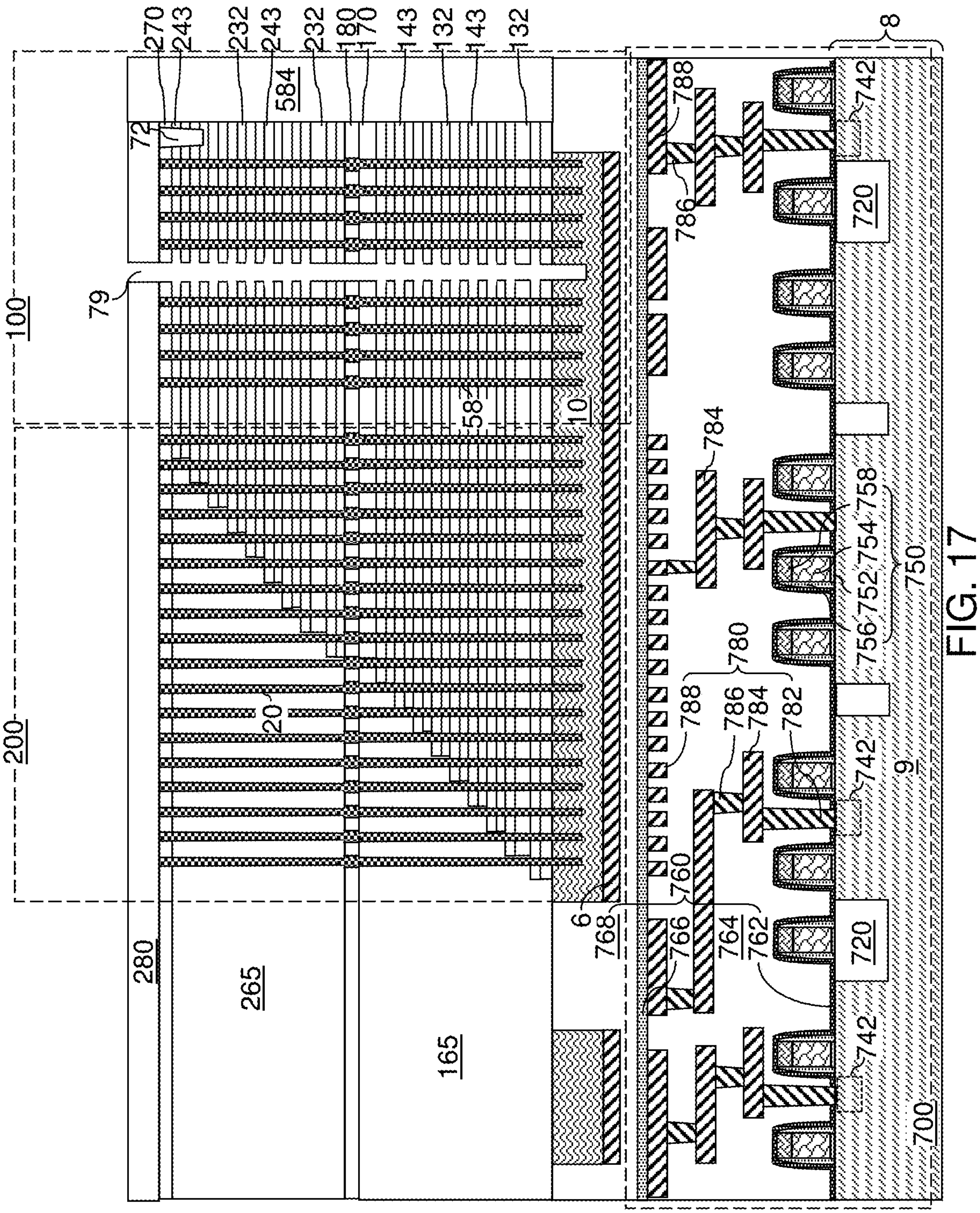
FIG. 17 is a vertical cross-sectional view of the first exemplary structure after formation of backside recesses according to an embodiment of the present disclosure.

Referring to FIG. 17, the sacrificial material layers (142, 242) are can be removed selective to the insulating layers (132, 232), the first and second insulating cap layers (170, 270), the first contact level dielectric layer 280, the interconnection region dielectric fill material portions 584, the dielectric semiconductor oxide plates 122, and the annular dielectric semiconductor oxide spacers 124. For example, an etchant that selectively etches the materials of the sacrificial material layers (142, 242) with respect to the materials of the insulating layers (132, 232), the first and second insulating cap layers (170, 270), the retro-stepped dielectric material portions (165, 265), and the material of the outermost layer of the dielectric layer stacks 50 can be introduced into the backside openings 79, for example, using an isotropic etch process. For example, the sacrificial material layers (142, 242) can include silicon nitride, the materials of the insulating layers (132, 232), the first and second insulating cap layers (170, 270), the retro-stepped dielectric material portions (165, 265), and the outermost layer of the dielectric layer stacks 50 can include silicon oxide materials.

The isotropic etch process can be a wet etch process using a wet etch solution, or can be a gas phase (dry) etch process in which the etchant is introduced in a vapor phase into the backside opening 79. For example, if the sacrificial material layers (142, 242) include silicon nitride, the etch process can be a wet etch process in which the exemplary structure is immersed within a wet etch tank including phosphoric acid, which etches silicon nitride selective to silicon oxide, silicon, and various other materials used in the art.

Backside recesses (143, 243) are formed in volumes from which the sacrificial material layers (142, 242) are removed. The backside recesses (143, 243) include first backside recesses 143 that are formed in volumes from which the first sacrificial material layers 142 are removed and second backside recesses 243 that are formed in volumes from which the second sacrificial material layers 242 are removed. Each of the backside recesses (143, 243) can be a laterally extending cavity having a lateral dimension that is greater than the vertical extent of the cavity. In other words, the lateral dimension of each of the backside recesses (143, 243) can be greater than the height of the respective backside recess (143, 243). A plurality of backside recesses (143, 243) can be formed in the volumes from which the material of the sacrificial material layers (142, 242) is removed. Each of the backside recesses (143, 243) can extend substantially parallel to the top surface of the substrate semiconductor layer 9. A backside recess (143, 243) can be vertically bounded by a top surface of an underlying insulating layer (132, 232) and a bottom surface of an overlying insulating layer (132, 232). In one embodiment, each of the backside recesses (143, 243) can have a uniform height throughout.

Figure 18A:
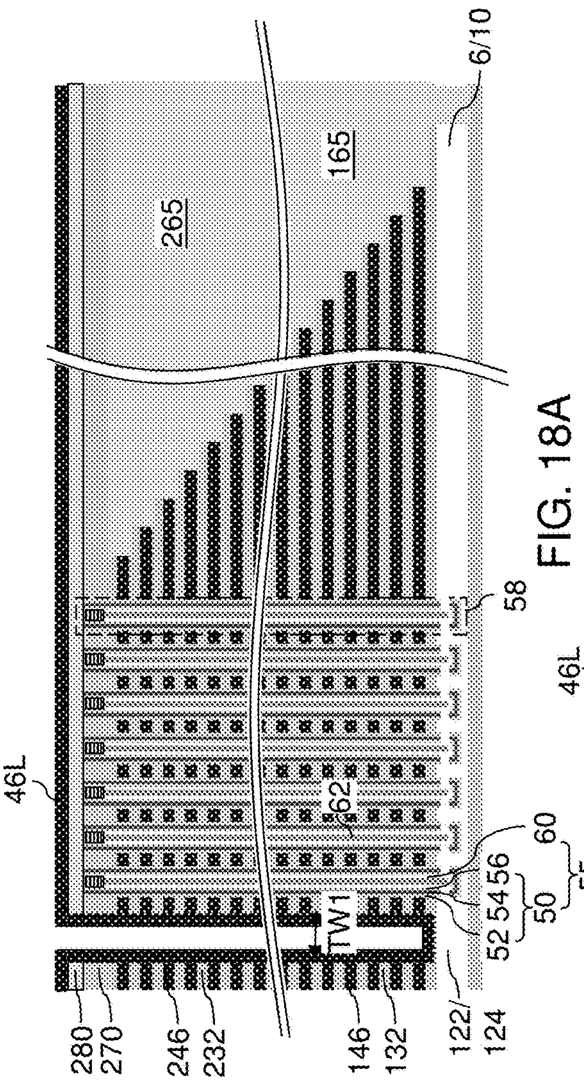
FIG. 18A is a vertical cross-sectional view of a memory array region and a contact region of the first exemplary structure after deposition of a conductive material in the backside recesses and the backside trenches according to an embodiment of the present disclosure.
Figure 18B:
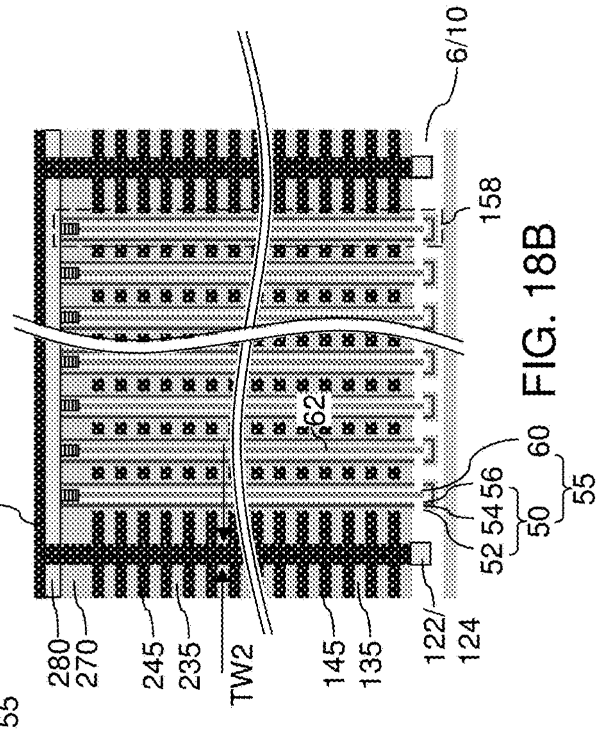
FIG. 18B is a vertical cross-sectional view of a capacitor region of the first exemplary structure of FIG. 18A.

Referring to FIGS. 18A and 18B, a backside blocking dielectric layer (not shown) can be optionally deposited in the backside recesses (143, 243) and the backside trenches (79, 179) and over the first contact level dielectric layer 280. The backside blocking dielectric layer includes a dielectric material such as a dielectric metal oxide, silicon oxide, or a combination thereof. For example, the backside blocking dielectric layer can include aluminum oxide. The backside blocking dielectric layer can be formed by a conformal deposition process such as atomic layer deposition or chemical vapor deposition. The thickness of the backside blocking dielectric layer can be in a range from 1 nm to 20 nm, such as from 2 nm to 10 nm, although lesser and greater thicknesses can also be used.

At least one conductive material can be deposited in the plurality of backside recesses (243, 243), on the sidewalls of the backside trenches (79, 179), and over the first contact level dielectric layer 280. The at least one conductive material can be deposited by a conformal deposition method, which can be, for example, chemical vapor deposition (CVD), atomic layer deposition (ALD), electroless plating, electroplating, or a combination thereof. The at least one conductive material can include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material can include at least one metallic material, i.e., an electrically conductive material that includes at least one metallic element. Non-limiting exemplary metallic materials that can be deposited in the backside recesses (143, 243) include tungsten, tungsten nitride, titanium, titanium nitride, tantalum, tantalum nitride, cobalt, and ruthenium. For example, the at least one conductive material can include a conductive metallic nitride liner that includes a conductive metallic nitride material such as TiN, TaN, WN, or a combination thereof, and a conductive fill material such as W, Co, Ru, Mo, Cu, or combinations thereof. In one embodiment, the at least one conductive material for filling the backside recesses (143, 243) can be a combination of titanium nitride layer and a tungsten fill material.

Electrically conductive layers (146, 246) can be formed in the backside recesses (143, 243) within the memory array region 100 and the staircase region 200 by deposition of the at least one conductive material. A plurality of first electrically conductive layers 146 can be formed in the plurality of first backside recesses 243 within the memory array region 100 and the staircase region 200, and a plurality of second electrically conductive layers 246 can be formed in the plurality of second backside recesses 243 within the memory array region 100 and the staircase region 200. Electrically conductive strips (145, 245) can be formed in the backside recesses (143, 243) within the capacitor region 900 by deposition of the at least one conductive material. A plurality of first electrically conductive strips 145 can be formed in the plurality of first backside recesses 143 in the capacitor region 900, and a plurality of second electrically conductive strips 245 can be formed in the plurality of second backside recesses 242 in the capacitor region 900. A continuous metallic material layer 46L can be formed on the sidewalls of each backside trench (79, 179) and over the first contact level dielectric layer 280. Each portion of the first insulating layers 132 in the capacitor region 900 is herein referred to as a first insulating strip 135, and each portion of the second insulating layers 232 in the capacitor region 900 is herein referred to as a second insulating strip 235. Each of the first electrically conductive layers 146 and the second electrically conductive layers 246 can include a respective conductive metallic nitride liner and a respective conductive fill material. Thus, the first and second sacrificial material layers (142, 242) can be replaced with the first and second electrically conductive layers (146, 246), respectively. Specifically, each first sacrificial material layer 142 can be replaced with an optional portion of the backside blocking dielectric layer and a first electrically conductive layer 146, and each second sacrificial material layer 242 can be replaced with an optional portion of the backside blocking dielectric layer and a second electrically conductive layer 246.

The duration of the at least one conformal deposition process that deposits the at least one conductive material in the backside recesses (143, 243) and on sidewalls of the backside trenches (79, 179) can be selected such that the at least one conductive material fills all of the backside recesses (143, 243) and all of the second backside trenches 179, but does not fill the first backside trenches 79 completely. The total thickness of the at least one conductive material measured over the first contact level dielectric layer 280 can be greater than one half of the second trench width TW2 (i.e., the width of each second backside trench 179) and can be less than one half of the first trench width TW1 (i.e., the width of each first backside trench 79). A backside cavity is present in the portion of each first backside trench 79 that is not filled with the continuous metallic material layer 46L.

Figure 19A:
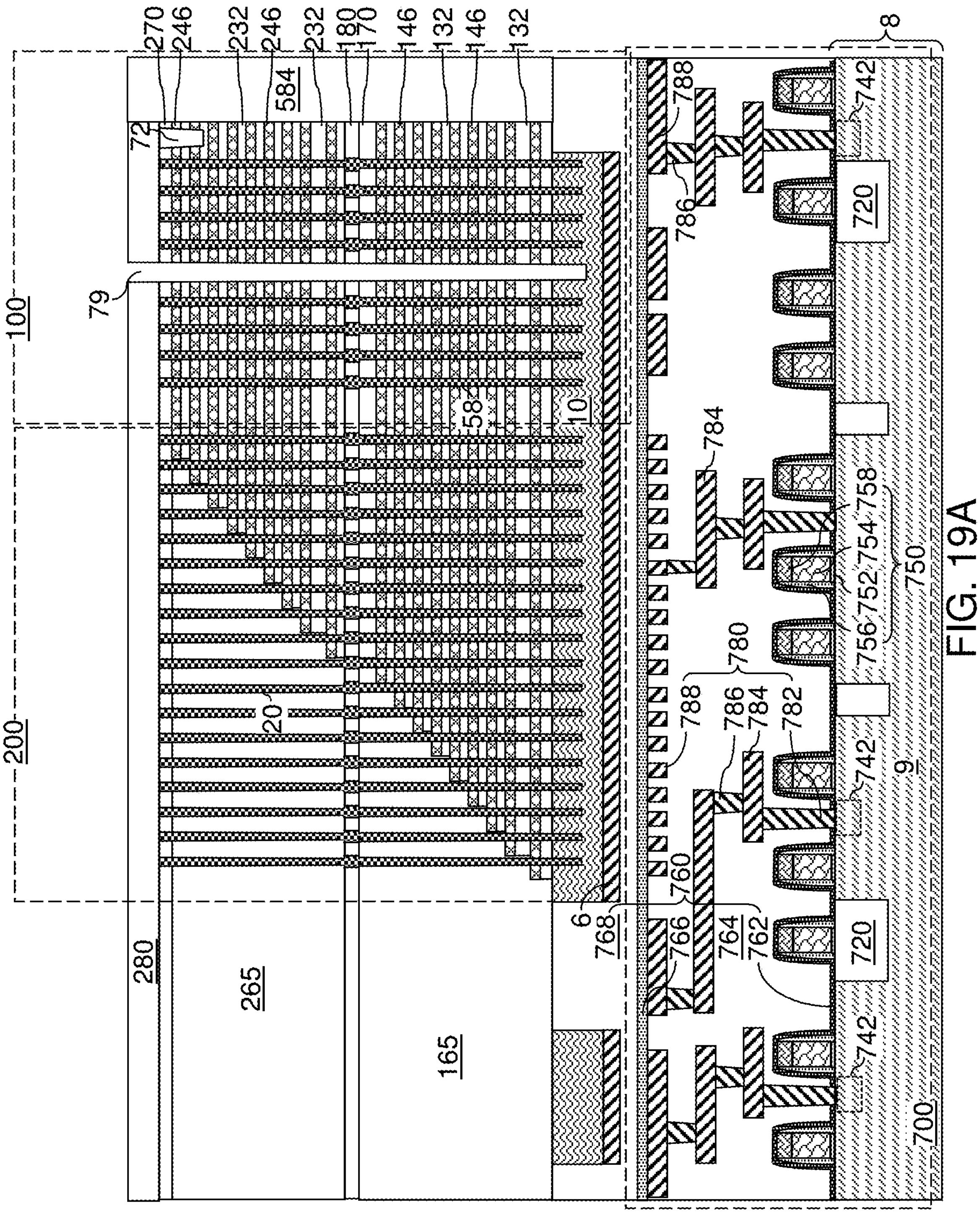
FIG. 19A is a vertical cross-sectional view of the first exemplary structure after removal of the conductive material from the memory region backside trenches according to an embodiment of the present disclosure.
Figure 19B:
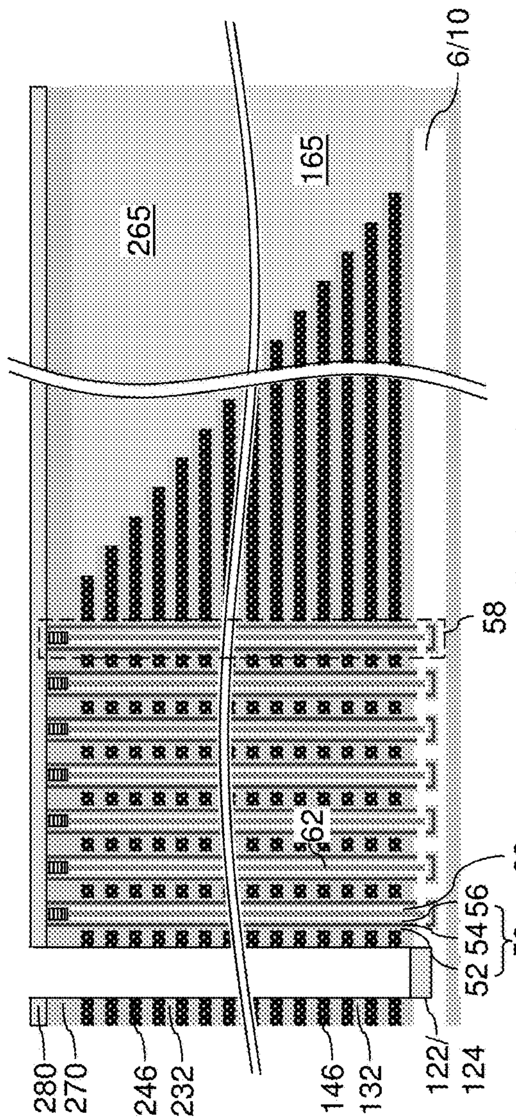
FIG. 19B is a vertical cross-sectional view of a memory array region and a contact region of the first exemplary structure of FIG. 19A.
Figure 19C:
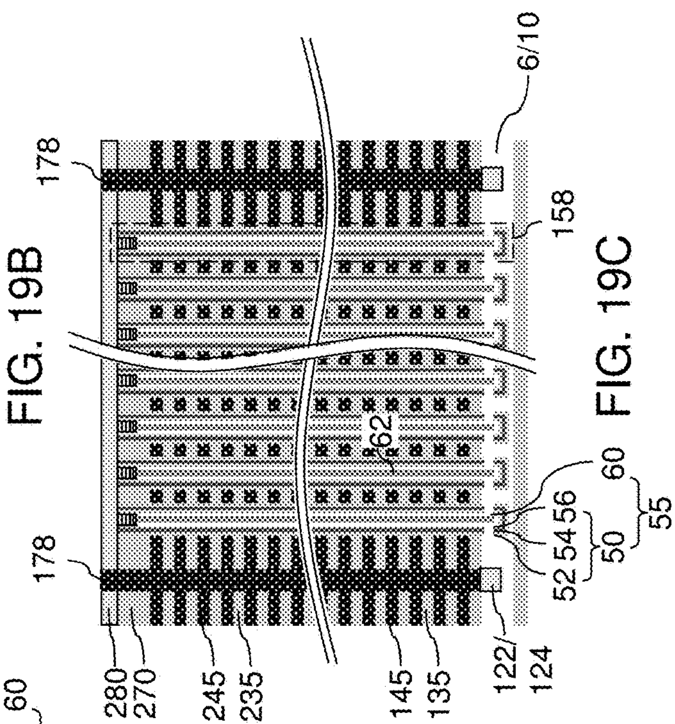
FIG. 19C is a vertical cross-sectional view of a capacitor region of the first exemplary structure of FIG. 19A.

Referring to FIGS. 19A-19C, an isotropic etch process can be performed to remove portions of the continuous metallic material layer 46L that overlie the top surface of the first contact level dielectric layer 280 or located in the first backside trenches 79. Specifically, the deposited metallic material of the continuous metallic material layer 46L can be etched back from the sidewalls of each first backside trench 79 and from above the first contact level dielectric layer 280, for example, by the isotropic etch process. The isotropic etch process can be, for example, a wet etch process that etches the metallic material(s) of the continuous metallic material layer 46L. The duration of the isotropic etch process can be controlled such that the etch distance is in a range from 100% to 150%, such as from 110% to 130%, of the total thickness of the portion of the continuous metallic material layer 46L overlying the first contact level dielectric layer 280.

Each remaining portion of the at least one conductive material in the first backside recesses constitutes a first electrically conductive layer 146. Each remaining portion of the at least one conductive material in the second backside recesses constitutes a second electrically conductive layer 246. Each remaining portion of the at least one conductive material in the second backside trenches 179 in a capacitor region 900 constitutes a conductive wall structure 178. Each conductive wall structure 178 is adjoined to a plurality of first electrically conductive strips 145 and a plurality of second electrically conductive strips 245 that are located in a capacitor region 900. Each electrically conductive strips (145, 245) within a capacitor region 900 can have the same area, and can be electrically connected to at least one conductive wall structure 178.

Each electrically conductive layer (146, 246) in a memory array region 100 and an adjacent staircase region 200 can be a conductive sheet including openings therein. A first subset of the openings through each electrically conductive layer (146, 246) in a memory array region 100 can be filled with memory opening fill structures 58. A second subset of the openings through each electrically conductive layer (146, 246) in a staircase region 200 can be filled with the support pillar structures 20. Each electrically conductive layer (146, 246) located in a memory array region 100 and an adjacent staircase region 200 can have a lesser area than any underlying electrically conductive layer (146, 246) because of the first and second stepped surfaces. Each electrically conductive layer (146, 246) located in a memory array region 100 and an adjacent staircase region 200 can have a greater area than any overlying electrically conductive layer (146, 246) because of the first and second stepped surfaces.

In some embodiment, drain-select-level isolation structures 72 may be provided at topmost levels of the second electrically conductive layers 246 in a memory array region 100. A subset of the second electrically conductive layers 246 located at the levels of the drain-select-level isolation structures 72 in a memory array region 100 constitutes drain select gate electrode layers. A subset of the electrically conductive layer (146, 246) located underneath the drain select gate electrode layers in a memory array region can function as combinations of a control gate and a word line located at the same level. The control gate electrode layers within each electrically conductive layer (146, 246) in a memory array region 100 are the control gate electrode layers for a vertical memory device including the memory stack structure 55.

Each of the memory stack structures 55 comprises a vertical stack of memory elements located at each level of the electrically conductive layers (146, 246) in a memory array region 100. A subset of the electrically conductive layers (146, 246) in a memory array region 100 can comprise word lines for the memory elements. The semiconductor devices in the underlying peripheral device region 700 can comprise word line switch devices configured to control a bias voltage to respective word lines. The memory-level assembly is located over the substrate semiconductor layer 9. The memory-level assembly includes at least one alternating stack (132, 146, 232, 246) and memory stack structures 55 vertically extending through the at least one alternating stack (132, 146, 232, 246).

The sacrificial material layers (142, 242) in each capacitor region 900 are replaced with electrically conductive strips (145, 245), which are conductive material portions. The conductive material portions of the electrically conductive strips (145, 245) in each capacitor region 900 are electrically connected by at least one conductive wall structure 178, and laterally surround the node dielectrics (as illustrated by the dielectric layer stacks 50 located in the capacitor region 900) to constitute a second electrode layer of the capacitor.

A capacitor {(114, 60), 50, (178, 145, 245)} is formed within each capacitor region 900. The capacitor {(114, 60), 50, (178, 145, 245)} includes a first electrode layer (114, 60), which includes a conductive structure (illustrated as a source-level conductive material portion 114) and a set of semiconductor material portions (illustrated as vertical semiconductor channels 60) electrically connected thereto. The capacitor {(114, 60), 50, (178, 145, 245)} includes a second electrode layer (178, 145, 245), which includes at least one conductive wall structure 178 and electrically conductive strips (145, 245) that are physically adjoined to, and electrically connected to, the at least one conductive wall structure 178. The capacitor {(114, 60), 50, (178, 145, 245)} includes node dielectrics that comprise the dielectric layer stacks 50 located in the capacitor region 900.

The sacrificial material layers (142, 242) in each memory array region 100 and adjacent staircase regions 200 are replaced with electrically conductive layers (146, 246), which are additional conductive material portions. The conductive material portions in the memory array regions 100 and the staircase regions 200 comprise additional electrically conductive layers (146, 246) that are electrically isolated and laterally surround memory stack structures 55. The memory stack structures and the additional electrically conductive layers (146, 246) comprise vertical NAND strings.

Figure 20A:
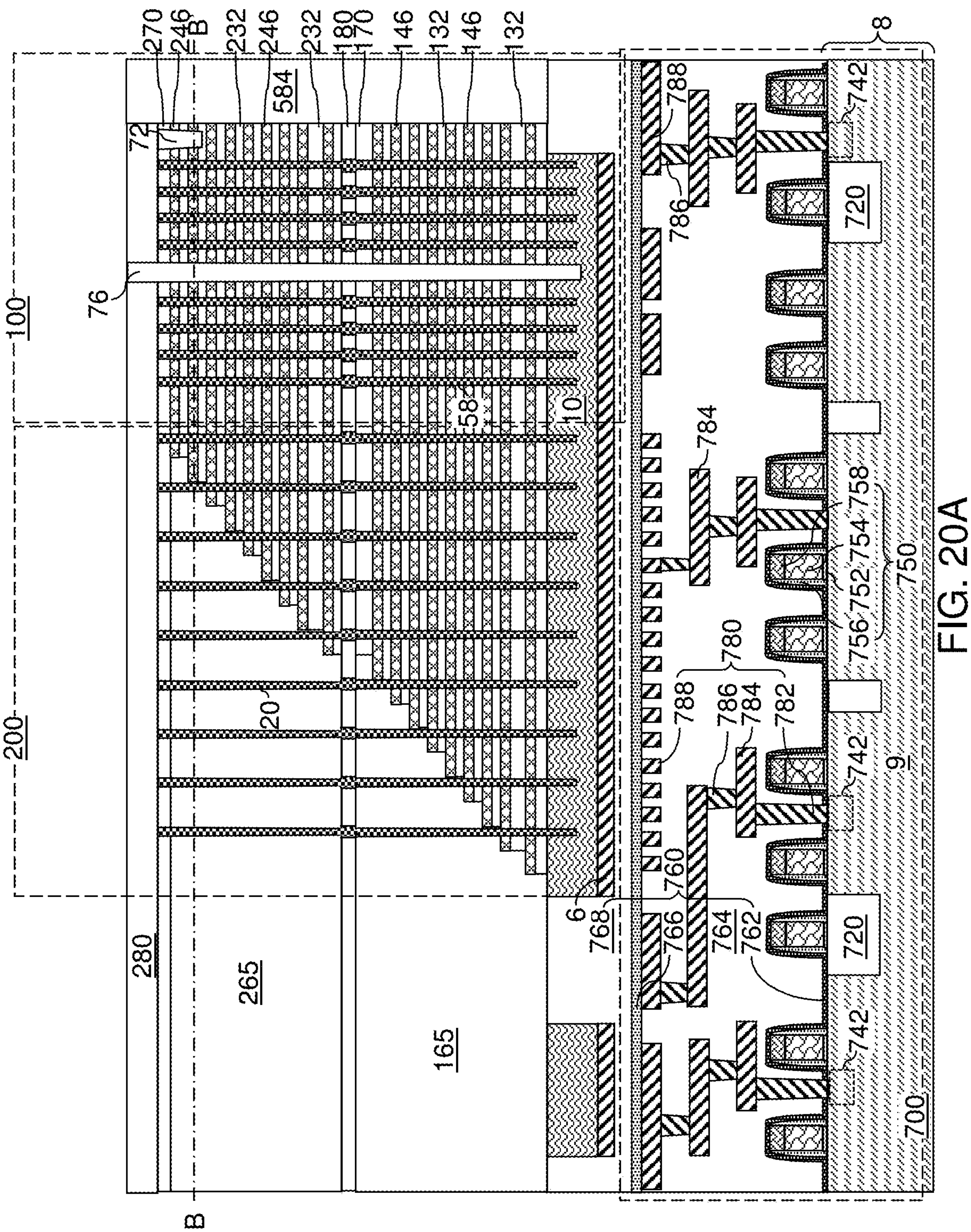
FIG. 20A is a vertical cross-sectional view of the first exemplary structure after formation of dielectric wall structures in the backside trenches according to an embodiment of the present disclosure.
Figure 20B:
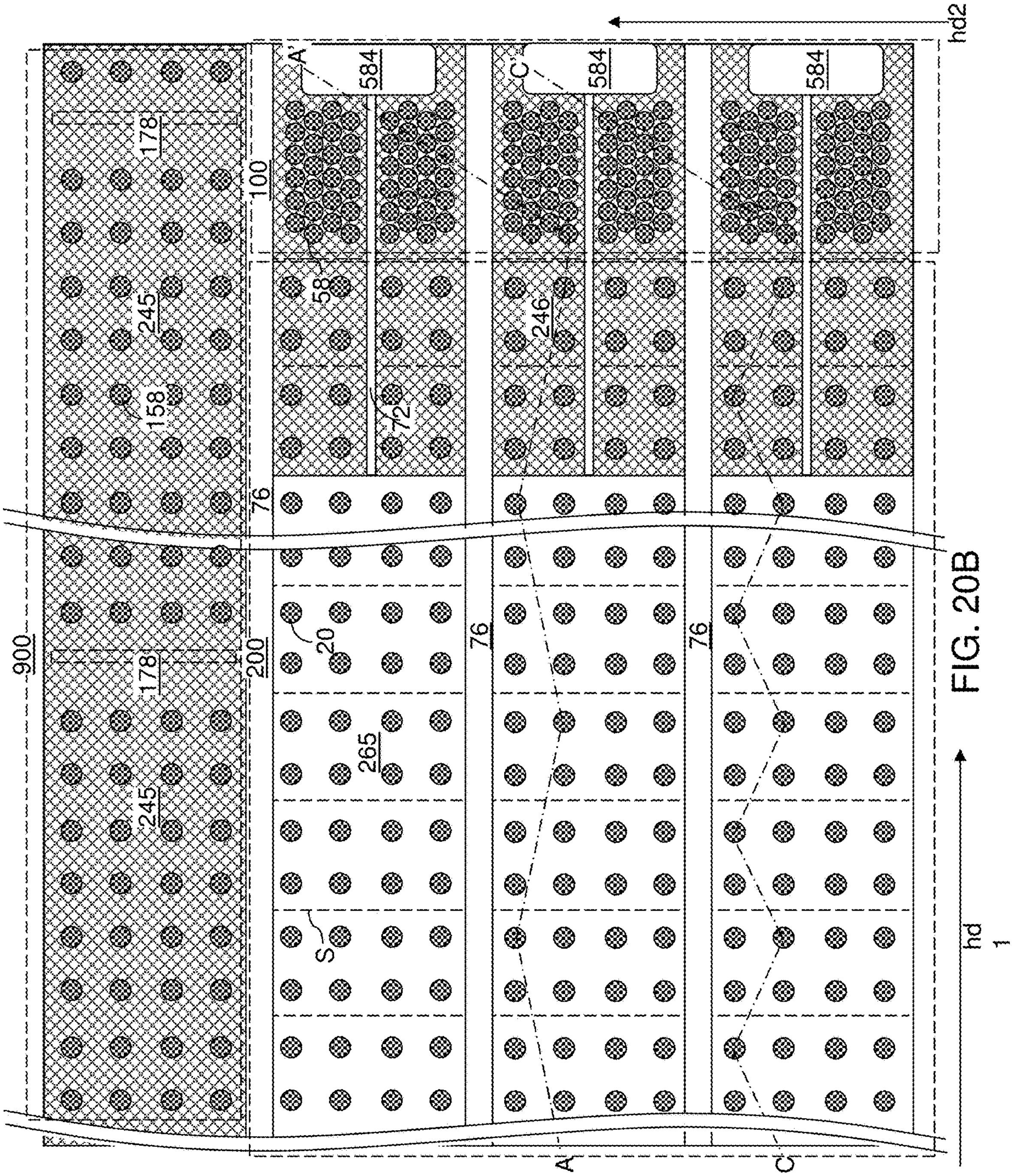
FIG. 20B is a horizontal cross-sectional of the first exemplary structure along the horizontal plane B-B' of FIG. 20A. The hinged vertical plane A-A' corresponds to the plane of the vertical cross-sectional view of FIG. 20A.
Figure 20C:
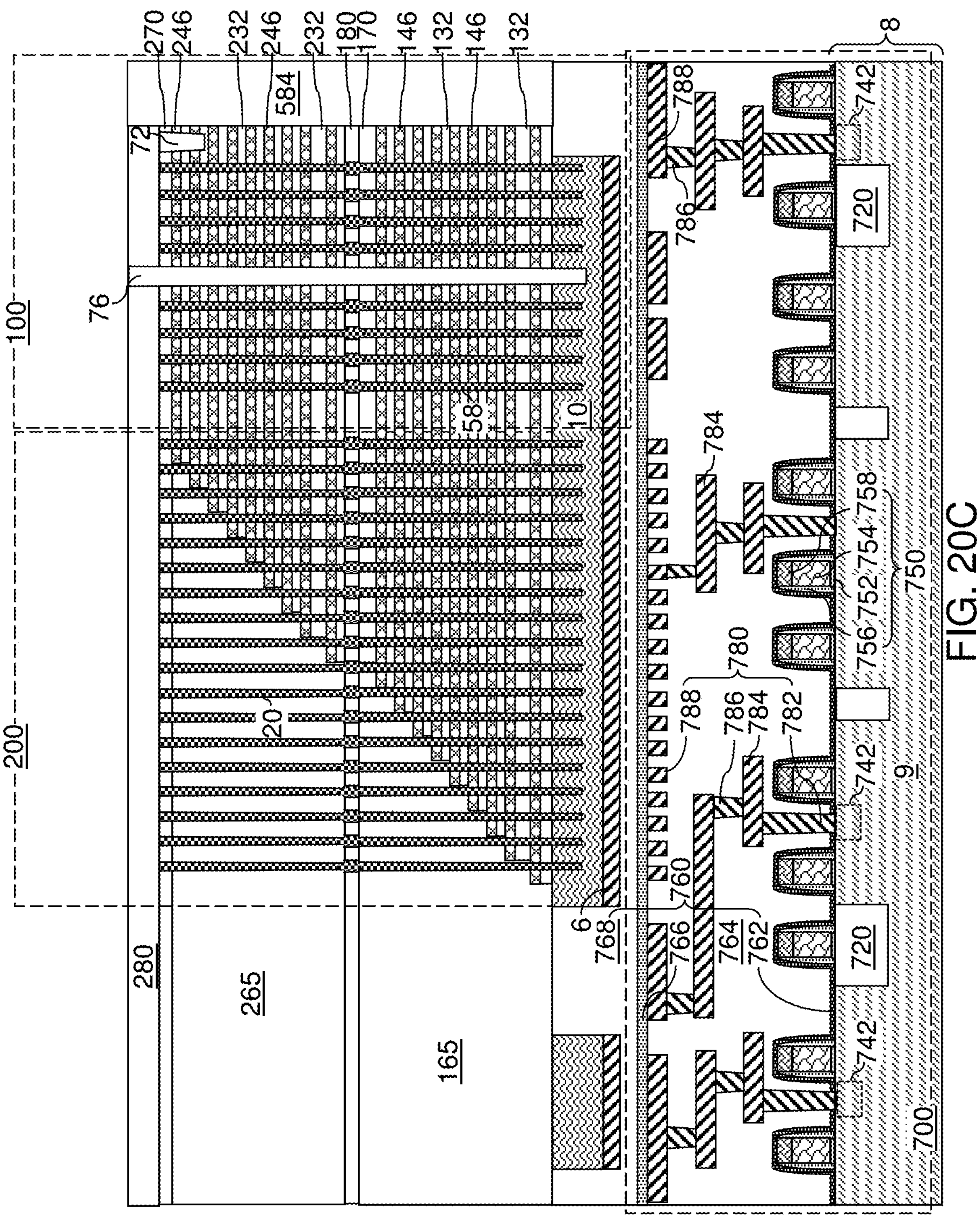
FIG. 20C is a vertical cross-sectional view of the first exemplary structure along the vertical plane C-C' of FIG. 20B.

Referring to FIGS. 20A-20C, a dielectric material is deposited in the first backside trenches 79 to form dielectric wall structures 76. Each of the dielectric wall structures 76 can laterally extend along the first horizontal direction hd1 and can vertically extend through each layer of an alternating stack of the insulating layers (132, 232) and the word-line-level electrically conductive layers (146, 246). Each dielectric wall structure 76 can contact sidewalls of the first and second insulating cap layers (170, 270).

Figure 21A:
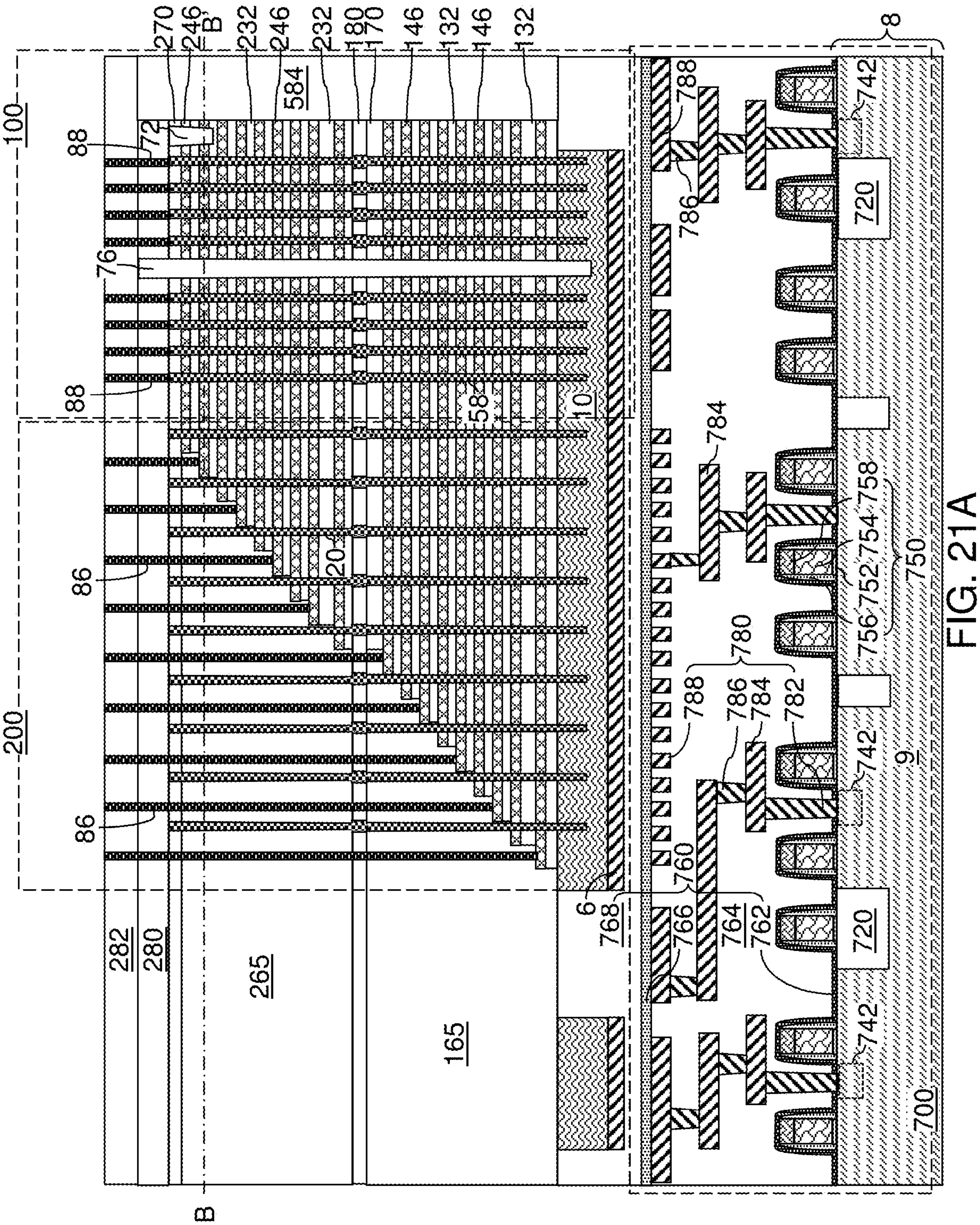
FIG. 21A is a vertical cross-sectional view of the first exemplary structure after formation of a second contact level dielectric layer and various contact via structures according to an embodiment of the present disclosure.
Figure 21B:
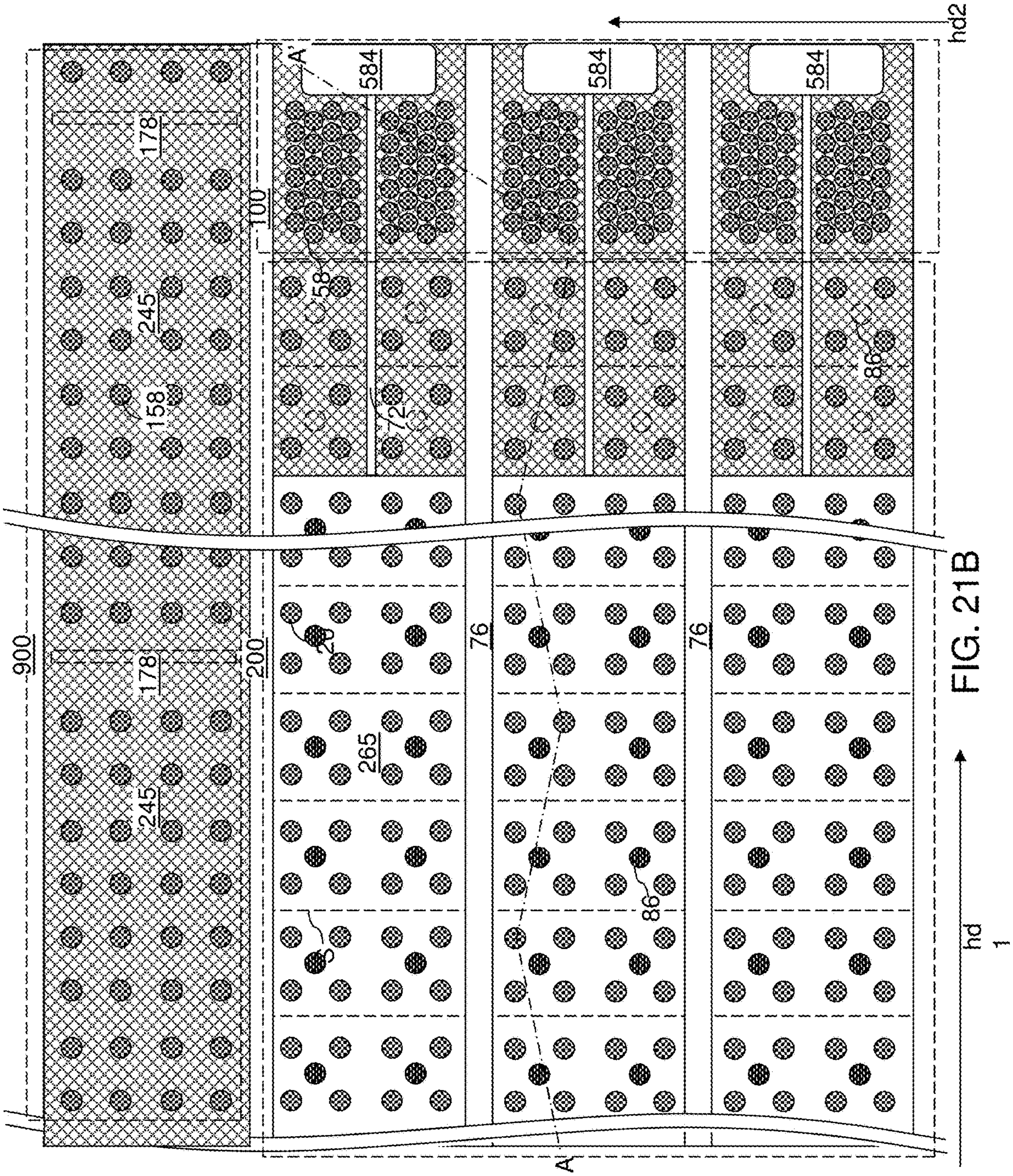
FIG. 21B is a horizontal cross-sectional view of the first exemplary structure along the vertical plane B-B' of FIG. 21A. The hinged vertical plane A-A' corresponds to the plane of the vertical cross-sectional view of FIG. 21A.

Referring to FIGS. 21A and 21B, a second contact level dielectric layer 282 may be formed over the first contact level dielectric layer 280. The second contact level dielectric layer 282 includes a dielectric material such as silicon oxide, and can have a thickness in a range from 100 nm to 600 nm, although lesser and greater thicknesses can also be used.

A photoresist layer (not shown) can be applied over the second contact level dielectric layer 282, and can be lithographically patterned to form various contact via openings. For example, openings for forming drain contact via structures can be formed in the memory array region 100, and openings for forming staircase region contact via structures can be formed in the staircase region 200. Openings for forming contact via structures for a capacitor can be formed in each capacitor region 900. An anisotropic etch process is performed to transfer the pattern in the photoresist layer through the second and first contact level dielectric layers (282, 280) and underlying dielectric material portions. The drain regions 63, the electrically conductive layers (146, 246), and the conductive wall structures 178 can be used as etch stop structures. Drain contact via cavities can be formed over each drain region 63, and staircase-region contact via cavities can be formed over each electrically conductive layer (146, 246) at the stepped surfaces underlying the first and second retro-stepped dielectric material portions (165, 265). Capacitor contact via cavities can be formed on a top surface of each conductive wall structure 178. The photoresist layer can be subsequently removed, for example, by ashing. Buried layer contact via cavities extending to a respective source-level conductive material portion 114 can be formed in each staircase region 200 and in each capacitor region 900. The photoresist layer can be subsequently removed, for example, by ashing.

At least one conductive material can be deposited in each of the via cavities. Excess portions of the at least one conductive material can be removed from above the top surface of the second contact level dielectric layer 282 by a planarization process, which can use a recess etch or chemical mechanical planarization. Drain contact via structures 88 are formed in the drain contact via cavities on a top surface of a respective one of the drain regions 63 in each memory array region 100. Staircase-region contact via structures 86 are formed in the staircase-region contact via cavities on a top surface of a respective one of the electrically conductive layers (146, 246) in each staircase region 200. The staircase-region contact via structures 86 can include drain select level contact via structures that contact a subset of the second electrically conductive layers 246 that function as drain select level gate electrode layers. Further, the staircase-region contact via structures 86 can include word line contact via structures that contact electrically conductive layers (146, 246) that underlie the drain select level gate electrode layers and function as word lines for the memory stack structures 55. Capacitor contact via structures (not shown) can be formed on the conductive wall structures 178 in the capacitor region 900. Buried layer contact via structures can be formed in the buried layer contact via cavities.

Figure 22:
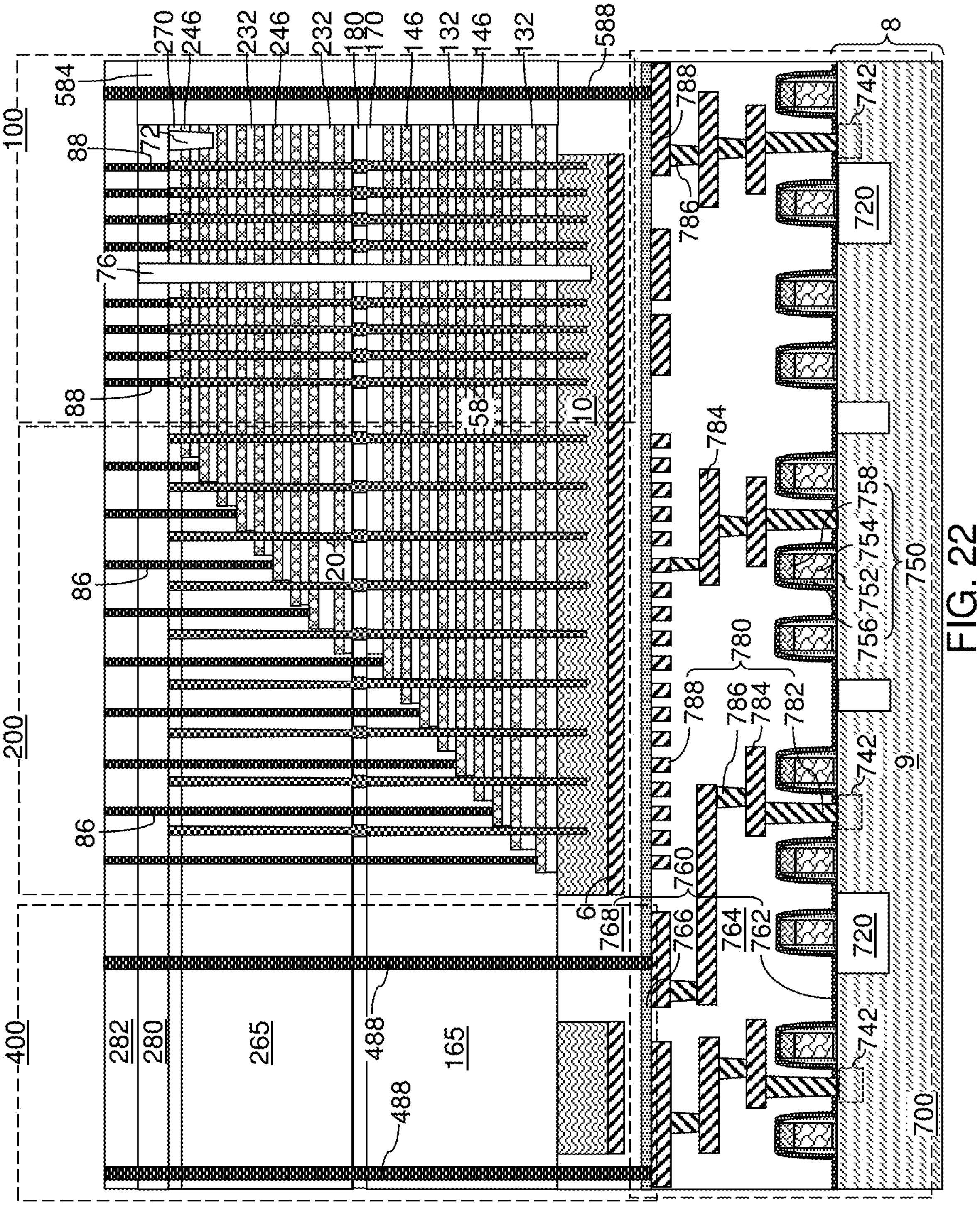
FIG. 22 is a vertical cross-sectional view of the first exemplary structure after formation of through-memory-level via structures according to an embodiment of the present disclosure.

Referring to FIG. 22, peripheral via cavities can be formed through the second and first contact level dielectric layers (282, 280), the second and first retro-stepped dielectric material portions (265, 165), and the at least one second dielectric layer 768 to top surfaces of the lower metal interconnect structure 780 in the peripheral region 400. Vertical interconnection via cavities can be formed through the second contact level dielectric layer 282, the interconnection region dielectric fill material portions 584, and the at least one second dielectric layer 768 to top surfaces of the lower metal interconnect structure 780. At least one conductive material can be deposited in the peripheral via cavities to form peripheral contact via structures 488. The at least one conductive material can be deposited in the vertical interconnection via cavities to form vertical interconnection via structures 588.

Figure 23:
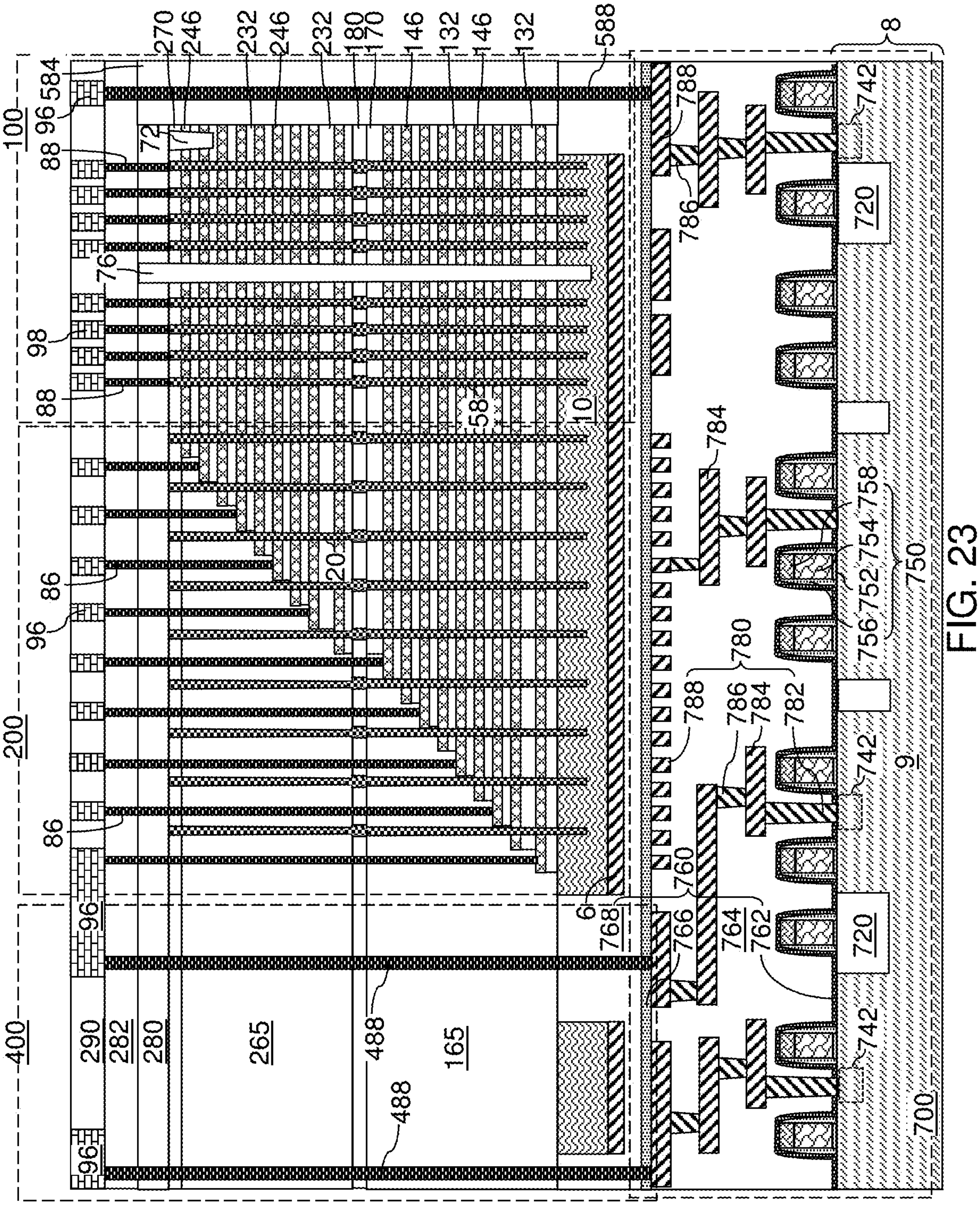
FIG. 23 is a vertical cross-sectional view of the first exemplary structure after formation of upper metal line structures according to an embodiment of the present disclosure.

Referring to FIG. 23, a line level dielectric layer 290 can be formed over the second contact level dielectric layer 282. Line level metal interconnect structures (96, 98) can be formed in the line level dielectric layer 290. The line level metal interconnect structures (96, 98) can include bit lines 98 contacting, or electrically connected to, a respective one of the drain contact via structures 88, and upper interconnection line structures 96 contacting, and/or electrically connected to, at least one of the staircase-region contact via structures 86, the peripheral-region contact via structures 488, and the vertical interconnection via structures 588.

Figure 24:
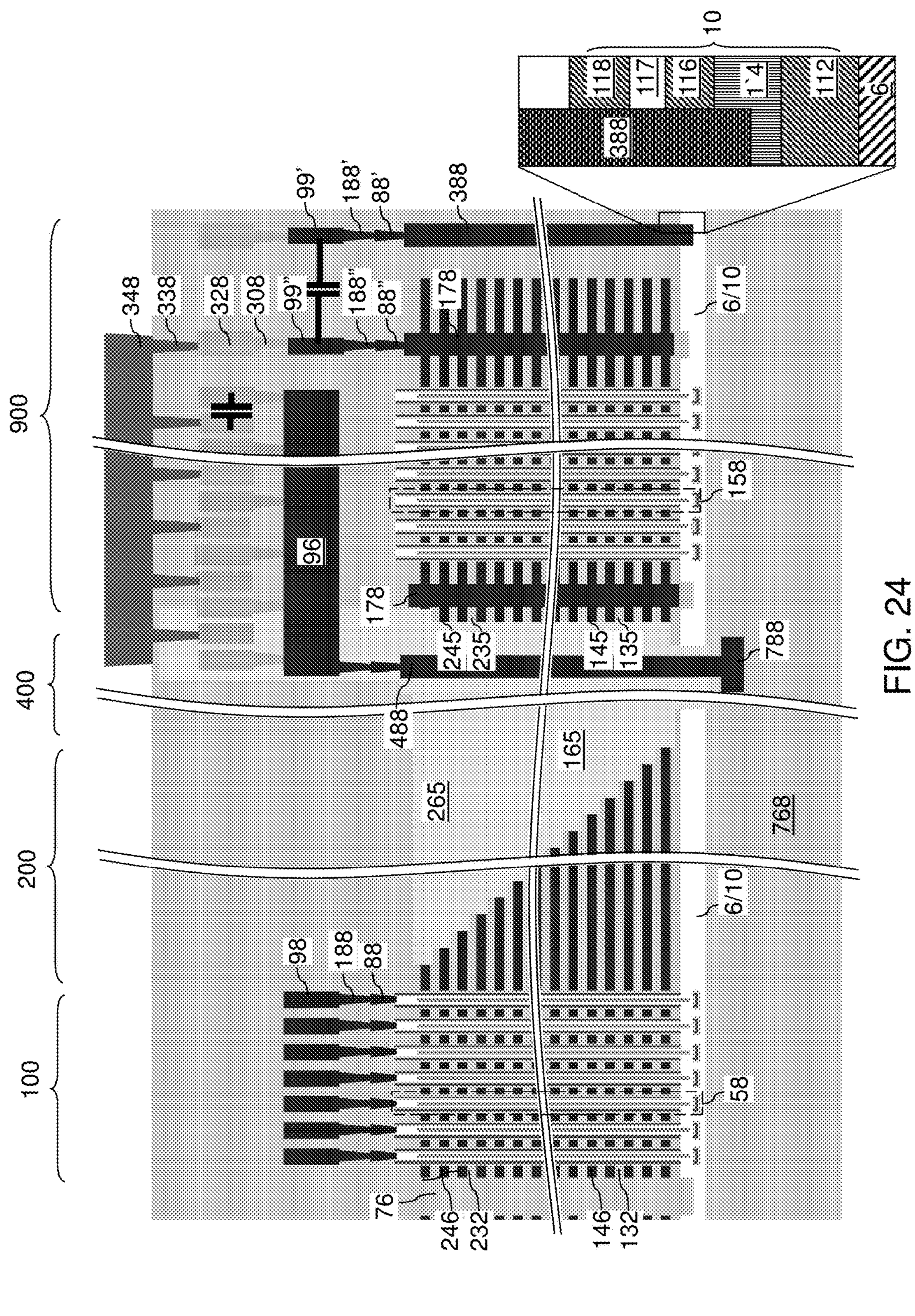
FIG. 24 is a vertical cross-sectional view of an alternative configuration of the first exemplary structure after formation of additional interconnect-level dielectric material layers and additional metal interconnect structures according to an embodiment of the present disclosure.

Referring to FIG. 24, an alternative configuration of the first exemplary structure is illustrated. A capacitor {(114, 60), 50, (178, 145, 245)} is provided within each capacitor region 900. The capacitor {(114, 60), 50, (178, 145, 245)} includes a first electrode layer (114, 60), which includes a conductive structure (illustrated as a source-level conductive material portion 114) and a set of semiconductor material portions (illustrated as vertical semiconductor channels 60) electrically connected thereto. The capacitor {(114, 60), 50, (178, 145, 245)} includes a second electrode layer (178, 145, 245), which includes at least one conductive wall structure 178 and electrically conductive strips (145, 245) that are physically adjoined to, and electrically connected to, the at least one conductive wall structure 178. The capacitor {(114, 60), 50, (178, 145, 245)} includes node dielectrics that comprise the dielectric layer stacks 50 located in the capacitor region 900.

A buried layer contact via structure 388 can contact the conductive structure (illustrated as a source-level conductive material portion 114) of the first electrode layer (114, 60). Capacitor contact via structures (88', 88") can contact top surfaces of the buried layer contact via structure 388 and the at least one conductive wall structure 178. Capacitor connection via structures (188', 188") may be used to contact top surfaces of the capacitor contact via structures (88', 88"). First capacitor connection line structures (99', 99") can be connected to the capacitor connection via structures (188', 188"). At least one additional dielectric layer and additional metal interconnect structures can be formed over the line level dielectric layer 290. The additional metal interconnect structures (308, 328, 338, 348) can be formed in, or above, the at least one additional dielectric layer. For example, the additional metal interconnect structures (308, 328, 338, 348) can include first via level via structures 308, second line level line structures 328, second via level via structures 138, and third line level line structures 348. Optionally, a metal-insulator-metal capacitor (MIMCAP) can be formed in addition to the capacitors using the capacitor pillar structures 158 of the various embodiments. If present, such a metal-insulator-metal capacitor can use two sets of metal lines (such as the second line level structures 328) that are parallel to each other. Each set of metal lines can be electrically connected, a metal line within a first set of metal lines can be located between a pair of metal lines within a second set, and a metal line within the second set of metal lines can be located between a pair of metal lines within the first set.

Referring to all drawings of the first exemplary structure, a semiconductor structure is provided, which comprises: a first alternating stack of insulating strips (135, 235) and electrically conductive strips (145, 245) located over a substrate 8, for example, in a capacitor region 900; and capacitor pillar structures 158 vertically extending through the first alternating stack {(135, 145), (235, 245)}, wherein each of the capacitor pillar structures 158 comprises a node dielectric (illustrated as a dielectric layer stack 50 located in the capacitor region 900) and a semiconductor material portion (illustrated as a vertical semiconductor channel 60 located in the capacitor region 900) that is laterally surrounded by the node dielectric 50, wherein: the semiconductor material portions 60 are electrically connected to provide a first electrode layer (114, 60) of a capacitor; the electrically conductive strips (145, 245) are electrically connected to provide a second electrode layer (178, 145, 245) of the capacitor; and the node dielectrics 50 collectively constitute an insulating dielectric between the first electrode layer (114, 60) and the second electrode layer (178, 145, 245) of the capacitor.

In one embodiment, the semiconductor structure can comprise: a second alternating stack of insulating layers (132, 232) and electrically conductive strips (146, 246) located over the substrate 8, for example, in a memory array region 100 and a staircase region 200; and memory stack structures 55 vertically extending through the second alternating stack {(132, 146), (232, 246)}, wherein: the insulating layers (132, 232) have a same material composition as the insulating strips (135, 235) within the first alternating stack {(135, 145), (235, 245)}; and the electrically conductive layers (146, 246) have a same material composition as the electrically conductive strips (145, 245) within the first alternating stack {(135, 145), (235, 245)}.

In one embodiment, each insulating layer (132, 232) in the second alternating stack {(132, 146), (232, 246)} is located at a same vertical distance from the substrate 8 as a corresponding one of the insulating strips (135, 235) within the first alternating stack {(135, 145), (235, 245)}; and each electrically conductive layer (146, 246) in the second alternating stack {(132, 146), (232, 246)} is located at a same vertical distance from the substrate 8 as a corresponding one of the electrically conductive strips (145, 245) within the first alternating stack {(135, 145), (235, 245)}.

In one embodiment, each of the memory stack structures 55 comprises a respective memory film 50M and a respective vertical semiconductor channel 60; each of the memory films 50M includes a blocking dielectric layer 56, a charge storage layer 54, and a tunneling dielectric layer 56; and each of the node dielectrics 50 includes a first dielectric layer having a same composition and a same thickness as the blocking dielectric layer 52, a second dielectric layer having a same composition and a same thickness as the charge storage layer 54, and a third dielectric layer having a same composition and a same thickness as the tunneling dielectric layer 56.

In one embodiment, a source contact layer 114 underlies the second alternating stack {(132, 146), (232, 246)} and overlies the substrate 8, comprises a doped semiconductor material, contacts sidewalls of the semiconductor material portions 60 and electrically connects the semiconductor material portions.

Figure 25:
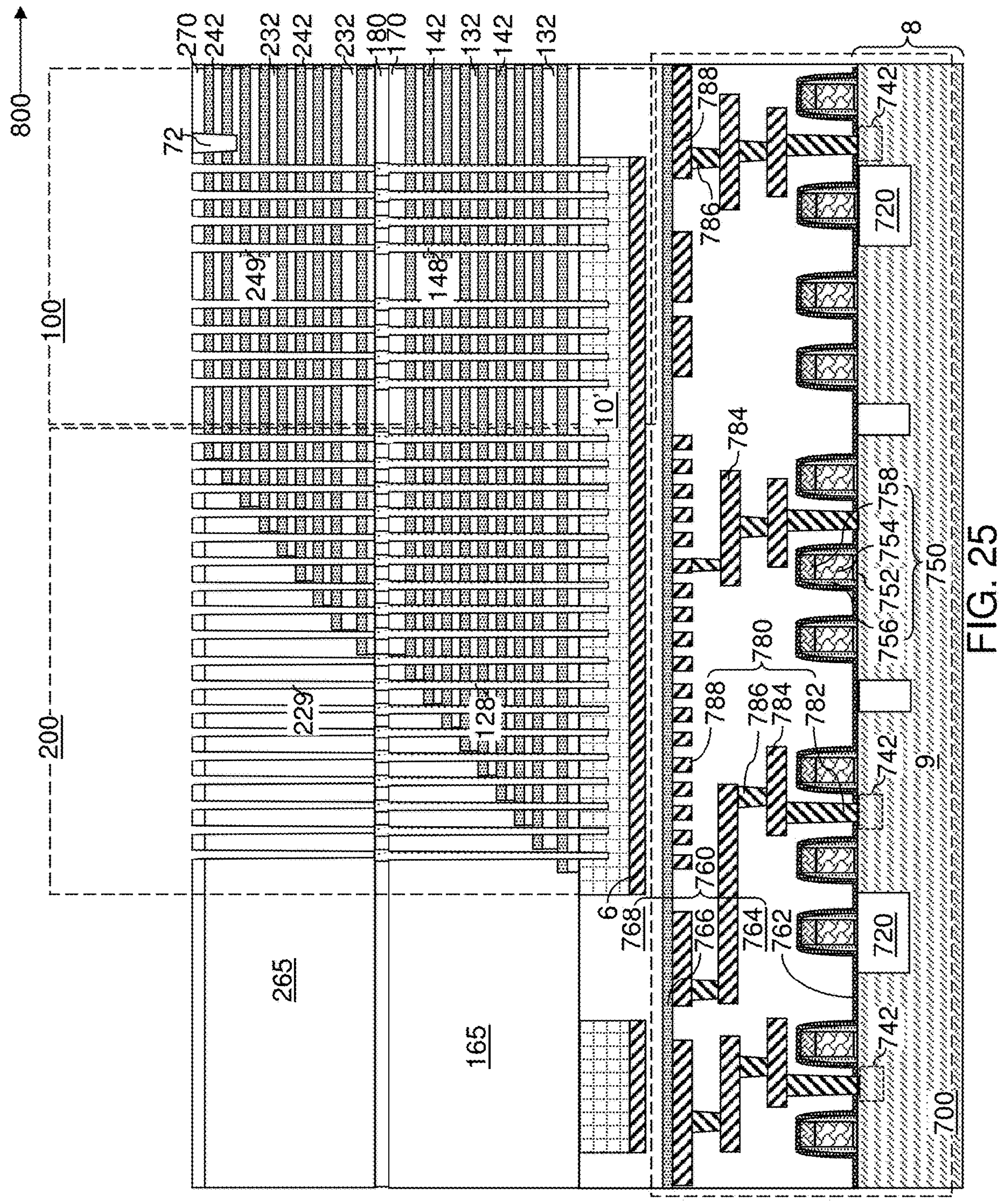
FIG. 25 is a vertical cross-sectional view of a second exemplary structure after formation of sacrificial second-tier opening fill portions according to an embodiment of the present disclosure.

Referring to FIG. 25, a second exemplary structure can be derived from the first exemplary structure by modifying the first exemplary structure. For example, the capacitor region 900 of the first exemplary structure is replaced with a capacitor region 800 of the second exemplary structure in which first-tier capacitor openings 169, sacrificial first-tier capacitor opening fill portions 168, and second-tier capacitor openings 269 are not formed. FIG. 25 corresponds to the processing steps of FIGS. 7A and 7B of the first exemplary structure. In the second exemplary structure, first-tier capacitor openings 169, sacrificial first-tier capacitor opening fill portions 168, and second-tier capacitor openings 269 of the first exemplary structure are omitted, and the capacitor region 800 of the second exemplary structure can include alternating stacks {(132, 142), (232, 242)} of the insulating layers (132, 232) and the sacrificial material layers (142, 242) and/or first and/or second retro-stepped dielectric material portions (165, 265). In one embodiment, the capacitor region 800 of the second exemplary structure can be free of any openings extending through the alternating stacks {(132, 142), (232, 242)} and/or first and/or second retro-stepped dielectric material portions (165, 265).

Figure 26A:
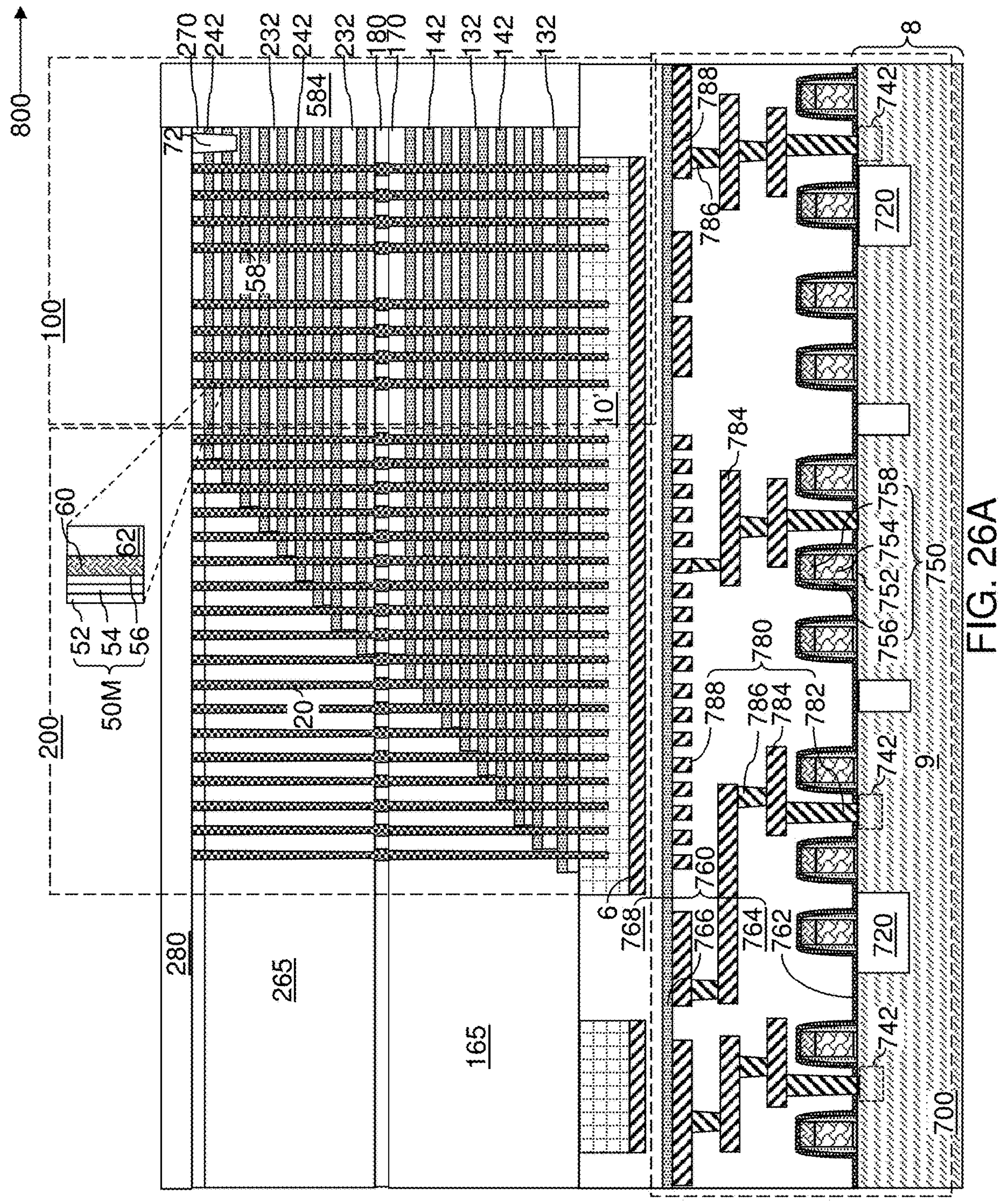
FIG. 26A is a vertical cross-sectional view of the second exemplary structure after formation of a first contact level dielectric layer and dielectric fill material portions according to an embodiment of the present disclosure.
Figure 26B:
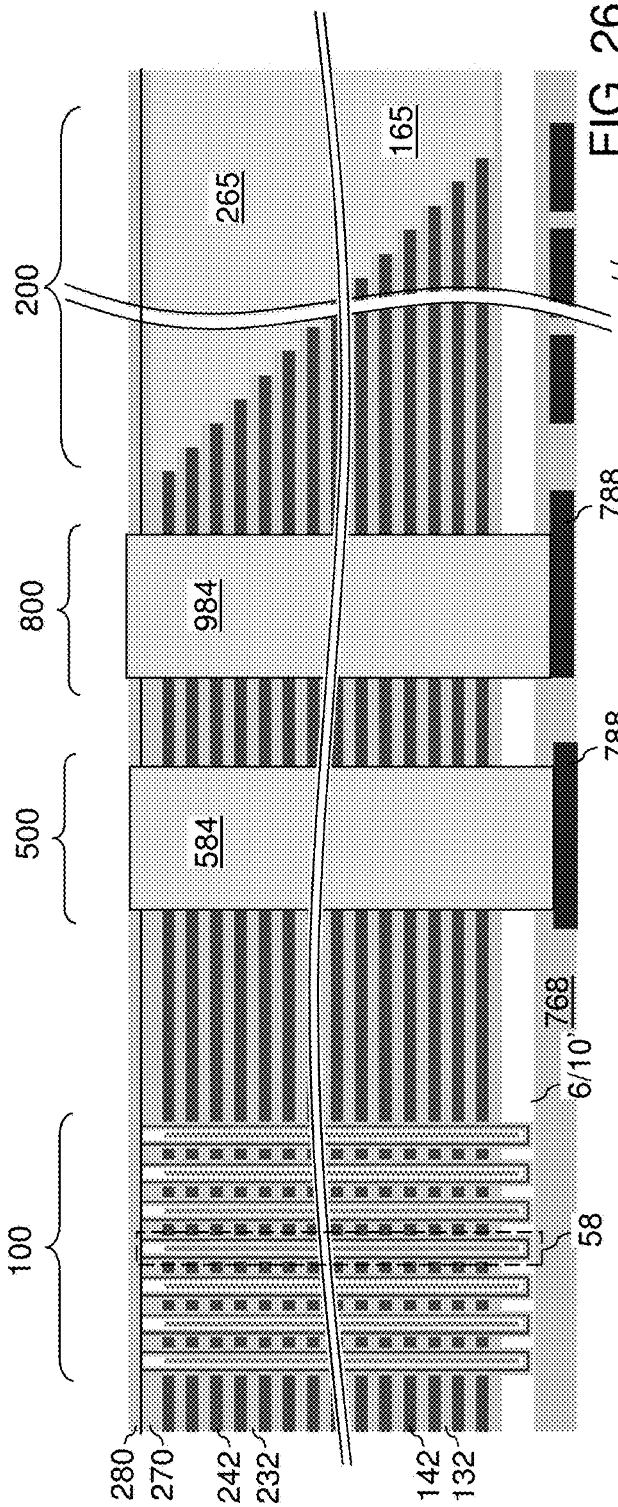
FIG. 26B is another vertical cross-sectional view of the second exemplary structure of FIG. 26A.

Referring to FIGS. 26A and 26B, the processing steps for forming the first exemplary structure can be performed up to the processing steps that form the first exemplary structure illustrated in FIG. 12. At the processing step that forms the vertical interconnection region cavities 585 (which corresponds to a processing step of FIG. 11), additional cavities are formed within the capacitor region 800. A capacitor region cavity can be formed within each capacitor region 800. Each capacitor region cavity can have a set of vertical sidewalls that vertically extend from a top surface of the first contact level dielectric layer 280 to a top surface of an underlying lower-level metal interconnect structures 780, which may be a top surface of a landing pad level metal line structure 788. The vertical interconnection region cavities 585 and the capacitor region cavities can be simultaneously formed by an anisotropic etch process using a patterned photoresist layer as an etch mask. The patterned photoresist layer can be subsequently removed, for example, by ashing.

While FIGS. 26A and 26B illustrates a configuration in which a capacitor region 800 is formed within an opening through alternating stacks of insulating layers (132, 232) and sacrificial material layers (142, 242), alternative embodiments are expressly contemplated herein in which a capacitor region is formed through a staircase region 200 or between neighboring pairs of memory array regions 100.

A dielectric material such as silicon oxide can be deposited in the vertical interconnection region cavities 585 and in the capacitor region cavities by a conformal deposition process (such as low pressure chemical vapor deposition) or a self-planarizing deposition process (such as spin coating). Excess portions of the deposited dielectric material can be removed from above the top surface of the first contact level dielectric layer 280 by a planarization process. Remaining portions of the dielectric material in the vertical interconnection region cavities 585 constitute interconnection region dielectric fill material portions 584. Remaining portions of the dielectric material in the capacitor region cavities constitute capacitor region dielectric fill material portions 984. Each capacitor region dielectric fill material portion 984 can contact a top surface of an underlying lower-level metal interconnect structure 780. Generally, first dielectric fill material portions (such as the capacitor region dielectric fill material portions 984) and second dielectric fill material portions (such as interconnect region dielectric fill material portions 584) can be simultaneously formed through the alternating stacks of insulating layers (132, 232) and sacrificial material layers (142, 242). Each of the dielectric fill material portions (984, 584) can include a respective set of straight sidewalls that vertically extend from a top surface of the first contact level dielectric layer 280 to a top surface of a respective one of the lower-level metal interconnect structure 780 located underneath the in-process source-level material layers 10'. The region of the interconnect region dielectric fill material portions 584 is herein referred to as an interconnection region 500.

Figure 27:
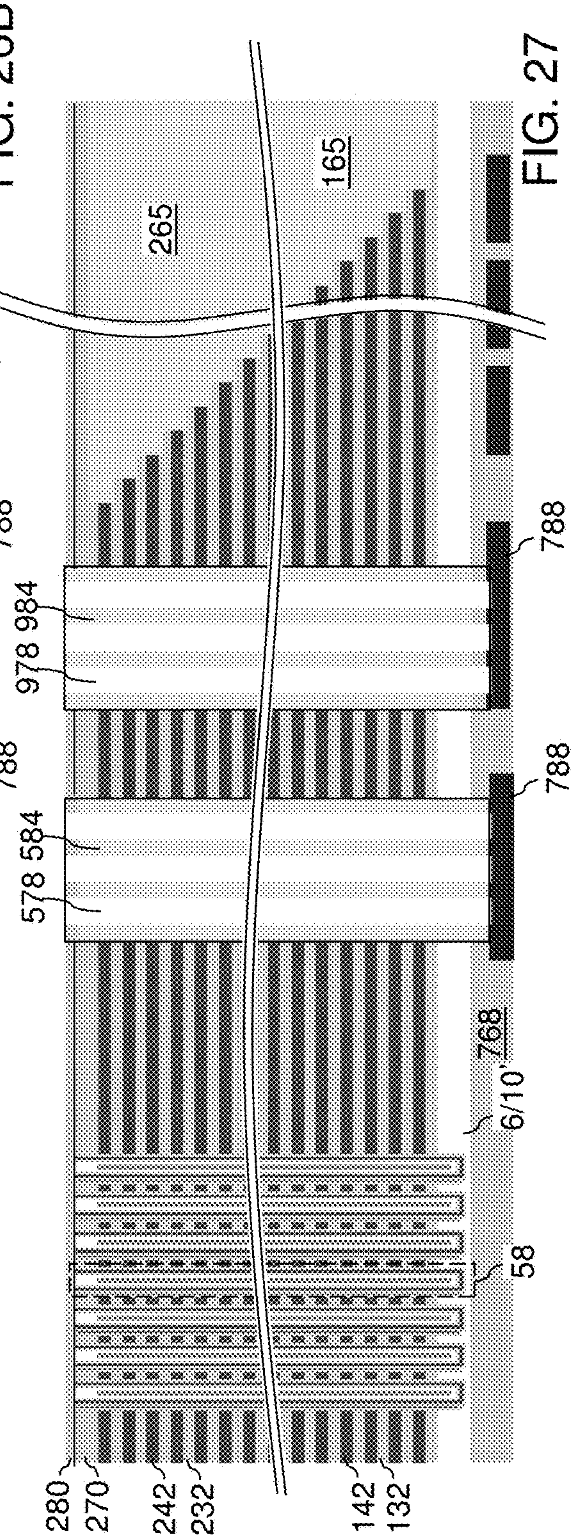
FIG. 27 is a vertical cross-sectional view of the second exemplary structure after formation of sacrificial pillar structures within the dielectric fill material portions according to an embodiment of the present disclosure.

Referring to FIG. 27, a photoresist layer (not shown) can be applied over the first contact level dielectric layer 280, the capacitor region dielectric fill material portions 984, and the interconnection region dielectric fill material portions 584, and is lithographically patterned to form arrays of openings over the capacitor region dielectric fill material portions 984 and the interconnection region dielectric fill material portions 584. For example, a first array of openings can be formed over each of the capacitor region dielectric fill material portions 984, and a second array of openings can be formed over each of the interconnection region dielectric fill material portions 584. An anisotropic etch is performed to transfer the pattern in the photoresist layer through the capacitor region dielectric fill material portions 984 and the interconnection region dielectric fill material portions 584. The lower-level metal interconnect structures 780 can be used as etch stop structures.

A plurality of capacitor via cavities is formed through each capacitor region dielectric fill material portion 984 (i.e., through each first dielectric fill material portion). Each of the plurality of capacitor via cavities vertically extends through the alternating stacks {(132, 142), (232, 242)} with straight sidewalls. A plurality of contact via cavities is formed through each interconnection region dielectric fill material portions 584 (i.e., through each second dielectric fill material portion). Each of the plurality of contact via cavities vertically extends through the alternating stacks {(132, 142), (232, 242)} with straight sidewalls. The plurality of capacitor via cavities and the plurality of contact via cavities can be simultaneously formed during a same anisotropic etch process through the capacitor region dielectric fill material portion 984 and through the interconnection region dielectric fill material portion 584, respectively. A top surface of a lower-level metal interconnect structure 780 can be physically exposed at the bottom of each capacitor via cavity and at the bottom of each contact via cavity. The physically exposed surfaces of the lower-level metal interconnect structures 780 can be top surfaces of metal line structures such as the landing-pad-level metal line structures 788.

A sacrificial fill material is concurrently deposited in each of the capacitor via cavities and contact via cavities. The sacrificial fill material includes a material that can be subsequently removed selective to the materials of the first contact level dielectric layer 280, the capacitor region dielectric fill material portion 984, and the interconnection region dielectric fill material portion 584.

In one embodiment, the sacrificial fill material can include a semiconductor material such as silicon (e.g., a-Si or polysilicon), a silicon-germanium alloy, germanium, a III-V compound semiconductor material, or a combination thereof. The sacrificial fill material may be formed by a non-conformal deposition or a conformal deposition method.

In another embodiment, the sacrificial fill material may include borosilicate glass or porous or non-porous organosilicate glass having an etch rate that is at least 100 times higher than the etch rate of densified TEOS oxide (i.e., a silicon oxide material formed by decomposition of tetraethylorthosilicate glass in a chemical vapor deposition process and subsequently densified in an anneal process) in a 100:1 dilute hydrofluoric acid. In this case, a thin etch stop liner (such as a silicon nitride layer having a thickness in a range from 1 nm to 3 nm) may be used prior to depositing the sacrificial fill material. The sacrificial fill material may be formed by a non-conformal deposition or a conformal deposition method.

In yet another embodiment, the sacrificial fill material can include a carbon-containing material (such as amorphous carbon or diamond-like carbon) that can be subsequently removed by ashing, or a silicon-based polymer that can be subsequently removed selective to the materials of the first-tier alternating stack (132, 142).

Portions of the deposited sacrificial material can be removed from above the first contact level dielectric material layer 280 by a planarization process. The planarization process can include a recess etch, chemical mechanical planarization (CMP), or a combination thereof. The top surface of the first contact level dielectric material layer 280 can be used as an etch stop layer or a planarization stop layer.

Remaining portions of the sacrificial fill material comprise sacrificial pillar structures (978, 578). Specifically, each remaining portion of the sacrificial material in a capacitor via cavity constitutes a first sacrificial pillar structure, or a sacrificial capacitor via cavity fill structure. Each remaining portion of the sacrificial material in a contact via cavity constitutes a second sacrificial pillar structure, or a sacrificial contact via cavity fill structure. The various sacrificial pillar structures (978, 578) are concurrently formed, i.e., during a same set of processes including the deposition process that deposits the sacrificial fill material and the planarization process that removes the deposition process from above the first contact level dielectric layer 280. The top surfaces of the sacrificial pillar structures (978, 578) can be coplanar with the top surface of the first contact level dielectric layer 280. Each of the sacrificial pillar structures (978, 578) may, or may not, include cavities therein.

Figure 28:
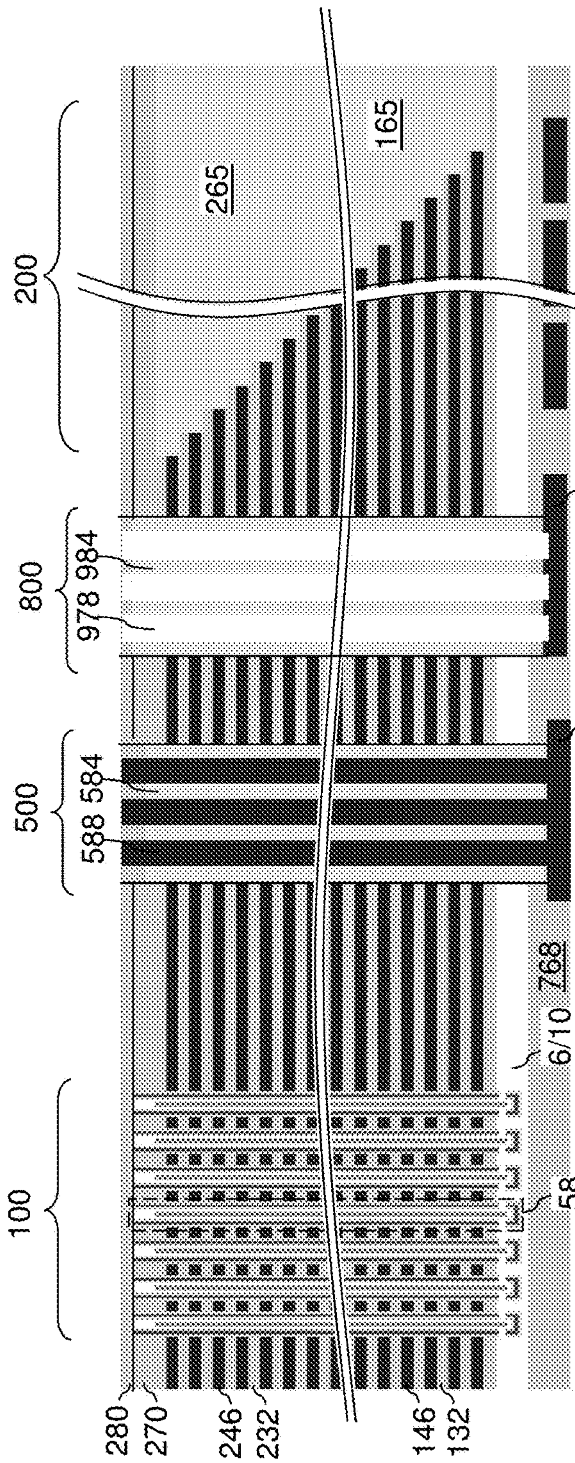
FIG. 28 is a vertical cross-sectional view of the second exemplary structure after replacement of the sacrificial pillar structures in an interconnection region dielectric fill material portion with through-memory-level contact via structures according to an embodiment of the present disclosure.

Referring to FIG. 28, a sequence of processing steps from the processing steps FIGS. 13A-13D to the processing steps of FIGS. 20A-20C can be performed. Optionally, a sacrificial dielectric protection layer may be formed above the first contact level dielectric layer 280 can be formed to protect the sacrificial pillar structures (978, 578) during the processing steps of FIG. 15B and to prevent growth of a semiconductor material from the sacrificial pillar structures (978, 578) during the processing steps of FIG. 15D. The sacrificial dielectric protection layer can include a dielectric material such as silicon oxide, and can have thickness in a range from 10 nm to 50 nm, although lesser and greater thicknesses can also be used. The sacrificial dielectric protection layer may be subsequently removed.

In the second exemplary structure, the second backside trenches 179 can be omitted and only the first backside trenches 79 can be formed at the processing steps of FIGS. 13A-13D. Thus, the conductive wall structures 178 are not formed in the second exemplary structure. The sacrificial material layers (142, 242) are replaced with electrically conductive layers (146, 246) as in the first embodiment, and dielectric wall structures 76 can be formed in the first backside trenches 79 as in the first embodiment. The interconnection regions 500 and the capacitor regions 800 are not subjected to structural changes through the sequence of processing steps from the processing steps FIGS. 13A-13D to the processing steps of FIGS. 20A-20C.

Subsequently, a first masking material layer (not shown) can be applied over the first contact level dielectric layer 280, and can be patterned to form an opening over each interconnection region dielectric fill material portion 584, while covering each capacitor region dielectric fill material portion 984, each memory array region 100, and each staircase region 200. The first masking material layer may be a patterned photoresist layer, or may be a patterned hard mask layer. An etchant that etches the sacrificial material can be applied using an etch process, which can be an isotropic etch process or an anisotropic etch process. The second sacrificial pillar structures 578, i.e., the sacrificial contact via cavity fill structures, can be removed selective to the first contact level dielectric material layer 280 and the interconnection region dielectric fill material portions 584. Once the second sacrificial pillar structures 578 are removed, the volumes of the contact via cavities become vacant. The first masking material layer may, or may not, be subsequently removed. For example, if the first masking material layer includes a photoresist material, the photoresist material can be removed by ashing or dissolving in a solvent.

At least one conductive material can be deposited in the contact via cavities. The at least one conductive material can include, for example, a metallic liner (such as TiN, TaN, or WN) and a metallic fill material (such as W, Co, Mo, Ru, Cu, or an alloy thereof). Excess portions of the at least one conductive material can be removed from above the horizontal plane including the top surface of the first contact level dielectric layer 280 by a planarization process, which can use a recess etch and/or chemical mechanical planarization. Each remaining portion of the at least one conductive material constitutes a contact via structure, which is herein referred to as a through-memory-level contact via structure 588. Each through-memory-level contact via structure 588 vertically extends through the memory-level assembly, which includes all elements between a bottommost surface of the optional conductive plate layer 6 and in-process source-level material layers 10' and a topmost surface of the alternating stacks {(132, 146), (232, 246)}. Thus, each through-memory-level contact via structure 588 vertically extends at least from the topmost surface of the alternating stacks {(132, 146), (232, 246)} to the bottommost surface of the optional conductive plate layer 6 and in-process source-level material layers 10'. The second sacrificial pillar structures 578, i.e., the sacrificial contact via cavity fill structures, located in interconnection region dielectric fill material portions 984 are replaced with the through-memory-level contact via structures 588. Each of the through-memory-level contact via structures 588 can be formed directly on a respective metal line structure, which can be top surfaces of a lower-level metal interconnect structure 780 such as a landing-pad-level metal line structure 788.

Figure 29:
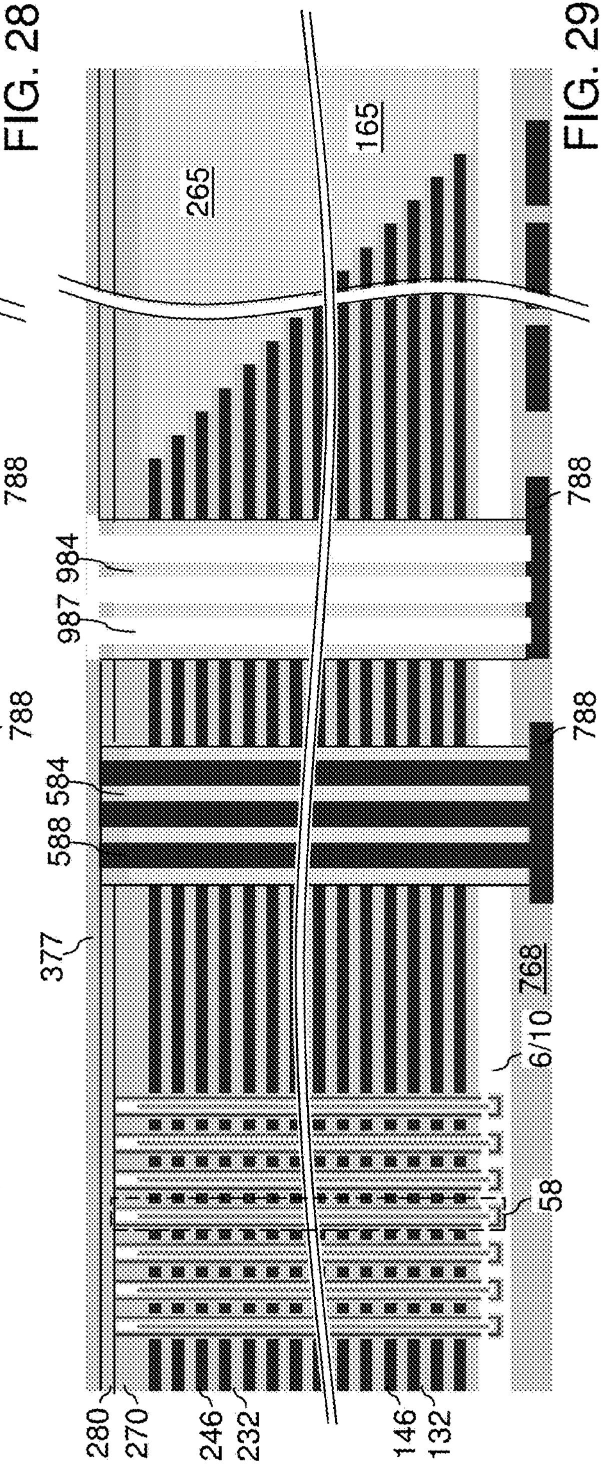
FIG. 29 is a vertical cross-sectional view of the second exemplary structure after removing sacrificial material portions from capacitor via cavities in the capacitor region according to an embodiment of the present disclosure.

Referring to FIG. 29, a second masking material layer 377 can be applied over the first contact level dielectric layer 280, and can be patterned to form an opening over each capacitor region dielectric fill material portion 984, while covering each interconnect region dielectric fill material portion 584, each memory array region 100, and each staircase region 200. The second masking material layer may be a patterned photoresist layer, or may be a patterned hard mask layer. FIG. 29 illustrates an embodiment in which the second masking material layer is a patterned hard mask layer including a dielectric material such as silicon oxide. Embodiments in which the second masking material layer is a photoresist layer are expressly contemplated herein. An etchant that etches the sacrificial material can be applied using an etch process, which can be an isotropic etch process or an anisotropic etch process. The first sacrificial pillar structures 978, i.e., the sacrificial capacitor via cavity fill structures, can be removed selective to the first contact level dielectric material layer 280 and the capacitor region dielectric fill material portions 984. Once the first sacrificial pillar structures 978 are removed, and the volumes of the capacitor via cavities 987 become vacant. The second masking material layer may, or may not, be subsequently removed. For example, if the second masking material layer includes a photoresist material, the photoresist material can be removed by ashing or dissolving in a solvent.

Figure 30:
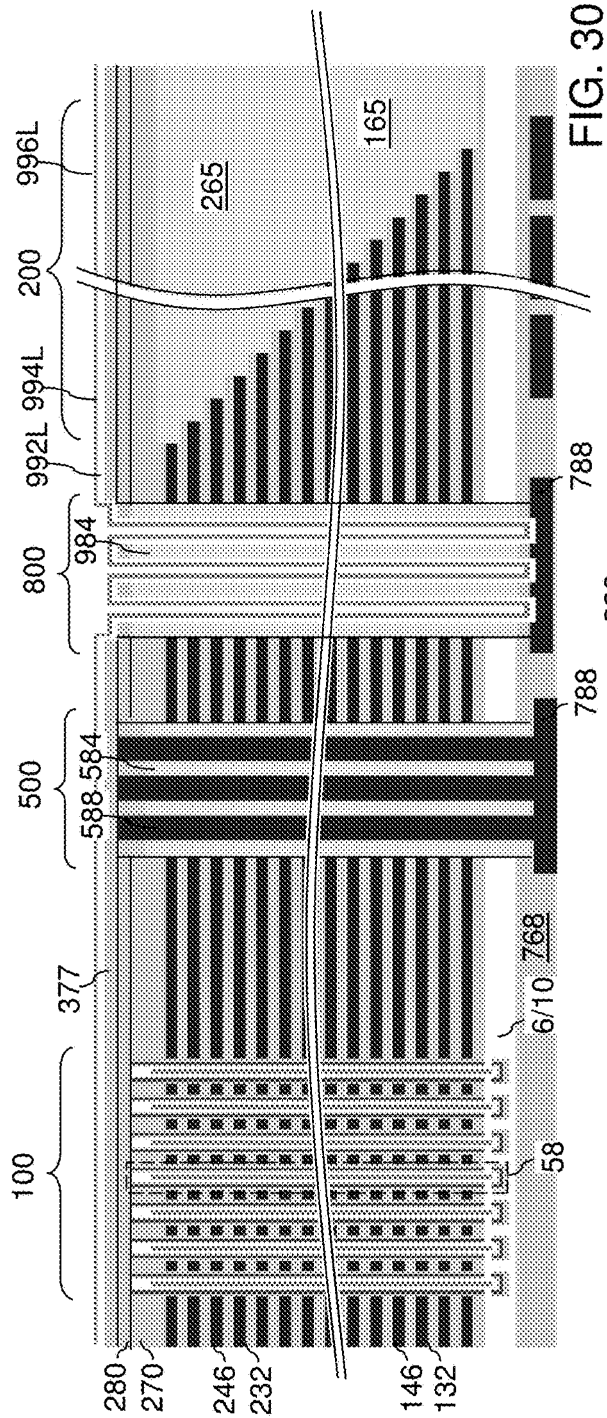
FIG. 30 is a vertical cross-sectional view of the second exemplary structure after formation of capacitor material layers according to an embodiment of the present disclosure.

Referring to FIG. 30, capacitor material layers (992L, 994L, 996L) can be sequentially formed in the capacitor via cavities 987 and over the first contact level dielectric layer 280 by performing a series of conformal deposition processes. The capacitor material layers (992L, 994L, 996L) include a first electrode layer 992L that is deposited directly on sidewalls of a plurality of capacitor via cavities 987 and directly on the physically exposed top surfaces of the lower-level metal interconnect structure 780, which may include metal line structures such as the landing-pad-level metal line structures 788. In one embodiment, the first electrode layer 992L can include a metallic nitride layer such as a TiN layer, a TaN layer, or a WN layer. The thickness of the first electrode layer 992L can be in a range from 3 nm to 60 nm, such as from 6 nm to 30 nm, although lesser and greater thicknesses can also be used. The capacitor material layers (992L, 994L, 996L) includes a node dielectric layer 994L, which includes an isolation dielectric material for a capacitor (i.e., a node dielectric material), and is formed directly on the first electrode layer 992L. In one embodiment, the node dielectric layer 994L can include a silicon nitride layer having a thickness in a range from 3 nm to 20 nm, such as from 4 nm to 8 nm, although lesser and greater thicknesses can also be used. The capacitor material layers (992L, 994L, 996L) include a second electrode layer 996L that is formed directly on the node dielectric layer 994L. In one embodiment, the second electrode layer 996L can include a metallic nitride layer such as a TiN layer, a TaN layer, or a WN layer. The thickness of the second electrode layer 996L can be in a range from 3 nm to 60 nm, such as from 6 nm to 30 nm, although lesser and greater thicknesses can also be used.

Figure 31A:
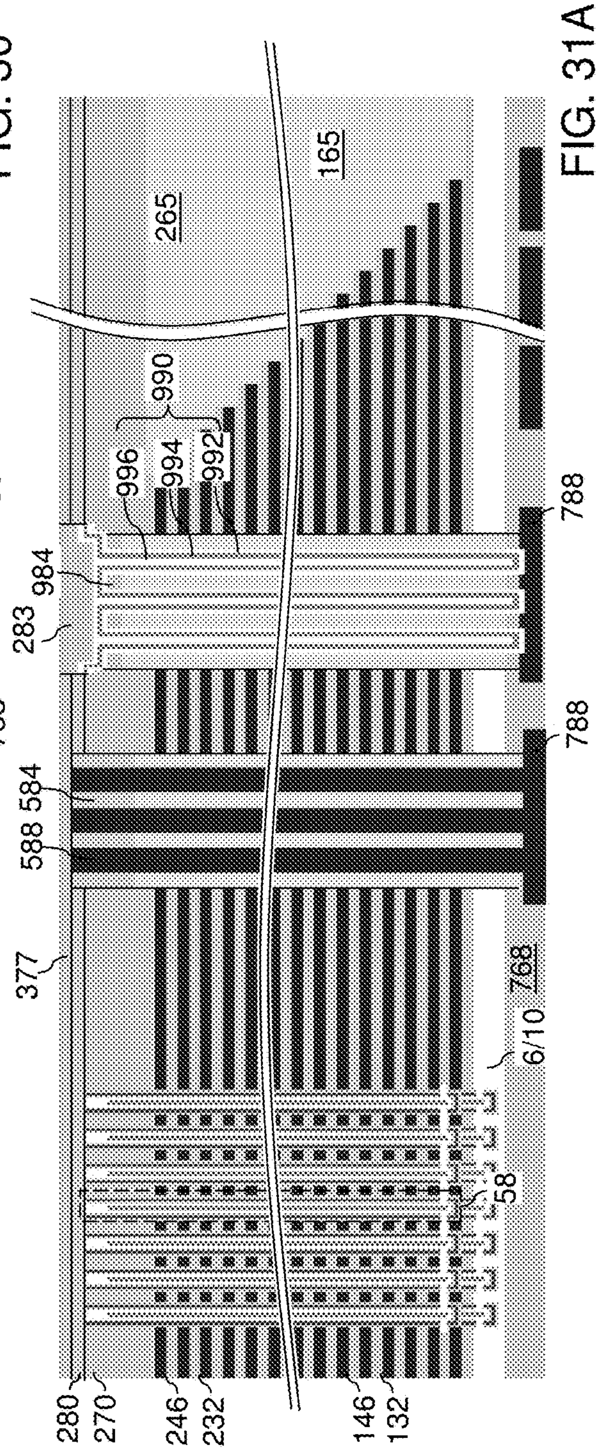
FIG. 31A is a vertical cross-sectional view of the second exemplary structure after patterning of the capacitor material layers according to an embodiment of the present disclosure.

Referring to FIG. 31A, portions of the capacitor material layers (992L, 994L, 996L) located outside the areas of the capacitor regions 800 can be removed while preventing removal of the capacitor material layers (992L, 994L, 996L) located inside the areas of the capacitor regions 800. In one embodiment, the top surface of each portion of the second electrode layer 996L located inside the capacitor regions 800 can be located below a horizontal plane including a bottom surface of the first electrode layer 992L located outside the capacitor regions 800. In this case, a chemical mechanical planarization process can be performed to remove portions of the capacitor material layers (992L, 994L, 996L) located outside the areas of the capacitor regions 800. Alternatively, a patterned mask layer (not shown) such as a patterned photoresist layer may be formed over the capacitor region 800 and protect underlying portions of the capacitor material layers (992L, 994L, 996L) located inside the areas of the capacitor regions 800. An etch process can be performed to remove portions of the capacitor material layers (992L, 994L, 996L) that are located outside the areas of the capacitor regions 800 and are not protected by the patterned mask layer. The patterned mask layer can be subsequently removed, for example, by ashing. Each set of remaining material portions of the capacitor material layers (992L, 994L, 996L) located inside the areas of the capacitor regions 800 constitutes a capacitor, which includes a first electrode layer 992 that is a patterned remaining portion of the first electrode layer 992L, a node dielectric 994 that is a patterned remaining portion of the node dielectric layer 994L, and a second electrode layer 996 that is a patterned remaining portion of the second electrode layer 996L. A capacitor cap dielectric material portion 283 can be optionally formed above each capacitor (992, 994, 996) by depositing and planarizing a dielectric material such as silicon oxide.

Subsequently, the processing steps of FIGS. 21A and 21B, 22, 23, and 24 can be sequentially performed to form various contact structures, upper level metal interconnect structures, and upper level dielectric material layers including electrical connections to each of the capacitors (992, 994, 996).

Figure 31B:
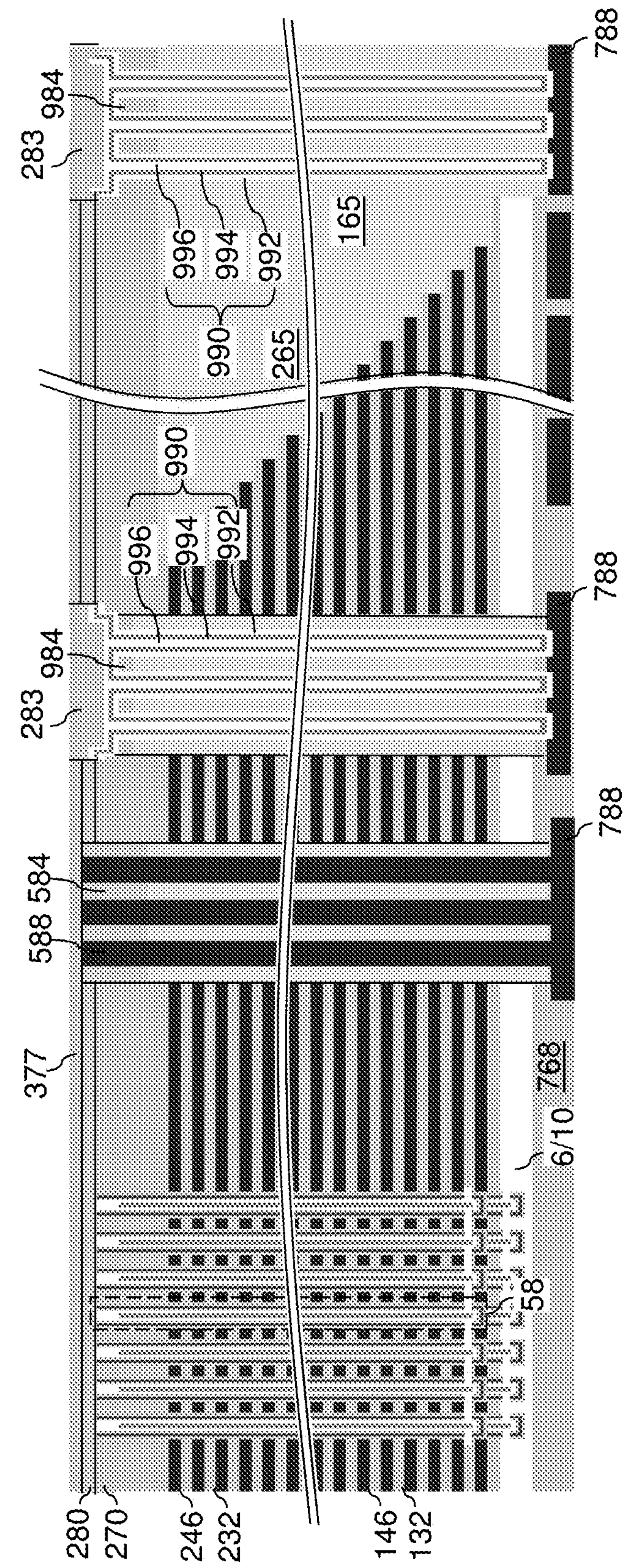
FIG. 31B is a vertical cross-sectional view of an alternative configuration of the second exemplary structure after patterning of the capacitor material layers according to an embodiment of the present disclosure.

Referring to FIG. 31B, an alternative configuration of the second exemplary structure can be derived from the second exemplary structure by forming at least another capacitor (992, 994, 996) in the staircase region 200 in addition to, or in lieu of, the capacitor (992, 994, 996) formed in the memory array region 100. Anisotropic etch processes employed to form openings or cavities in the staircase region 200 may be modified mutatis mutandis to account for changes in the material composition in the staircase region 200 with respect to the material composition in the memory array region 100.

Figure 32:
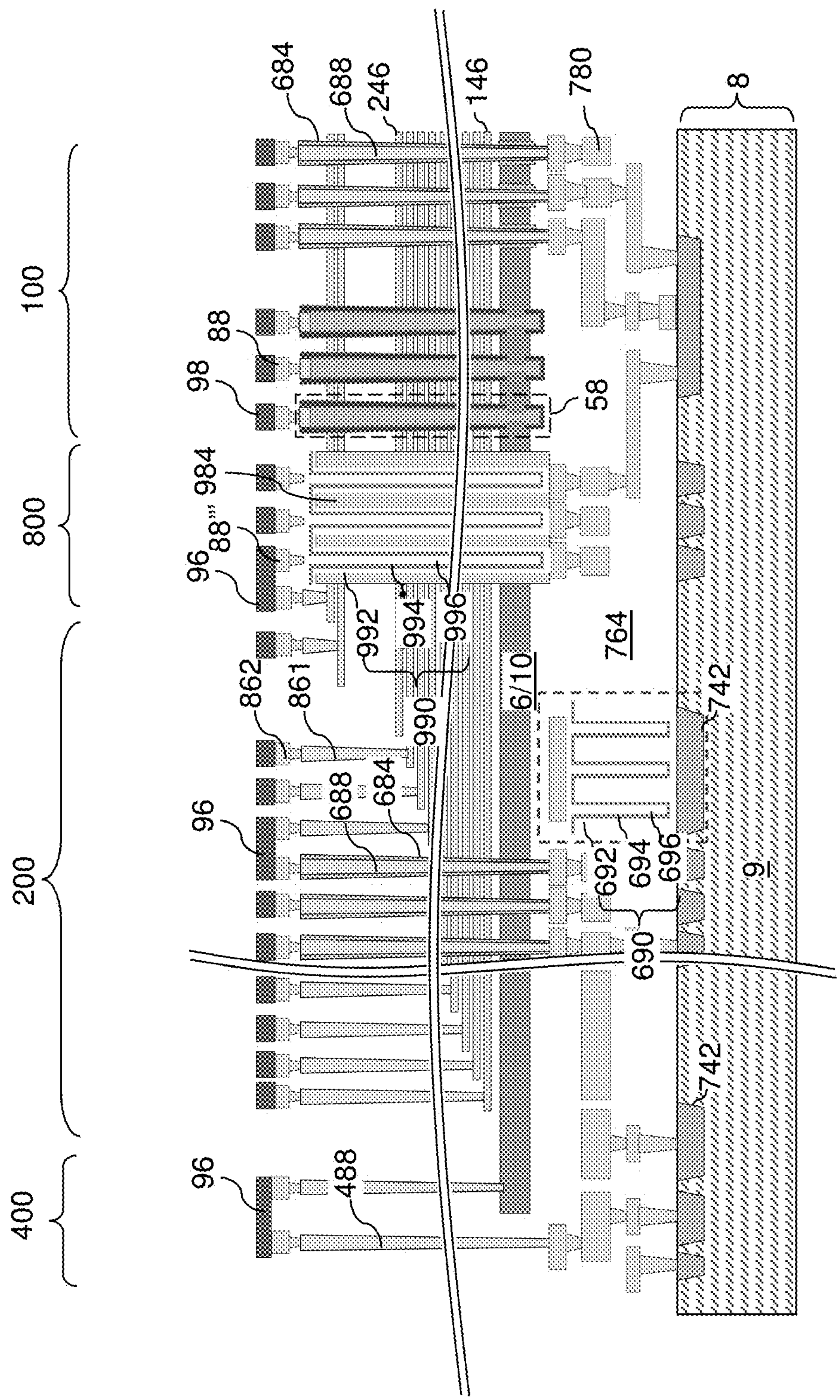
FIG. 32 is a vertical cross-sectional view of another alternative configuration of the second exemplary structure after formation of contact via structures, upper level dielectric material layers and upper level metal interconnect structures according to an embodiment of the present disclosure.

Referring to FIG. 32, another alternative configuration of the second exemplary structure is illustrated. In the alternative configuration, an additional capacitor 690 may be optionally formed between the substrate 8 and the source-level material layers 10. The additional capacitor 690 can be formed by forming an array of capacitor via cavities through multiple dielectric material layers among the first dielectric material layers 764 such that a top surface of an active region 742 or a lower-level metal interconnect structure 780 is physically exposed at the bottom of each capacitor via cavity, and by depositing and patterning a first electrode layer, a node dielectric layer, and a second electrode layer. The first electrode layer can have the same composition and thickness as the first electrode layer 992L described above. The node dielectric layer can have the same composition and thickness as the node dielectric layer 994L described above. The second electrode layer can have the same composition and thickness as the second electrode layer 996L described above. Each patterned discrete portion of the first electrode layer constitutes a first electrode layer 692, each patterned discrete portion of the node dielectric layer constitutes a node dielectric 694, and each patterned discrete portion of the second electrode layer constitutes a second electrode layer 696. Each set of a first electrode layer 692, a node dielectric 694, and a second electrode layer 696 constitutes a capacitor (692, 694, 696). Another lower-level metal interconnect structure 780 can be formed on a top surface of the second electrode layer 696 to provide electrical connection to the second electrode layer 696.

Optionally, through-memory-level via structures 688 can be formed through the memory level assembly in a memory array region 100 or in a staircase region 200. A through-memory-level insulating spacer 684 can be provided around each through-memory-level via structure 688 to provide electrical isolation for the through-memory-level via structures 688. The through-memory-level via structures 688 can be formed by forming discrete interconnection via cavities through the alternating stacks {(132, 142), (232, 242)} extending to a top surface of a respective one of the lower-level metal interconnect structure 780, forming additional sacrificial pillar structures that fill the discrete interconnection via cavities, and subsequently replacing the additional sacrificial pillar structures with the through-memory-level via structures 688 containing a conductive material. The additional sacrificial pillar structures may be formed concurrently with formation of the first and second sacrificial pillar structures (978, 578). An insulating via liner can be formed within each discrete interconnection via cavity prior to formation of the additional sacrificial pillar structures, or after removal of the additional sacrificial pillar structures and prior to deposition of the conductive material that forms the through-memory-level via structures 688.

Contact via structures such as drain contact via structures 88 and staircase-region contact via structures 86 of the first embodiment can be formed. Optionally, each staircase-region contact via structure 86 may be replaced with a vertical stack of a first staircase-region contact via structure 861 and a second staircase-region contact via structure 862. Line level metal interconnect structures (96, 98) can be formed, which can include bit lines 98 contacting, or electrically connected to, a respective one of the drain contact via structures 88, and upper interconnection line structures 96 contacting, and/or electrically connected to, at least one of the staircase-region contact via structures (861, 862), the peripheral-region contact via structures 488, the through-memory-level via structures 688, and the vertical interconnection via structures 588 (See FIG. 23).

A capacitor 990 can include a first electrode layer 992, a node dielectric 994, and a second electrode layer 996. A bottom surface of the first electrode layer 992 can contact a top surface of a lower-level metal interconnect structure 780 that can be electrically connected to a node of an underlying semiconductor device on the semiconductor material layer 9. An upper level metal interconnect structure can be formed on the second electrode layer 996. For example, a contact via structure" can contact a top surface of the second electrode layer 996 to provide electrical connection to the second electrode layer 996.

FIG. 33A-33J are sequential vertical cross-sectional views of a volume of a pillar cavity during formation of a capacitor in the second exemplary structure according to an embodiment of the present disclosure.

Figures 33A, 33B, 33C, 33D, 33E:
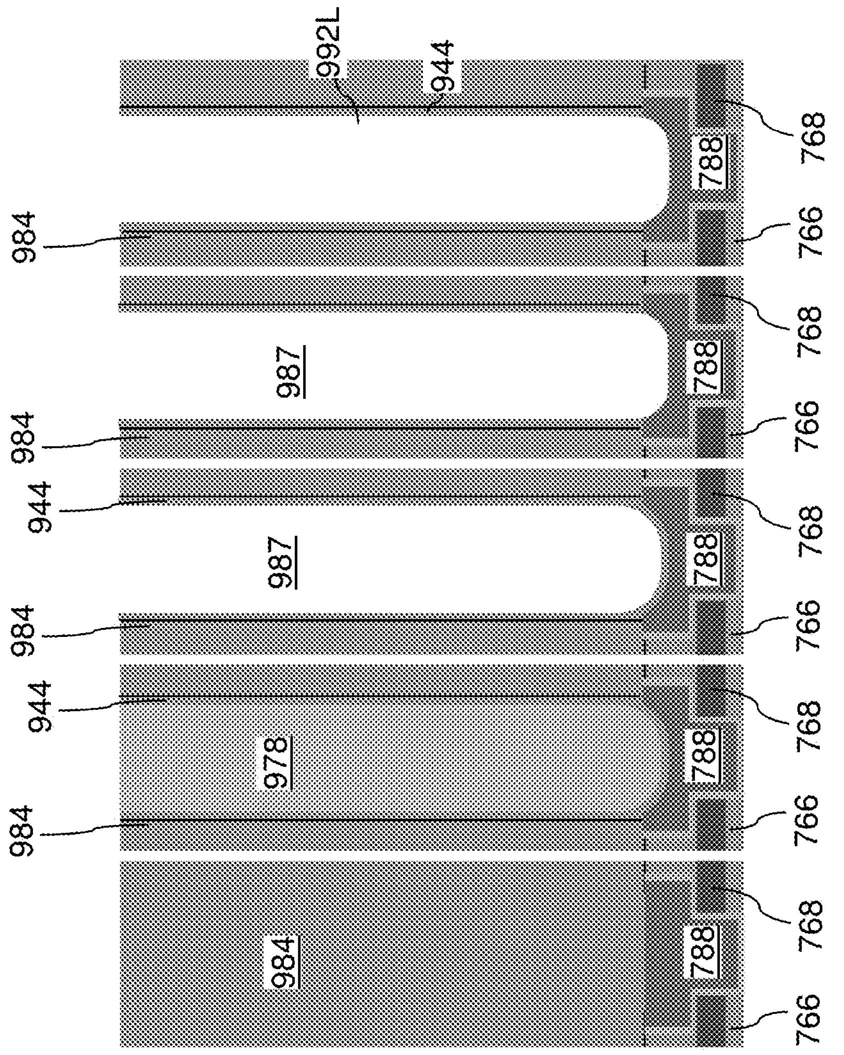
FIG. 33A-33J are sequential vertical cross-sectional views of a volume of a capacitor via cavity during formation of a capacitor in the second exemplary structure according to an embodiment of the present disclosure.

Referring to FIG. 33A, a region of a capacitor region dielectric fill material portion 984 and an underlying region including a landing-pad-level metal line structure 788 is illustrated at the processing step of FIGS. 26A and 26B.

Referring to FIG. 33B, the processing steps of FIG. 27 can be performed to form a capacitor via cavity through the capacitor region dielectric fill material portion 984. The capacitor via cavity has a straight sidewall and extends to a top surface of the landing-pad-level metal line structure 788. A dielectric liner 944 can be formed on the sidewall(s) and a bottom surface of the capacitor via cavity by a conformal deposition process. The dielectric liner 944 can include, for example, silicon oxide, and can have a thickness in a range from 2 nm to 20 nm, although lesser and greater thicknesses can also be used. A first sacrificial pillar structure 978 is formed in a remaining volume of the capacitor via cavity by depositing and planarizing a sacrificial material.

Referring to FIG. 33C, the processing steps of FIG. 29 can be performed to remove the first sacrificial pillar structures 978. A predominant volume of a capacitor via cavity 987 becomes an empty volume.

Referring to FIG. 33D, an anisotropic etch process to remove horizontal portions of the dielectric line 74 from the bottom of the capacitor via cavity 987. A top surface of the landing-pad-level metal line structure 788 can be physically exposed at the bottom of the capacitor via cavity 987.

Referring to FIG. 33E, the first gate electrode layer 992L can be deposited directly on the top surface of the landing-pad-level metal line structure 788 and directly on inner sidewalls of the dielectric liner 944.

Figures 33F, 33G, 33H, 33I, 33J:
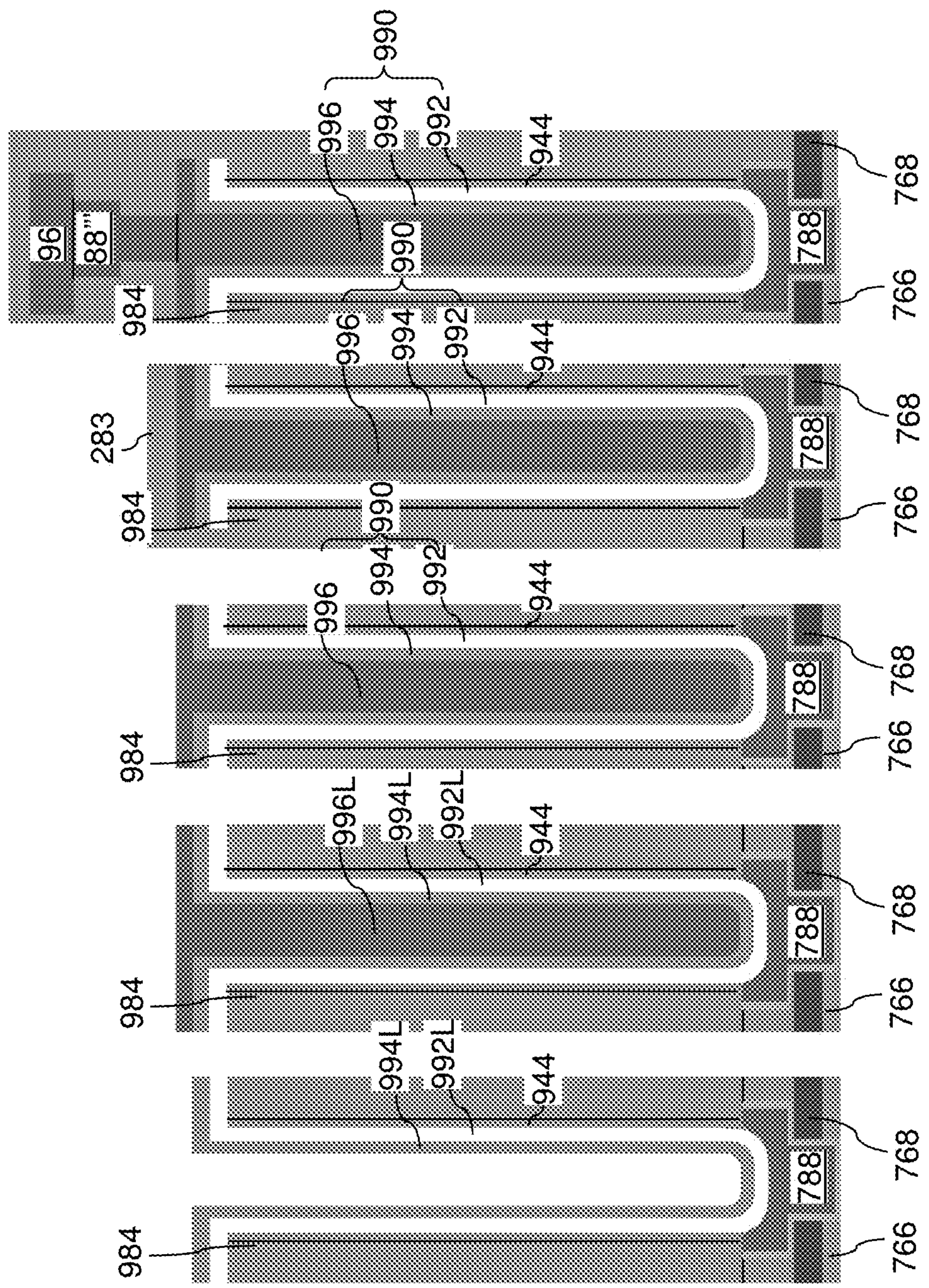

Referring to FIG. 33F, a node dielectric layer 994L can be deposited on the first electrode layer 992L.

Referring to FIG. 33G, a second electrode layer 996L can be deposited on the node dielectric layer 994L.

Referring to FIG. 33H, the second electrode layer 996L, the node dielectric layer 994L, and the first electrode layer 992L can be patterned into a second electrode layer 996, a node dielectric 994, and a first electrode layer 992, respectively. A set of the first electrode layer 992, the node dielectric 994, and the second electrode layer 996 constitutes a capacitor 990.

Referring to FIG. 33I, a capacitor cap dielectric material portion 283 can be formed over the capacitor 990.

Referring to FIG. 33J, upper level dielectric material layers and upper level metal interconnect structures can be formed over the capacitor 990. The upper level metal interconnect structures can include capacitor contact via structures 88''' and upper interconnection line structures 96.

Figure 34A:
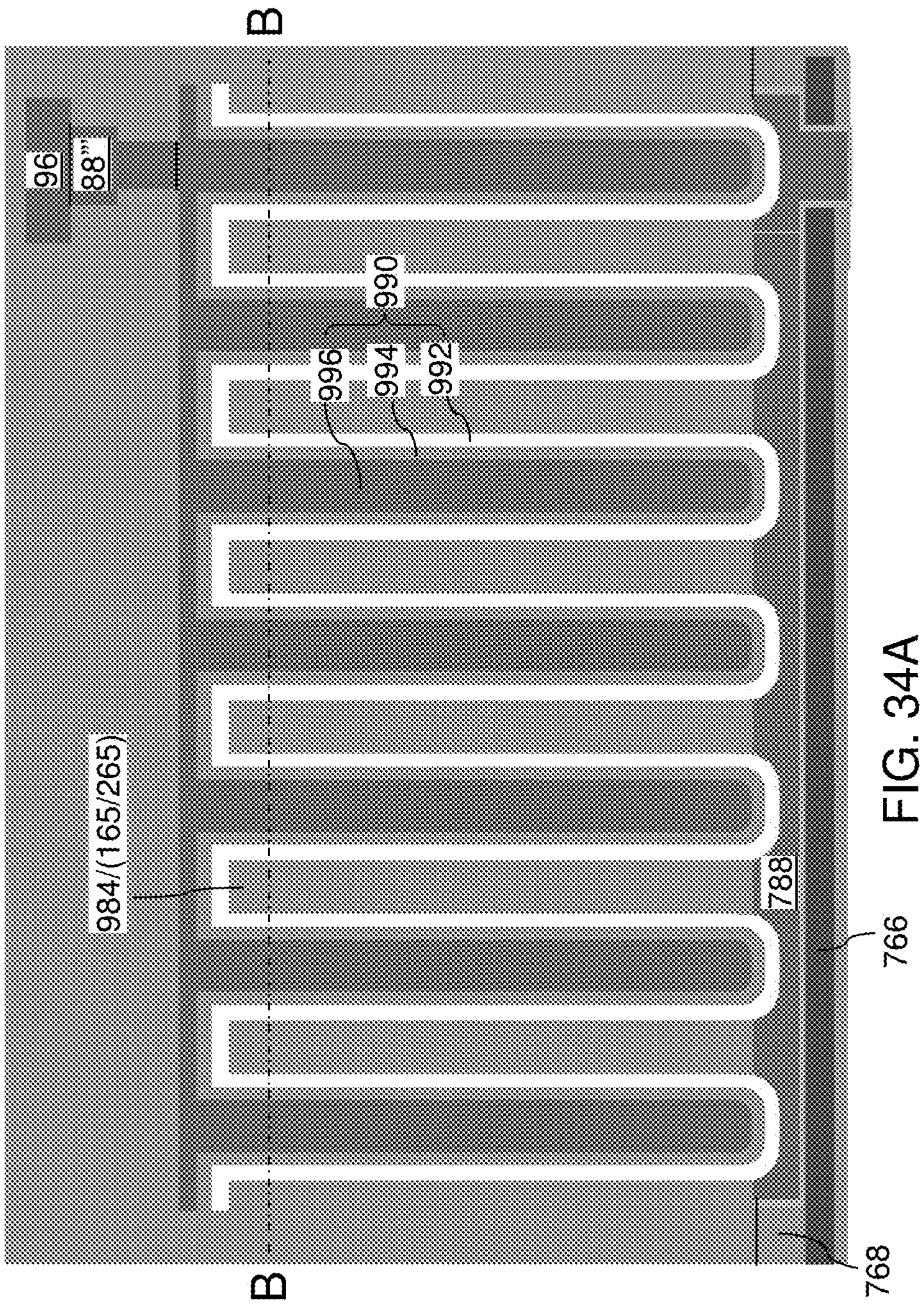
FIG. 34A is a vertical cross-sectional view of a configuration of the second exemplary structure of the present disclosure according to an embodiment of the present disclosure.
Figure 34B:
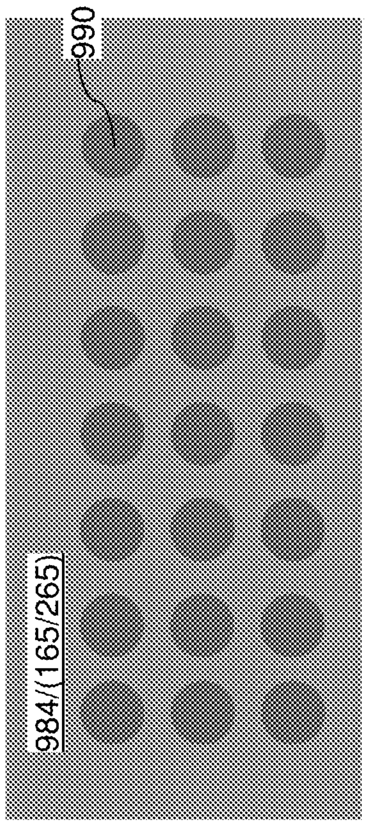
FIG. 34B is a horizontal cross-sectional view of the second exemplary structure along the horizontal plane B-B' of FIG. 34A.

Referring to FIGS. 34A and 34B, a configuration of the second exemplary structure according to an embodiment of the present disclosure is illustrated, which includes a capacitor 990 including a set of a first electrode layer 992, a node dielectric 994, and a second electrode layer 996. Generally, the capacitor 990 according to various embodiments of the present disclosure may be formed in a capacitor region dielectric fill material portion 984 and/or in retro-stepped dielectric material portions (165, 265) as illustrated in FIG. 31B. The first electrode layer 992 can be formed directly on a landing-pad-level metal line structure 488.

Figure 35:
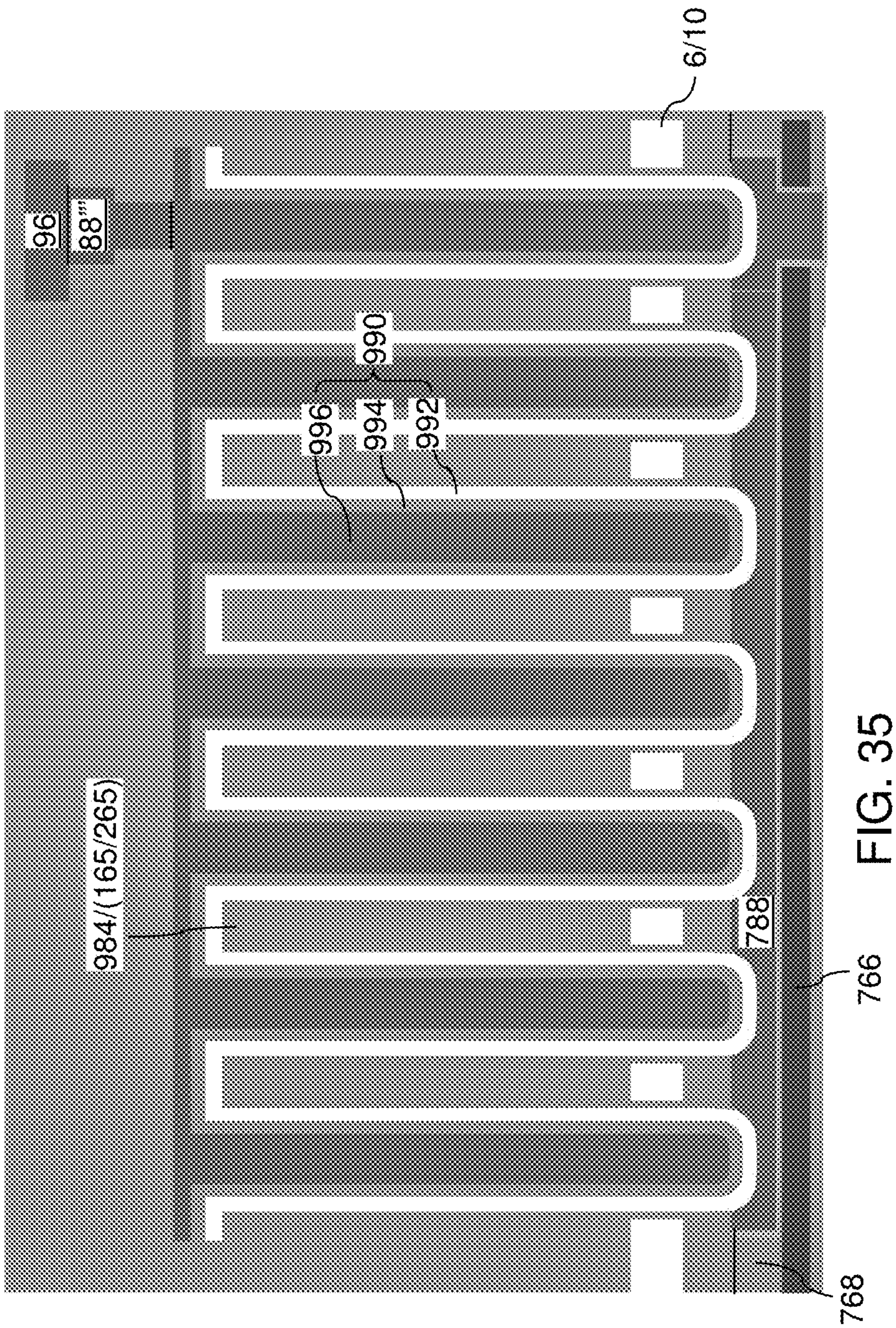
FIG. 35 is a vertical cross-sectional view of an alternative configuration of the second exemplary structure of the present disclosure.

Referring to FIG. 35, an alternative configuration of the second exemplary structure according to an embodiment of the present disclosure is illustrated. The alternative configuration of the second exemplary structure can be derived from the second exemplary structure of FIGS. 34A and 34B by forming the capacitor 990 without removing an underlying portion of the source-level material layers 10. In this case, the source-level material layers 10 can include an array of openings through which capacitor pillar structures vertically extend. Each of the capacitor pillar structures can include a respective portion of the first electrode layer 992, a respective portion of the node dielectric 994, and a respective portion of the second electrode layer 996.

Referring to all drawings for the second exemplary structure, the second exemplary structure can include a semiconductor structure. The semiconductor structure can include an alternating stack of insulating layers (132, 232) and electrically conductive layers (146, 246) and overlying a substrate 8; a first dielectric fill material portion (984, 165, and/or 265) vertically extending through the alternating stack {(132, 246), (232, 246)} and including a plurality of capacitor via cavities therein, wherein each of the plurality of capacitor via cavities vertically extend through the alternating stack {(132, 246), (232, 246)}; a first electrode layer 992 continuously extending into the plurality of capacitor via cavities and contacting sidewalls of the plurality of capacitor via cavities; a node dielectric 994 continuously extending into the plurality of capacitor via cavities and overlying the first electrode layer 992; and a second electrode layer 996 continuously extending into the plurality of capacitor via cavities and overlying the node dielectric 994, wherein the first electrode layer 992, the node dielectric 994, and the second electrode layer 996 collectively constitute a capacitor 900.

In one embodiment, at least one dielectric material layer 760 can be located between the alternating stack {(132, 246), (232, 246)} and the substrate 8; and metal interconnect structures are positioned within the at least one dielectric material layer 760. Bottom surfaces of the first electrode layer 992 located at bottom regions of the capacitor via cavities contacts a top surface of one of the metal interconnect structures 780.

In one embodiment, a second dielectric fill material portion 584 vertically extends through the alternating stack {(132, 246), (232, 246)} and includes at least one contact via cavity therein; and at least one contact via structure 588 is located within the at least one contact via cavity and contacts a top surface of another one of the metal interconnect structures 780.

In one embodiment, the semiconductor structure can comprise: a semiconductor device 710 located within, or on a top surface of, the substrate 8; an electrically conductive path comprising a subset of the metal interconnect structures 780 and electrically connecting a node of the semiconductor device 710 and the first electrode layer 992; and at least one upper level metal interconnect structure that provides a conductive path to the second electrode layer 996. One 88" of the at least one upper level metal interconnect structure can contact a top surface of the second electrode layer 996.

In one embodiment, the semiconductor structure can comprise memory stack structures 55 vertically extending through the alternating stack {(132, 246), (232, 246)}, wherein each of the memory stack structures 55 comprises a respective memory film 50 and a respective vertical semiconductor channel 60.

Referring to all drawings, a method of forming a three-dimensional semiconductor device includes forming an alternating stack of insulating layers and spacer material layers over a substrate, wherein the spacer material layers are formed as, or are subsequently replaced with, electrically conductive layers, forming a first dielectric fill material portion through the alternating stack forming a plurality of capacitor via cavities through the first dielectric fill material portion, wherein each of the plurality of capacitor via cavities vertically extend through the alternating stack, forming a first electrode layer on sidewalls of the plurality of capacitor via cavities, forming a node dielectric layer over the first electrode layer, and forming a second electrode layer over the node dielectric layer, wherein portions of the first electrode layer, the node dielectric layer, and the second electrode layer collectively constitute a capacitor. The method may further include forming a dielectric material layer including metal line structures over the substrate, wherein: the alternating stack is formed over the dielectric material layer; a top surface of one of the metal line structures is physically exposed at bottom regions of the plurality of capacitor via cavities; and the first electrode layer is formed directly on the top surface of the one of the metal line structures. The method may further include forming a second dielectric fill material portion through the alternating stack simultaneously with formation of the first dielectric fill material portion, forming at least one contact via cavity through the second dielectric fill material portion simultaneously with formation of the plurality of capacitor via cavities, and forming at least one contact via structure contacting a top surface of another one of the metal line structures within the at least one contact via cavity. The method may further include forming a semiconductor device within, or on a top surface of, the substrate, forming at least one metal interconnect structure over the semiconductor device, wherein the at least one metal interconnect structure provides an electrically conductive path between a node of the semiconductor device and the one of the metal line structures, and forming an upper level metal interconnect structure on the second electrode layer. The method may further include forming memory openings through the alternating stack, and forming memory stack structures in the memory openings, wherein each of the memory stack structures comprises a respective memory film and a respective vertical semiconductor channel.

The various embodiments of the present disclosure provide a capacitor in which an array of capacitor via cavities can be used to increase the area between the first electrode layer {(114, 60) or 992} and the second electrode layer {(178, 145, 245) or 996}. The capacitor via cavities provide an increased total area for the node dielectric (50 or 994) by forming the node dielectric (50 or 994) over vertical surfaces of the first electrode layer {(114, 60) or 992}. A capacitor having a high capacitance can be provided in a small area by utilizing vertically extending surfaces provided by the capacitor via cavities. Efficiency can be improved by more than a factor of 10 due to the effective area provided by pillar shaped capacitors.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the claims may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A semiconductor structure comprising:

a first alternating stack of insulating strips and electrically conductive strips located over a substrate; and capacitor pillar structures vertically extending through the first alternating stack, wherein each of the capacitor pillar structures comprises a node dielectric and a semiconductor material portion that is laterally surrounded by the node dielectric, wherein:

the semiconductor material portions are electrically connected to provide a first electrode layer of a capacitor;

the electrically conductive strips are electrically connected to provide a second electrode layer of the capacitor; and the node dielectrics collectively constitute an insulating dielectric between the first electrode layer and the second electrode layer of the capacitor.

2. The semiconductor structure of claim 1, further comprising:

a second alternating stack of insulating layers and electrically conductive layers located over the substrate; and memory stack structures vertically extending through the second alternating stack, wherein:

the insulating layers have a same material composition as the insulating strips within the first alternating stack; and the electrically conductive layers have a same material composition as the electrically conductive strips within the first alternating stack.

3. The semiconductor structure of claim 2, wherein:

each insulating layer in the second alternating stack is located at a same vertical distance from the substrate as a corresponding one of the insulating strips within the first alternating stack; and each electrically conductive layer in the second alternating stack is located at a same vertical distance from the substrate as a corresponding one of the electrically conductive strips within the first alternating stack.

4. The semiconductor structure of claim 2, wherein:

each of the memory stack structures comprises a respective memory film and a respective vertical semiconductor channel;

each of the memory films includes a blocking dielectric layer, a charge storage layer, and a tunneling dielectric layer; and each of the node dielectrics includes a first dielectric layer having a same composition and a same thickness as the blocking dielectric layer, a second dielectric layer having a same composition and a same thickness as the charge storage layer, and a third dielectric layer having a same composition and a same thickness as the tunneling dielectric layer.

5. The semiconductor structure of claim 2, further comprising a source contact layer underlying the second alternating stack and overlying the substrate, comprising a doped semiconductor material, and contacting sidewalls of the semiconductor material portions and electrically connecting the semiconductor material portions.

6. A semiconductor structure comprising:

an alternating stack of insulating layers and electrically conductive layers and overlying a substrate;

a first dielectric fill material portion vertically extending through the alternating stack and including a plurality of capacitor via cavities therein, wherein each of the plurality of capacitor via cavities vertically extend through the alternating stack;

a first electrode layer continuously extending into the plurality of capacitor via cavities and contacting sidewalls of the plurality of capacitor via cavities;

a node dielectric continuously extending into the plurality of capacitor via cavities and overlying the first electrode layer; and a second electrode layer continuously extending into the plurality of capacitor via cavities and overlying the node dielectric, wherein the first electrode layer, the node dielectric, and the second electrode layer collectively constitute a capacitor.

7. The semiconductor structure of claim 6, further comprising:

at least one dielectric material layer located between the alternating stack and the substrate; and metal interconnect structures positioned within the at least one dielectric material layer, wherein bottom surfaces of the first electrode layer located at bottom regions of the capacitor via cavities contacts a top surface of one of the metal interconnect structures.

8. The semiconductor structure of claim 7, further comprising:

a second dielectric fill material portion vertically extending through the alternating stack and including at least one contact via cavity therein; and at least one contact via structure located within the at least one contact via cavity and contacting a top surface of another one of the metal interconnect structures.

9. The semiconductor structure of claim 7, further comprising:

a semiconductor device located within, or on a top surface of, the substrate;

an electrically conductive path comprising a subset of the metal interconnect structures and electrically connecting a node of the semiconductor device and the first electrode layer; and at least one upper level metal interconnect structure that provides a conductive path to the second electrode layer.

10. The semiconductor structure of claim 6, further comprising memory stack structures vertically extending through the alternating stack, wherein each of the memory stack structures comprises a respective memory film and a respective vertical semiconductor channel.

11. A method of forming a three-dimensional semiconductor device, comprising:

forming an alternating stack of insulating layers and sacrificial material layers over a substrate;

forming capacitor openings through a first region of the alternating stack;

forming capacitor pillar structures in the capacitor openings, wherein each of the capacitor pillar structures comprises a node dielectric and a semiconductor material portion that is laterally surrounded by the node dielectric;

forming a conductive structure that electrically connects the semiconductor material portions, the conductive structure and the semiconductor material portions constituting a first electrode layer of a capacitor; and replacing the sacrificial material layers with conductive material portions, the conductive material portions including electrically conductive layers that are electrically connected and laterally surround the node dielectrics to constitute a second electrode layer of the capacitor.

12. The method of claim 11, further comprising:

forming memory openings through the alternating stack simultaneously with formation of the capacitor openings; and forming memory stack structures in the memory openings simultaneously with formation of the capacitor pillar structures, wherein each of the memory stack structures comprises a respective memory film and a respective vertical semiconductor channel.

13. The method of claim 12, wherein:

the conductive material portions comprise electrically conductive layers that are electrically isolated and laterally surround the memory stack structures; and the memory stack structures and the electrically conductive layers comprise vertical NAND strings.

14. The method of claim 12, further comprising:

forming a continuous blocking dielectric layer on sidewalls of the capacitor openings and the memory openings;

forming a continuous charge storage layer on the continuous blocking dielectric layer;

forming a continuous tunneling dielectric layer on the continuous charge storage layer; and removing portions of the continuous tunneling dielectric layer, the continuous charge storage layer, and the continuous blocking dielectric layer, wherein remaining portions of the continuous tunneling dielectric layer, the continuous charge storage layer, and the continuous blocking dielectric layer in the capacitor openings constitute the node dielectrics and remaining portions of the continuous tunneling dielectric layer, the continuous charge storage layer, and the continuous blocking dielectric layer in the memory openings constitute the memory films.

15. The method of claim 12, further comprising:

forming a source-level sacrificial layer over the substrate, wherein the alternating stack is formed over the source-level sacrificial layer; and replacing portions of the source-level sacrificial layer with source-level conductive material portions, wherein the source-level conductive material portions comprise the conductive structure that electrically connects the semiconductor material portions and a source contact layer contacting bottom portions of the vertical semiconductor channels.

16. A method of forming a semiconductor structure, comprising:

forming an alternating stack of insulating layers and spacer material layers over a substrate, wherein the spacer material layers are formed as, or are subsequently replaced with, electrically conductive layers;

forming a first dielectric fill material portion through the alternating stack;

forming a plurality of capacitor via cavities through the first dielectric fill material portion, wherein each of the plurality of capacitor via cavities vertically extend through the alternating stack;

forming a first electrode layer on sidewalls of the plurality of capacitor via cavities;

forming a node dielectric layer over the first electrode layer; and forming a second electrode layer over the node dielectric layer, wherein portions of the first electrode layer, the node dielectric layer, and the second electrode layer collectively constitute a capacitor.

17. The method of claim 16, further comprising forming a dielectric material layer including metal line structures over the substrate, wherein:

the alternating stack is formed over the dielectric material layer;

a top surface of one of the metal line structures is physically exposed at bottom regions of the plurality of capacitor via cavities; and the first electrode layer is formed directly on the top surface of the one of the metal line structures.

18. The method of claim 17, further comprising:

forming a second dielectric fill material portion through the alternating stack simultaneously with formation of the first dielectric fill material portion;

forming at least one contact via cavity through the second dielectric fill material portion simultaneously with formation of the plurality of capacitor via cavities; and forming at least one contact via structure contacting a top surface of another one of the metal line structures within the at least one contact via cavity.

19. The method of claim 17, further comprising:

forming a semiconductor device within, or on a top surface of, the substrate;

forming at least one metal interconnect structure over the semiconductor device, wherein the at least one metal interconnect structure provides an electrically conductive path between a node of the semiconductor device and the one of the metal line structures; and forming an upper level metal interconnect structure on the second electrode layer.

20. The method of claim 16, further comprising:

forming memory openings through the alternating stack; and forming memory stack structures in the memory openings, wherein each of the memory stack structures comprises a respective memory film and a respective vertical semiconductor channel.

* * * * *